United States Patent
Yu et al.

(10) Patent No.: US 10,128,213 B2
(45) Date of Patent: Nov. 13, 2018

(54) INTEGRATED FAN-OUT STACKED PACKAGE WITH FAN-OUT REDISTRIBUTION LAYER (RDL)

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW); Hao-Yi Tsai, Hsinchu (TW); Tin-Hao Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/912,039

(22) Filed: Mar. 5, 2018

(65) Prior Publication Data
US 2018/0197837 A1 Jul. 12, 2018

Related U.S. Application Data

(60) Division of application No. 15/130,211, filed on Apr. 15, 2016, now Pat. No. 9,917,072, which is a
(Continued)

(51) Int. Cl.
*H01L 21/56* (2006.01)
*H01L 25/065* (2006.01)
(Continued)

(52) U.S. Cl.
CPC .... *H01L 25/0652* (2013.01); *H01L 21/31053* (2013.01); *H01L 21/56* (2013.01);
(Continued)

(58) Field of Classification Search
CPC . H01L 21/563; H01L 21/56; H01L 21/76898; H01L 23/49827;
(Continued)

(56) References Cited

U.S. PATENT DOCUMENTS

| 8,361,842 B2 | 1/2013 | Yu et al. |
| 8,604,568 B2 | 12/2013 | Stacey |

(Continued)

FOREIGN PATENT DOCUMENTS

| KR | 20090074508 A | 7/2009 |
| KR | 20130077033 A | 7/2013 |
| TW | 201230266 A | 7/2012 |

OTHER PUBLICATIONS

Bantog, Ely et al., "Wire Bond, Flip-Chip, and Chip-Scale-Package Solution to High Silicon Integration," IEEE Electronic Components and Technology Conference, 56th Proceedings, 2006, DOI: 10.1109/ECTC.2006.1645838; 6 pages.

*Primary Examiner* — Andrew Q Tran
(74) *Attorney, Agent, or Firm* — Slater Matsil, LLP

(57) ABSTRACT

A method includes forming a first through-via from a first conductive pad of a first device die, and forming a second through-via from a second conductive pad of a second device die. The first and second conductive pads are at top surfaces of the first and the second device dies, respectively. The first and the second conductive pads may be used as seed layers. The second device die is adhered to the top surface of the first device die. The method further includes encapsulating the first and the second device dies and the first and the second through-vias in an encapsulating material, with the first and the second device dies and the first and the second through-vias encapsulated in a same encapsulating process. The encapsulating material is planarized to reveal the first and the second through-vias. Redistribution
(Continued)

lines are formed to electrically couple to the first and the second through-vias.

20 Claims, 64 Drawing Sheets

Related U.S. Application Data continuation-in-part of application No. 15/004,240, filed on Jan. 22, 2016.

(60) Provisional application No. 62/221,443, filed on Sep. 21, 2015.

(51) Int. Cl.
| | |
|---|---|
| *H01L 21/768* | (2006.01) |
| *H01L 23/31* | (2006.01) |
| *H01L 23/367* | (2006.01) |
| *H01L 23/48* | (2006.01) |
| *H01L 23/528* | (2006.01) |
| *H01L 23/00* | (2006.01) |
| *H01L 25/00* | (2006.01) |
| *H01L 21/3105* | (2006.01) |

(52) U.S. Cl.
CPC .... *H01L 21/76885* (2013.01); *H01L 23/3107* (2013.01); *H01L 23/3675* (2013.01); *H01L 23/481* (2013.01); *H01L 23/528* (2013.01); *H01L 24/05* (2013.01); *H01L 24/13* (2013.01); *H01L 25/0657* (2013.01); *H01L 25/50* (2013.01); *H01L 2224/0231* (2013.01); *H01L 2224/02372* (2013.01); *H01L 2224/05124* (2013.01); *H01L 2224/05147* (2013.01); *H01L 2224/13144* (2013.01); *H01L 2224/13147* (2013.01); *H01L 2224/13155* (2013.01); *H01L 2224/13164* (2013.01); *H01L 2225/06548* (2013.01); *H01L 2225/06562* (2013.01); *H01L 2225/06589* (2013.01); *H01L 2924/1431* (2013.01); *H01L 2924/1432* (2013.01); *H01L 2924/1436* (2013.01); *H01L 2924/1437* (2013.01); *H01L 2924/1438* (2013.01); *H01L 2924/19011* (2013.01); *H01L 2924/19041* (2013.01); *H01L 2924/19102* (2013.01)

(58) Field of Classification Search
CPC ......... H01L 23/53223; H01L 23/53238; H01L 23/53266; H01L 23/5384; H01L 25/0652
See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,373,527 B2 | 6/2016 | Yu et al. | |
| 9,431,367 B2 | 8/2016 | Lin et al. | |
| 9,496,196 B2 | 11/2016 | Yu et al. | |
| 9,917,072 B2 * | 3/2018 | Yu ........................ | H01L 25/0652 |
| 2009/0166836 A1 | 7/2009 | Kim et al. | |
| 2011/0068427 A1 | 3/2011 | Paek et al. | |
| 2011/0291288 A1 | 12/2011 | Wu et al. | |
| 2012/0056316 A1 | 3/2012 | Pagaila et al. | |
| 2012/0139068 A1 | 6/2012 | Stacey | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2013/0343022 A1 | 12/2013 | Hu et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0200182 A1 | 7/2015 | Wang et al. | |
| 2015/0303174 A1 | 10/2015 | Yu et al. | |
| 2015/0318263 A1 | 11/2015 | Yu et al. | |

* cited by examiner

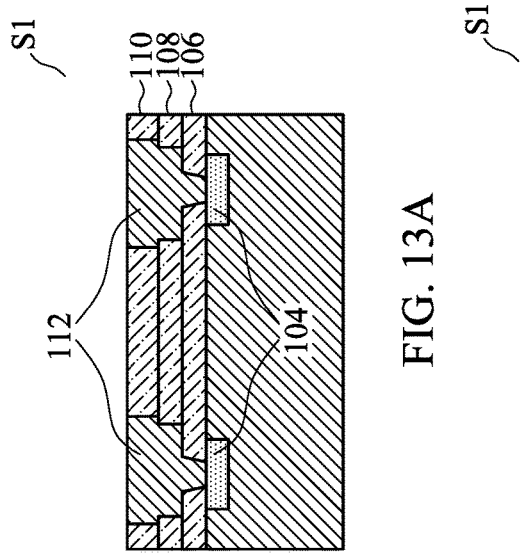
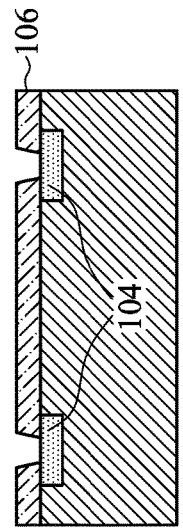
FIG. 13A
FIG. 13B

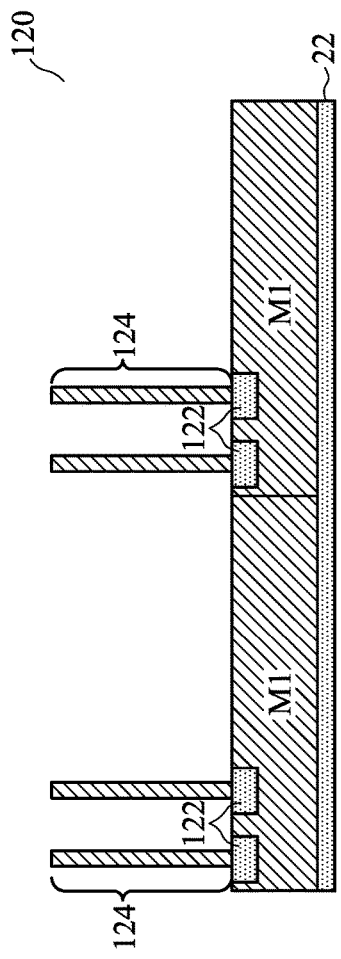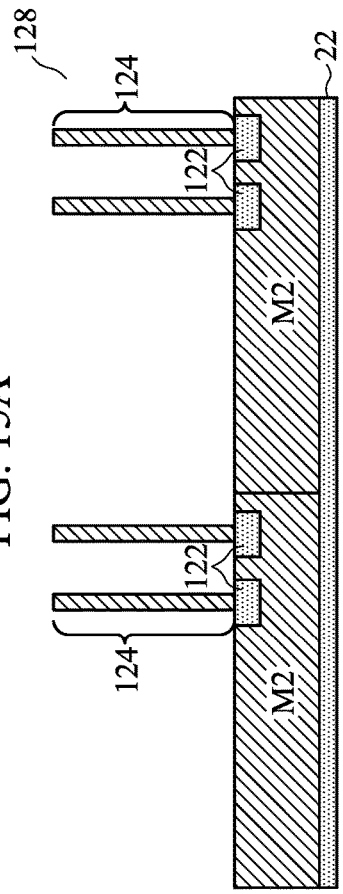
FIG. 15A
FIG. 15B

INTEGRATED FAN-OUT STACKED PACKAGE WITH FAN-OUT REDISTRIBUTION LAYER (RDL)

PRIORITY CLAIM AND CROSS-REFERENCE

This application is a divisional of U.S. patent application Ser. No. 15/130,211, filed Apr. 15, 2016, entitled "Integrated Fan-out Package and the Methods of Manufacturing," which is a continuation-in-part application of U.S. patent application Ser. No. 15/004,240, filed Jan. 22, 2016, entitled "Integrated Fan-out Package and the Methods of Manufacturing," which further claims the benefit of U.S. Provisional Application No. 62/221,443, filed Sep. 21, 2015, and entitled "Integrated fan-out Package and the methods of manufacturing," which applications are hereby incorporated herein by reference.

BACKGROUND

Stacked dies are commonly used in Three-Dimensional (3D) integrated circuits. Through the stacking of dies, the footprint (form factor) of packages is reduced. In addition, the metal line routing in the dies is significantly simplified through the formation of stacked dies.

In some applications, a plurality of dies is stacked to form a die stack, wherein the plurality of dies include Through-Substrate Vias (TSVs, sometimes known as through-silicon vias). The total count of the stacked dies may sometimes reach eight or more. When such a die stack is formed, a first die is first bonded onto a package substrate through flip-chip bonding, wherein solder regions/balls are reflowed to join the first die to the package substrate. A first underfill is dispensed into the gap between the first die and the package substrate. The first underfill is then cured. A test is then performed to ensure that the first die is connected to the package substrate properly, and that the first die and the package substrate function as desired.

Next, a second die is bonded onto the first die through flip-chip bonding, wherein solder regions/balls are reflowed to join the second die to the first die. A second underfill is dispensed into the gap between the second die and the first die. The second underfill is then cured. A test is then performed to ensure that the second die is connected to the first die and the package substrate correctly, and the first die, the second die, and the package substrate function as desired. Next, a third die is bonded onto the second die through the same process steps as for bonding the first die and the second die. The processes are repeated until all the dies are bonded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A through 13C illustrate some top structures used for connecting the respective device dies to overlying redistribution layers in accordance with some embodiments.

FIGS. 15A through 15K illustrate the cross-sectional views of intermediate stages in the formation of a fan-out package in accordance with some embodiments.

DETAILED DESCRIPTION

Figure 1A:
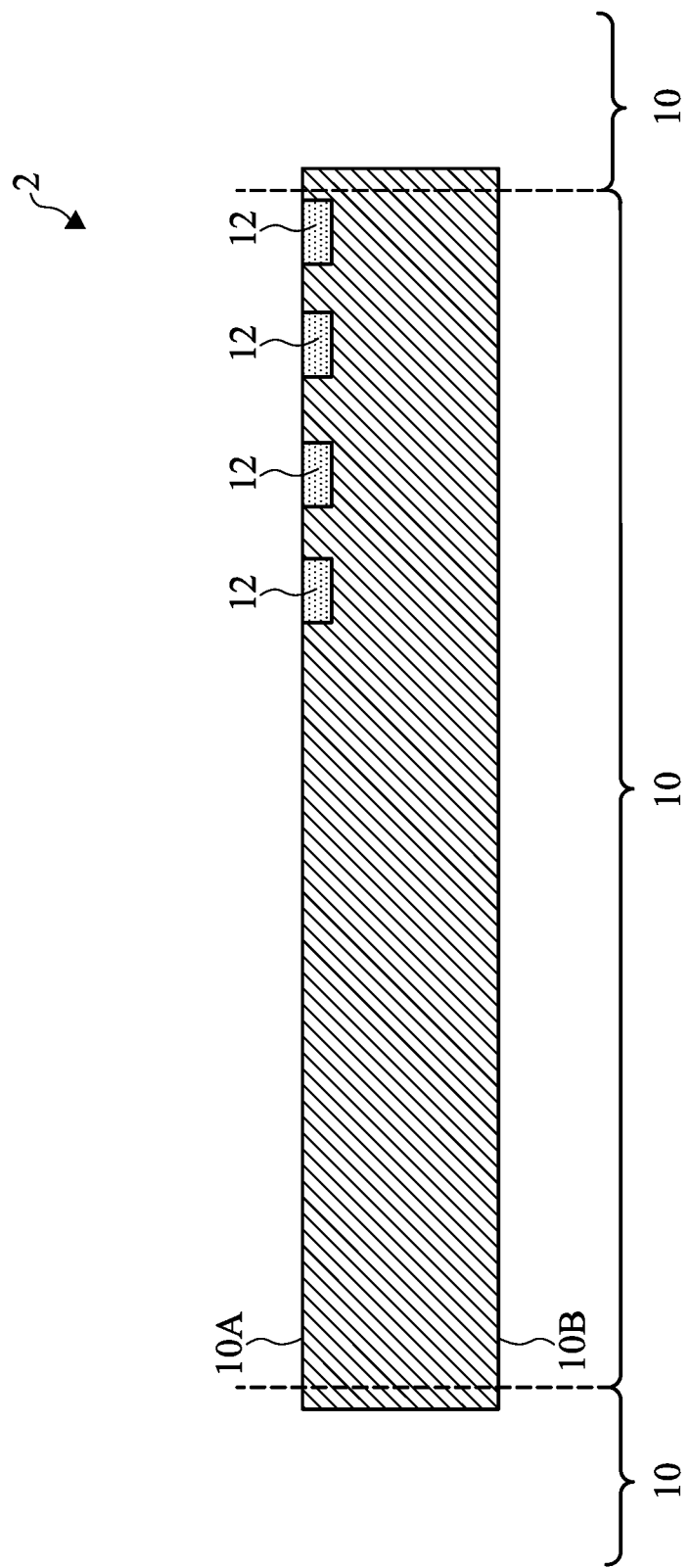
FIGS. 1A through 1I illustrate the cross-sectional views of intermediate stages in the formation of a fan-out package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated fan-out packages and the methods of forming the same are provided in accordance with various exemplary embodiments. The intermediate stages of forming the fan-out packages are illustrated. Some variations of some embodiments are discussed. Throughout the various views and illustrative embodiments, like reference numbers are used to designate like elements.

Figure 12:
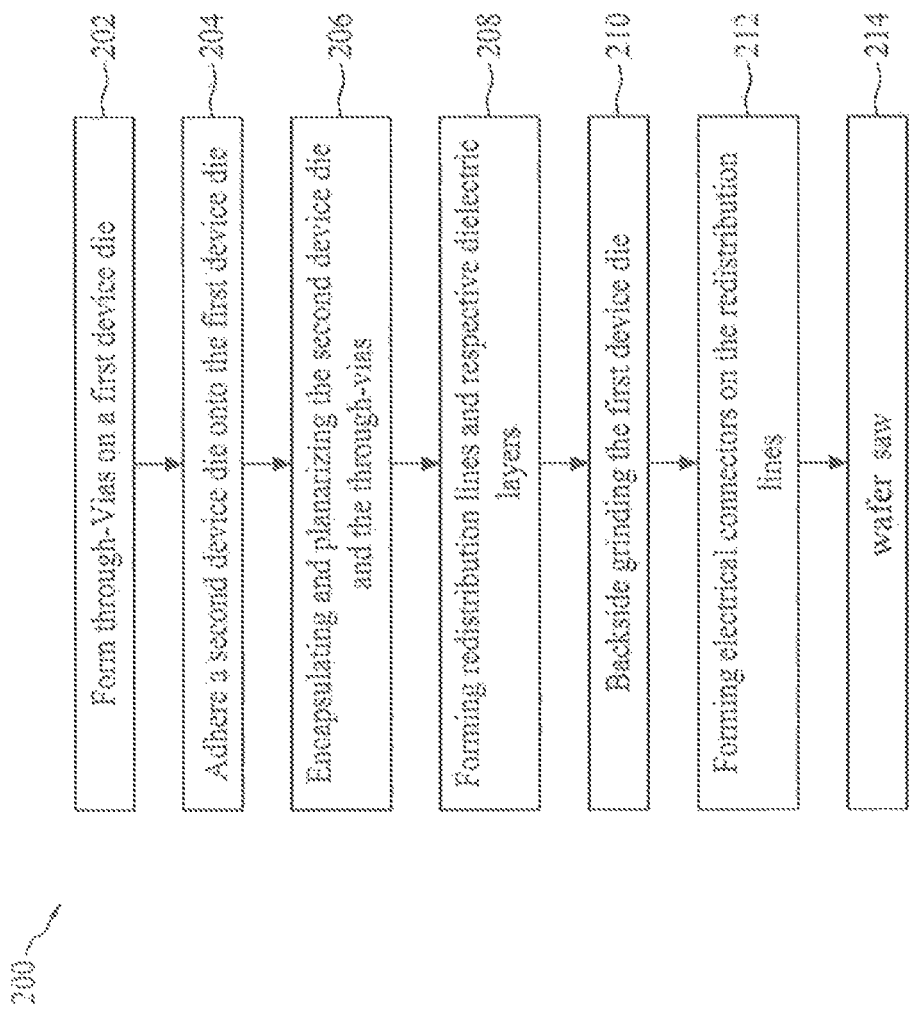
FIG. 12 illustrates a process flow for forming a fan-out package in accordance with some embodiments.

FIGS. 1A through 1I illustrate the cross-sectional views of intermediate stages in the formation of a fan-out package in accordance with some embodiments. The steps shown in FIGS. 1A through 1I are also illustrated schematically in the process flow 200 as shown in FIG. 12. In the subsequent discussion, the process steps shown in FIGS. 1A through 1I are discussed referring to the process steps in FIG. 12.

Referring to FIG. 1A, device die 10 (which is a part of the respective wafer 2 that has a plurality of device dies) is provided. In accordance with some embodiments of the present disclosure, device die 10 is a logic die, which may be a Central Processing Unit (CPU) die, a Micro Control Unit (MCU) die, an input-output (IO) die, a BaseBand (BB) die, or an Application processor (AP) die. Although not shown, device die 10 may include a semiconductor substrate, wherein active devices such as transistors and/or diodes are formed at a top surface of the semiconductor substrate. Furthermore, metal lines and vias (not shown) are formed in an interconnect structure (not shown), which is over the semiconductor substrate, of device die 10 to interconnect the integrated circuit devices in device die 10.

Metal pads 12 are formed at the top surface 10A of device die 10. The top surface 10A of device die 10 is also referred to as a front surface. Device die 10 has back surface 10B, which may also be the back surface of the respective semiconductor substrate in device die 10. Metal pads 12 may be aluminum pads, copper pads, aluminum copper pads, or the like. Metal pads 12 may be formed in a first surface region of device die 10, and a second surface region of device die 10 has no metal pads formed therein. For example, in accordance with some exemplary embodiments as shown in FIG. 1A, the right surface region have metal pads 12 therein, and the left surface region have no metal pads.

Figure 1B:
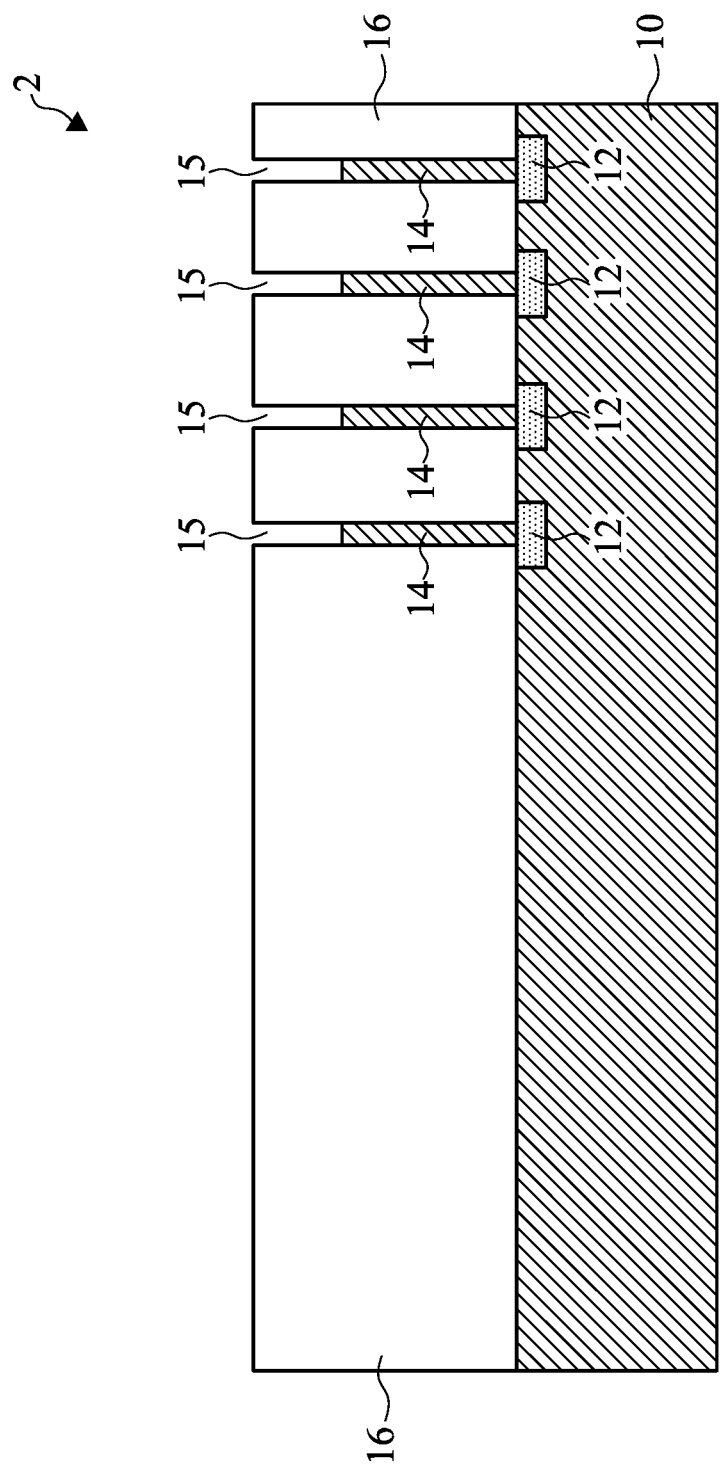
Figure 1C:
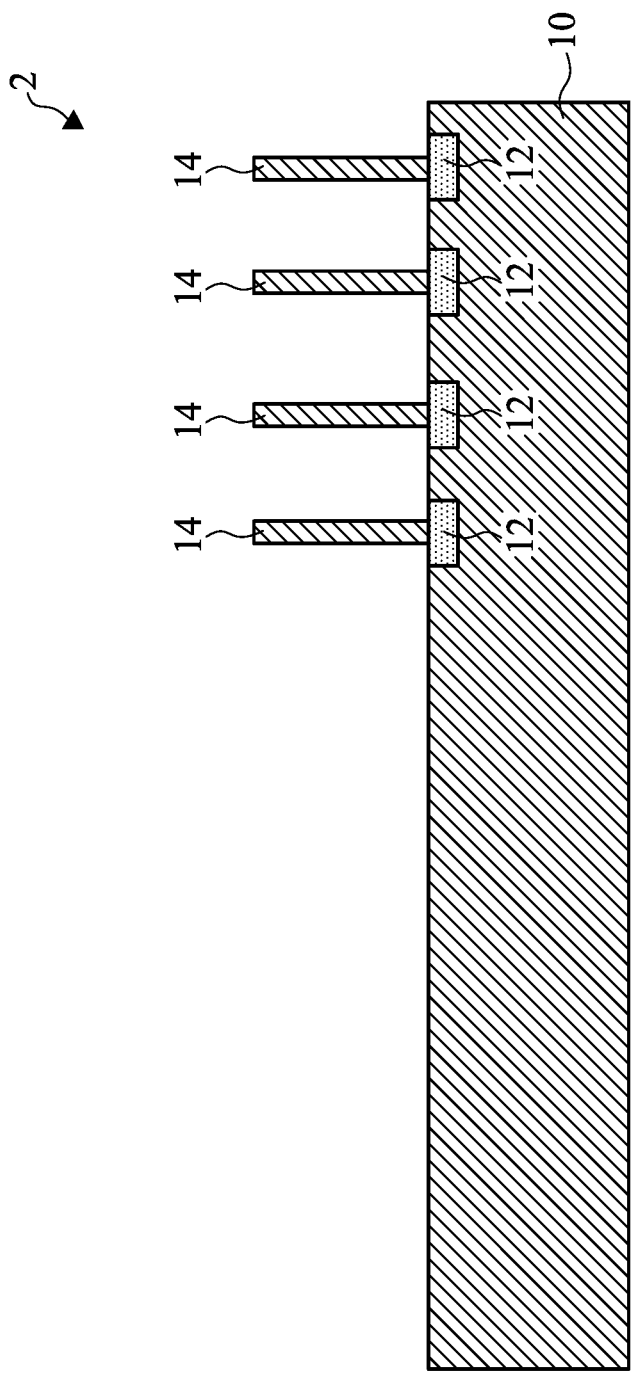

FIGS. 1B and 1C illustrate the formation of through-vias 14. The respective step is illustrated as step 202 in the process step shown in FIG. 12. In accordance with some embodiments, as shown in FIG. 1B, photo resist 16 is formed over wafer 2, and is then patterned to form openings 15, through which a portion of each of metal pads 12 is exposed. Through-vias 14 are then plated in openings 15. Photo resist 16 is then removed, resulting in the structure in FIG. 1C. In accordance with some embodiments of the present disclosure, no seed layer is formed on wafer 2 before the plating, and metal pads 12 act as the seed layer. In accordance with alternative embodiments, a seed layer (not shown) is formed before photo resist 16 is formed, and through-vias 14 are plated on the seed layer. After the removal of photo resist 16, the portions of the seed layer not directly underlying through-vias 14 are removed in an etching process. The remaining portions of the seed layer thus become the bottom portions of through-vias 14.

Figure 1D:
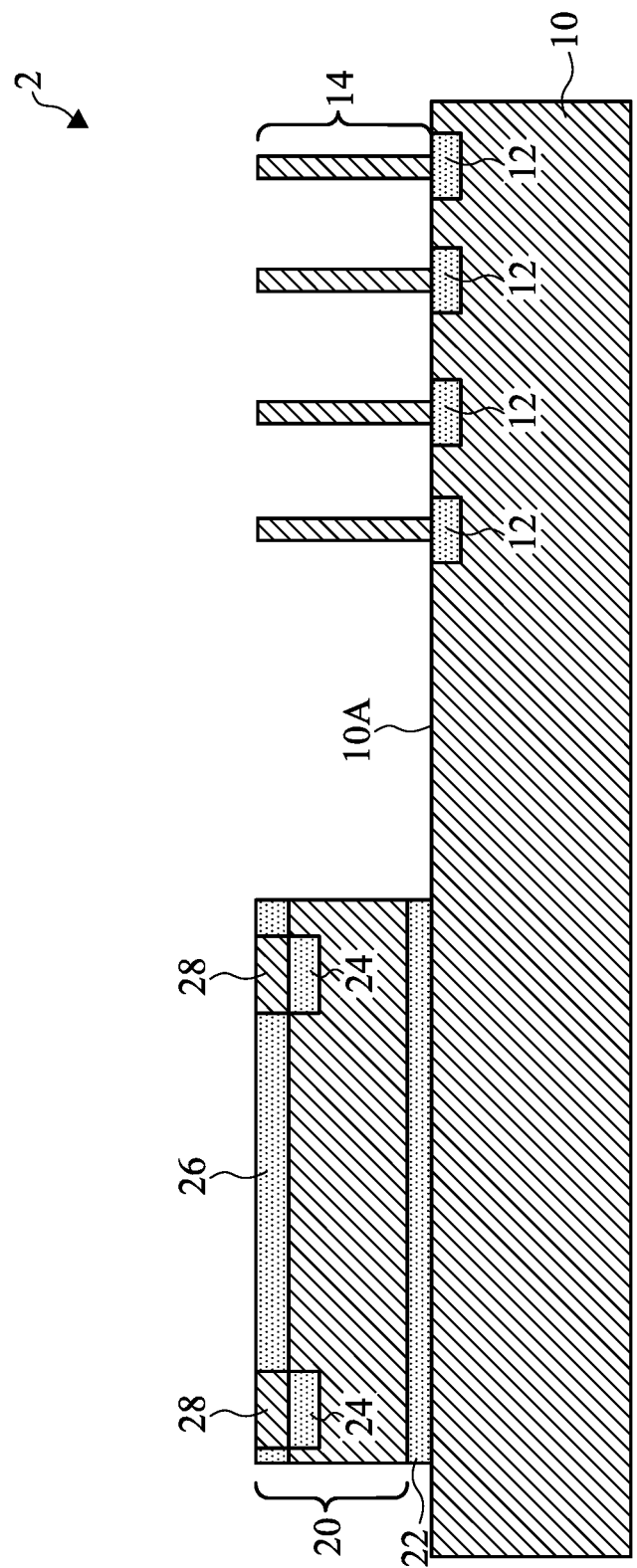

Next, referring to FIG. 1D, device die 20 is adhered to device die 10 through Die-Attach Film (DAF) 22. The respective step is illustrated as step 204 in the process step shown in FIG. 12. The back surface of device die 20 is adhered to the front surface 10A of device die 10, and hence the corresponding die stacking is a face-to-back stacking. In accordance with some embodiments of the present disclosure, device die 20 is a memory die, which may be a Flash die, a static Random Access Memory (SRAM) die, a low power Double-Data-Rate (DDR) die, or the like. Although not shown, device die 20 may be a single memory die or a stacked memory dies. Also device die 20 may also include a semiconductor substrate, wherein active devices such as transistors and/or diodes are formed at a top surface of the semiconductor substrate. Furthermore, metal lines and vias (not shown) are formed in the interconnect structure of device die 20 to interconnect the integrated circuit devices in device die 20. The back surface of device die 20 may also be the back surface of the semiconductor substrate in device die 20.

Figure 11:
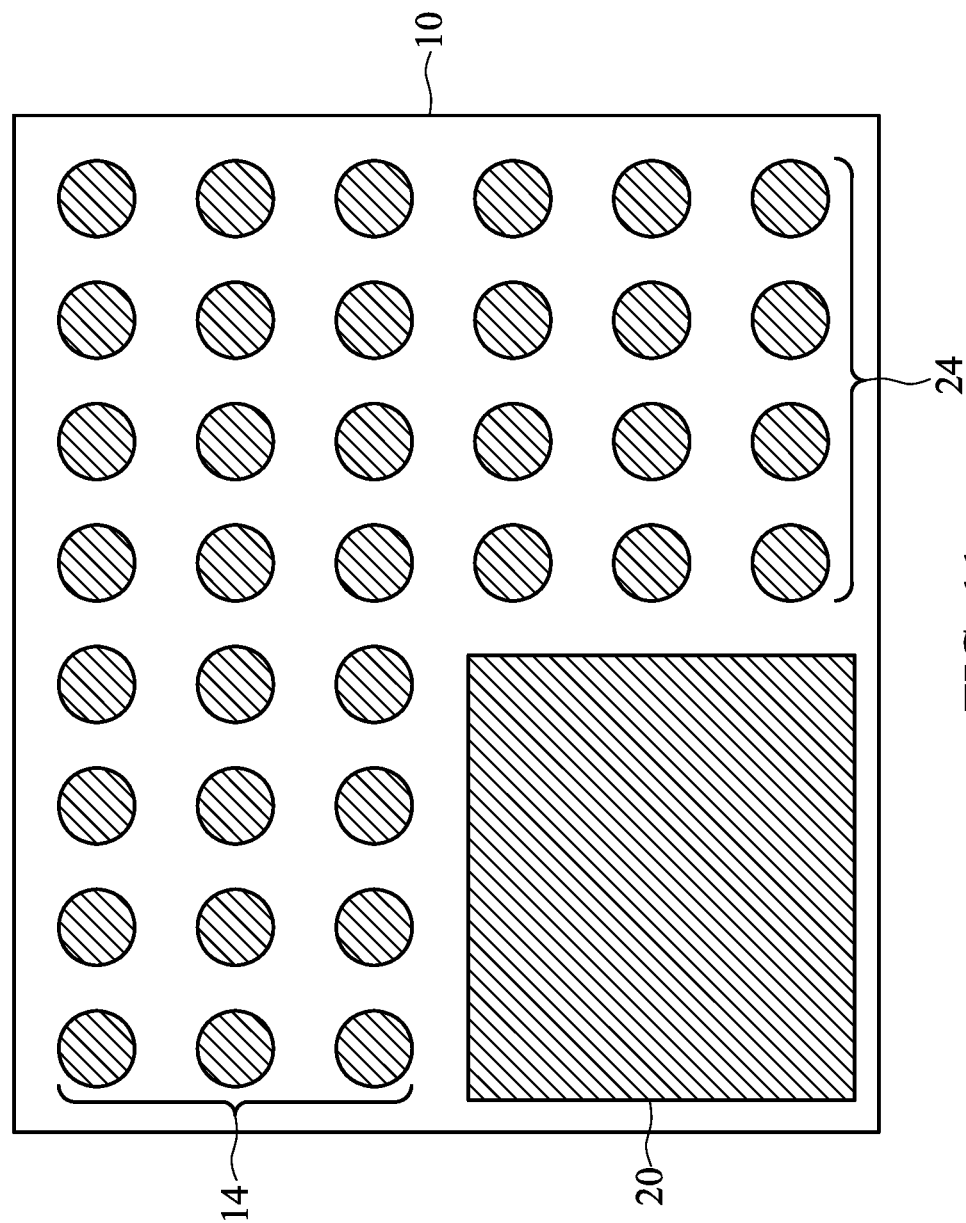
FIG. 11 illustrates a top view of a fan-out package in accordance with some embodiments.

FIG. 11 illustrates an exemplary top view of device die 10 and the corresponding overlying device die 20 and through-vias 14. In accordance with some exemplary embodiments, device die 20 overlaps a corner region of device die 10, with through-vias 14 being adjacent to two sidewalls of device die 20. In accordance with alternative embodiments, device die 20 overlaps a center region of device die 10, and through-vias 14 encircle device die 20. Device die 20 and through-vias 14 may also be laid out using other layout schemes.

DAF 22 is an adhesive film, and may be formed of a polymer. In accordance with some embodiments of the present disclosure, DAF 22 has a low thermal conductivity, which may be lower than about 0.5 W/m*K.

Referring back to FIG. 1D, device die 20 includes conductive pillars 28, which may be metal pillars, formed in surface dielectric layer 26. Metal pillars 28 may be formed of copper, nickel, palladium, gold, multi-layers thereof, and/or alloys thereof. Surface dielectric layer 26 may be formed of polybenzoxazole (PBO), polyimide, benzocyclobutene (BCB), or the like. Underlying metal pillars 28 may reside metal pads 24, which may be formed of copper, aluminum, or other metals.

Figure 1E:
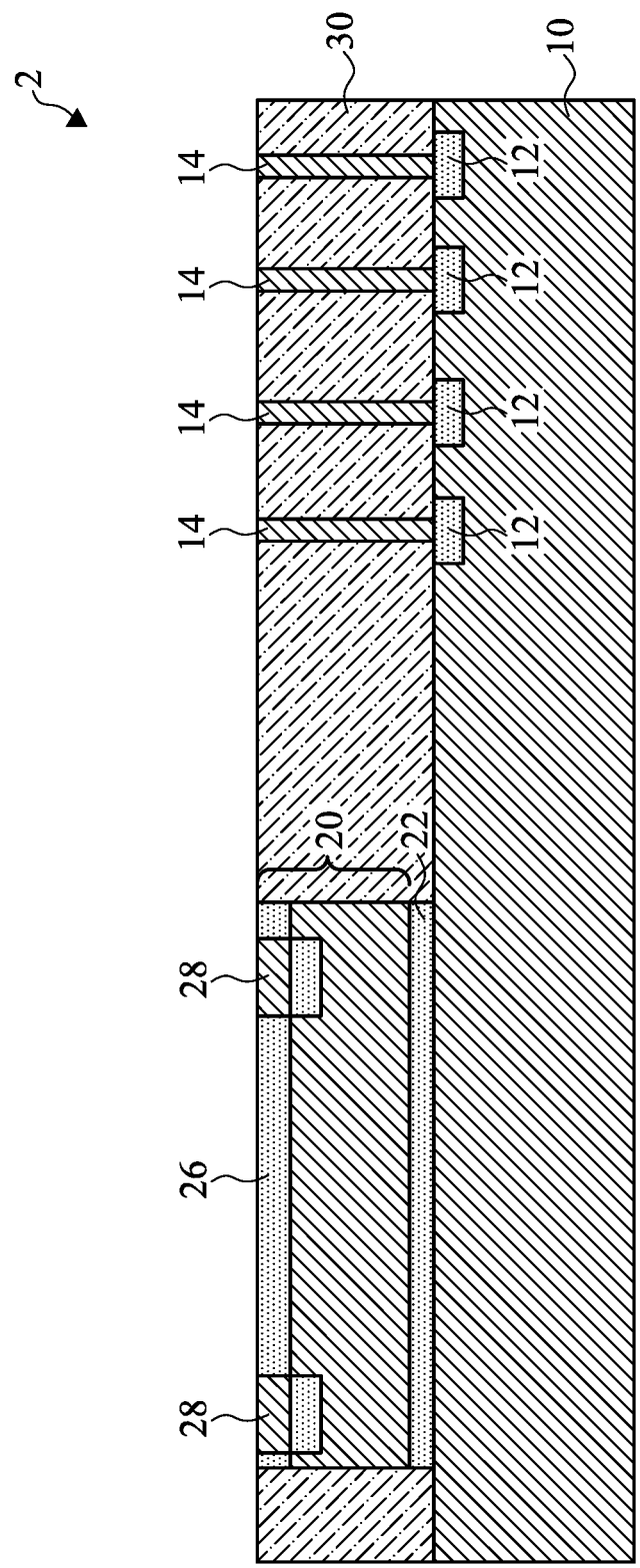

Referring to FIG. 1E, encapsulating material 30 is encapsulated on device die 20 and through-vias 14. The respective step is illustrated as step 206 in the process step shown in FIG. 12. Encapsulating material 30 is dispensed as a fluid and then being compressed and cured, for example, in a thermal curing process. Encapsulating material 30 fills the gaps between device die 20 and through-vias 14. Encapsulating material 30 may include a molding compound, a molding underfill, an epoxy, or a resin. After the encapsulating process, the top surface of encapsulating material 30 is higher than the top ends of metal pillars 28 and through-vias 14.

Next, a planarization step such as a mechanical grinding, a Chemical Mechanical Polish (CMP) and/or a combination of both is performed to planarize encapsulating material 30, through-vias 14, surface dielectric layer 26, and metal pillars 28. The respective step is also illustrated as step 206 in the process step shown in FIG. 12. The resulting structure is also shown in FIG. 1E. Due to the planarization, the top surfaces of through-vias 14 are level (coplanar) with the top surfaces of metal pillars 28, and are level (coplanar) with the top surface of encapsulating material 30.

Figure 1F:
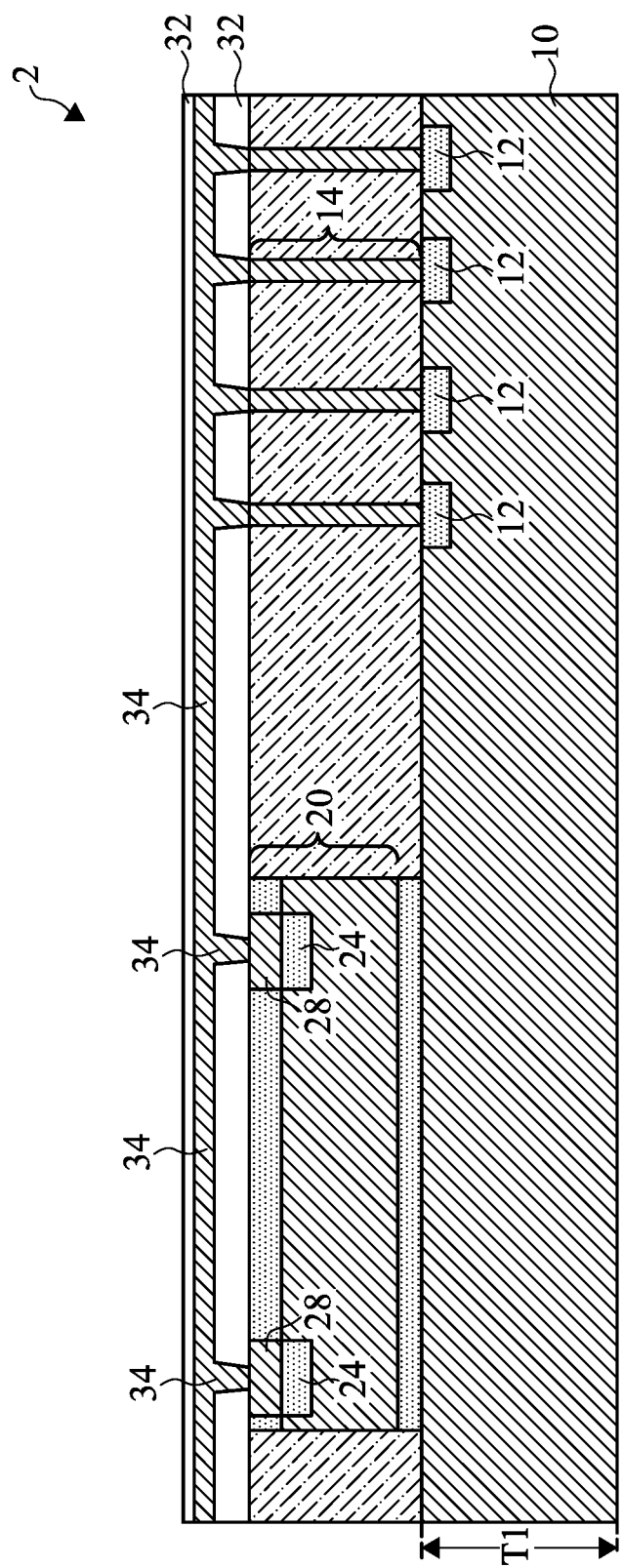

Referring to FIG. 1F, one or more dielectric layer 32 and the respective Redistribution Layers (RDLs) 34 are formed over encapsulating material 30, through-vias 14, and metal pillars 28. The respective step is illustrated as step 208 in the process step shown in FIG. 12. In accordance with some embodiments of the present disclosure, dielectric layers 32 are formed of a polymer(s) such as PBO, polyimide, BCB, or the like.

RDLs 34 are formed to electrically couple to metal pillars 28 and through-vias 14. It is noted that the illustration of RDLs 34 throughout all figures is schematic. For example, RDLs 34 are actually patterned as a plurality of discrete portions separated from each other by the respective dielectric layer(s). Each of the discrete portions of RDLs 34 is connected to the respective underlying metal pillars 28 and/or through-vias 14. RDLs 34 may also interconnect some metal pillars 28 to the respective through-vias 14. RDLs 34 may include metal traces (metal lines) and vias underlying and connected to the metal traces. In accordance with some embodiments of the present disclosure, RDLs 34 are formed through plating processes, wherein each of RDLs 34 includes a seed layer (not shown) and a plated metallic material over the seed layer. The seed layer and the plated metallic material may be formed of the same material or different materials.

Figure 1G:
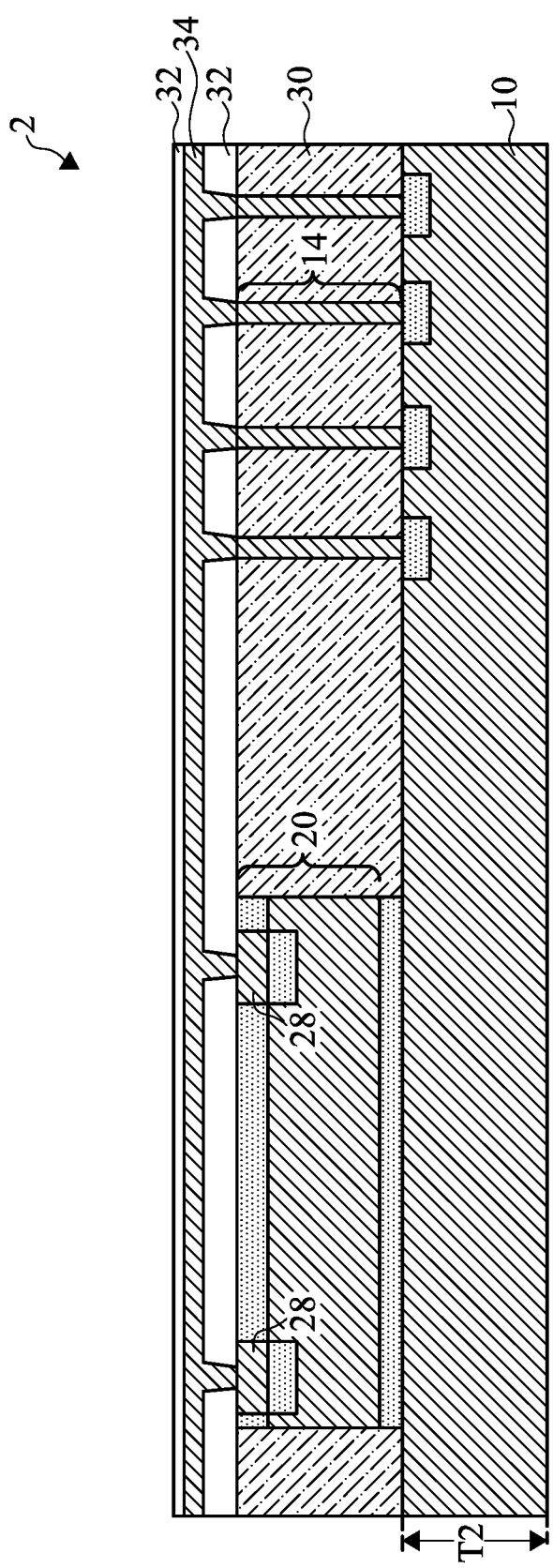

FIG. 1G illustrates the backside grinding of device die 10, which is grinded from its backside (the illustrated bottom side). The respective step is illustrated as step 210 in the process step shown in FIG. 12. Accordingly, the thickness of device die 10 is reduced from thickness T1 (FIG. 1F) to thickness T2 as shown in FIG. 1G.

Figure 1H:
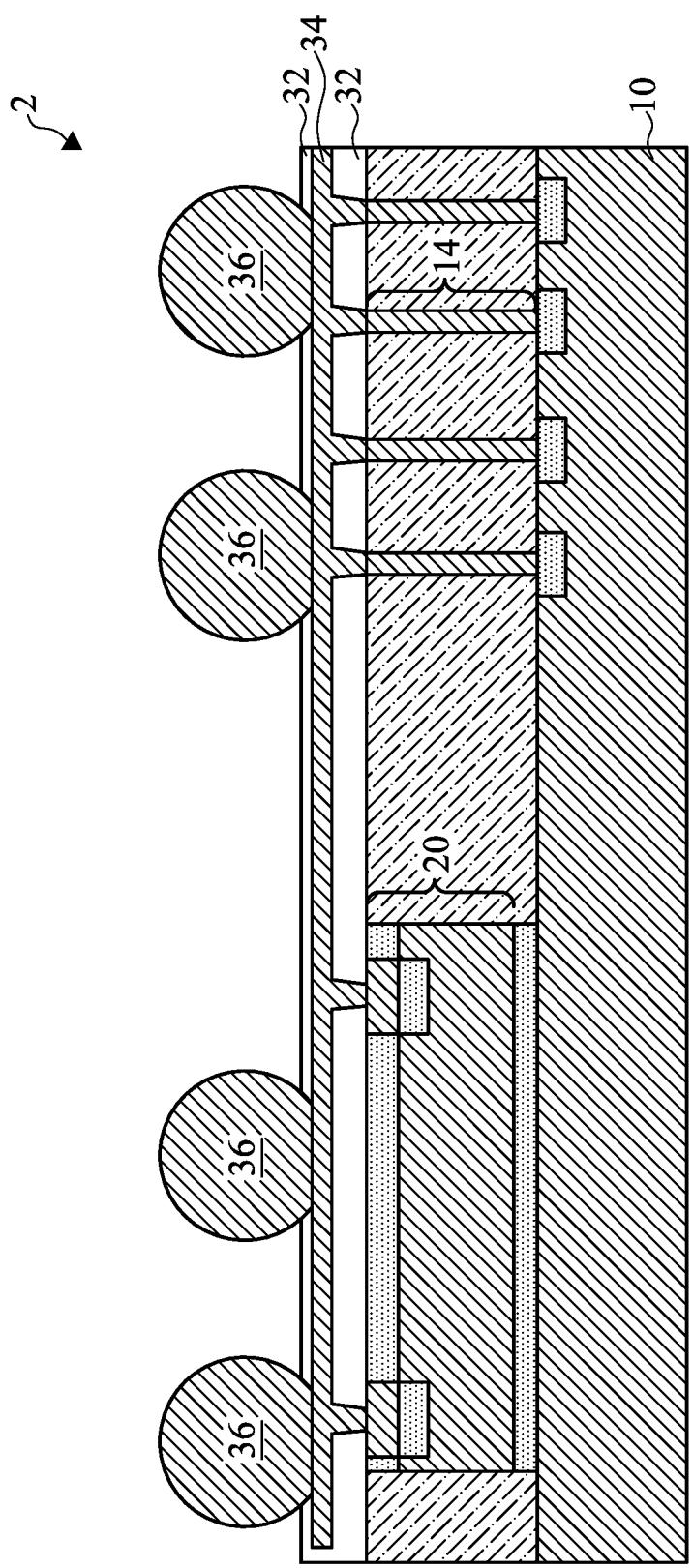

FIG. 1H illustrates the formation of electrical connectors 36 in accordance with some exemplary embodiments of the present disclosure. The respective step is illustrated as step 212 in the process step shown in FIG. 12. Electrical connectors 36 are electrically coupled to RDLs 34, metal pillars 28, and/or through-vias 14. The formation of electrical connectors 36 may include placing solder balls over RDLs 34 and then reflowing the solder balls. In accordance with alternative embodiments of the present disclosure, the formation of electrical connectors 36 includes performing a plating step to form solder regions over RDLs 34, and then reflowing the solder regions. Electrical connectors 36 may also include metal pillars, or metal pillars and solder caps, which may also be formed through plating.

In addition, Integrated Passive Device (IPD) 39 may be bonded to RDLs 34. IPD 39 may be used for tuning the performance of the resulting package, and may include a capacitor, for example. In accordance with alternative embodiments, no IPD 39 is bonded. Throughout the description, the combined structure including device dies 10 and 20, through-vias 14, encapsulating material 30, RDLs 34, and dielectric layers 32 will be referred to as composite wafer 38, which is a composite wafer including a plurality of device dies 10 and 20.

In subsequent steps, composite wafer 38 is sawed apart into a plurality of packages 40, each including one of device dies 10, one of device dies 20, and the corresponding through-vias 14. The respective step is illustrated as step 214 in the process step shown in FIG. 12. Package 40 in accordance with some embodiments is thus formed with a single encapsulating (molding) process, although package 40 includes two levels of device dies stacked together. This is different from conventional die stacking processes, wherein two levels of device dies are encapsulated using two encapsulating processes. In addition, no package substrate is used in package 40. This causes the advantageous reduction in the thickness of package 40, and hence package 40 is suitable for mobile applications that require very thin packages.

In accordance with some embodiments, while package 40 is a fan-out package since RDLs 34 extends beyond the edges of device die 20, the footprint (the top-view area) of package 40 is the same as the top-view area of device die 10, providing the top-view area of device die 10 is adequate for disposing all electrical connectors 36. Accordingly, the top-view area of package 40 is small. In addition, the distance between metal pads 12 and electrical connectors 36 is small, resulting in the improvement in the electrical performance of the resulting package 40.

Furthermore, device die 10, which may be a logic die, often generates more heat than memory device dies such as device die 20. Memory dies suffer from severe performance degradation from heat. In accordance with the embodiments of the present disclosure, DAF 22, which has low thermal conductivity, is used to reduce the heat generated in device die 10 from being conducted into device die 20. Rather, the heat in device die 10 may be conducted through through-vias 14 to electrical connectors 36. Some of through-vias 14 may also be designed as dummy vias that are not used for electrical connection between device die 10 and electrical connector 36. The dummy through-vias 14 may be electrically floating, and are used for conducting the heat in device die 10 to electrical connectors 36.

FIGS. 2A through 4J illustrate cross-sectional views of intermediate stages in the formation of a fan-out package in accordance with some embodiments of the present disclosure. Unless specified otherwise, the materials and the formation methods of the components in these embodiments are essentially the same as the like components, which are denoted by like reference numerals in the embodiments shown in FIGS. 1A through 1I. The details regarding the formation process and the materials of the components shown in FIGS. 2A through 4J (and the embodiments in FIGS. 5 through 10) may thus be found or realized through the discussion of the embodiments shown in FIGS. 1A through 1H.

Figure 2A:
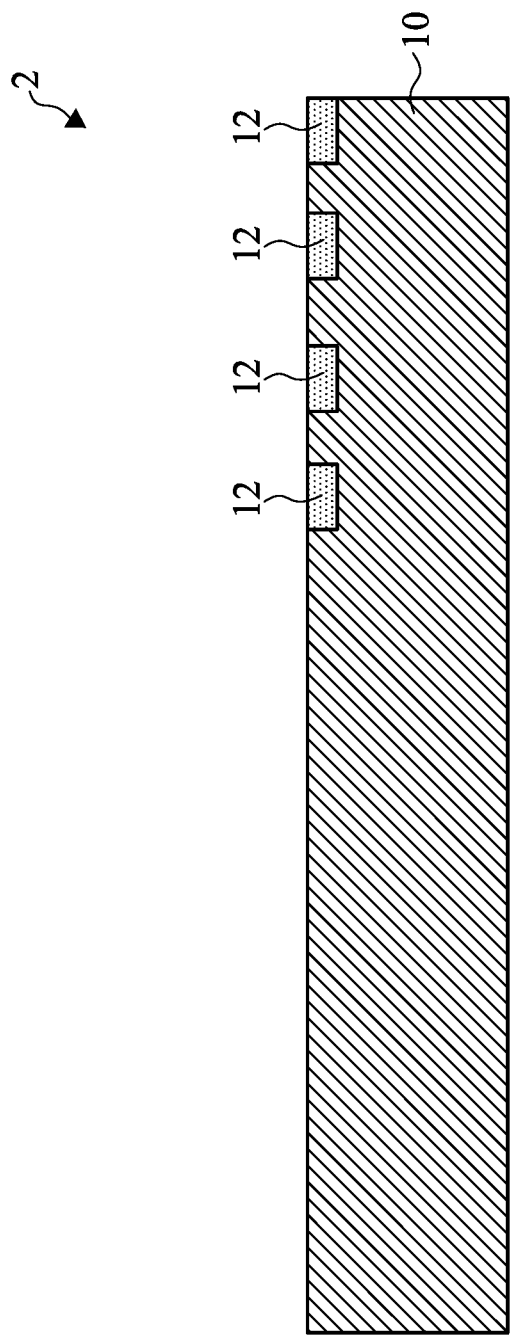
FIGS. 2A through 2I illustrate the cross-sectional views of intermediate stages in the formation of a fan-out package in accordance with some embodiments.
Figure 2B:
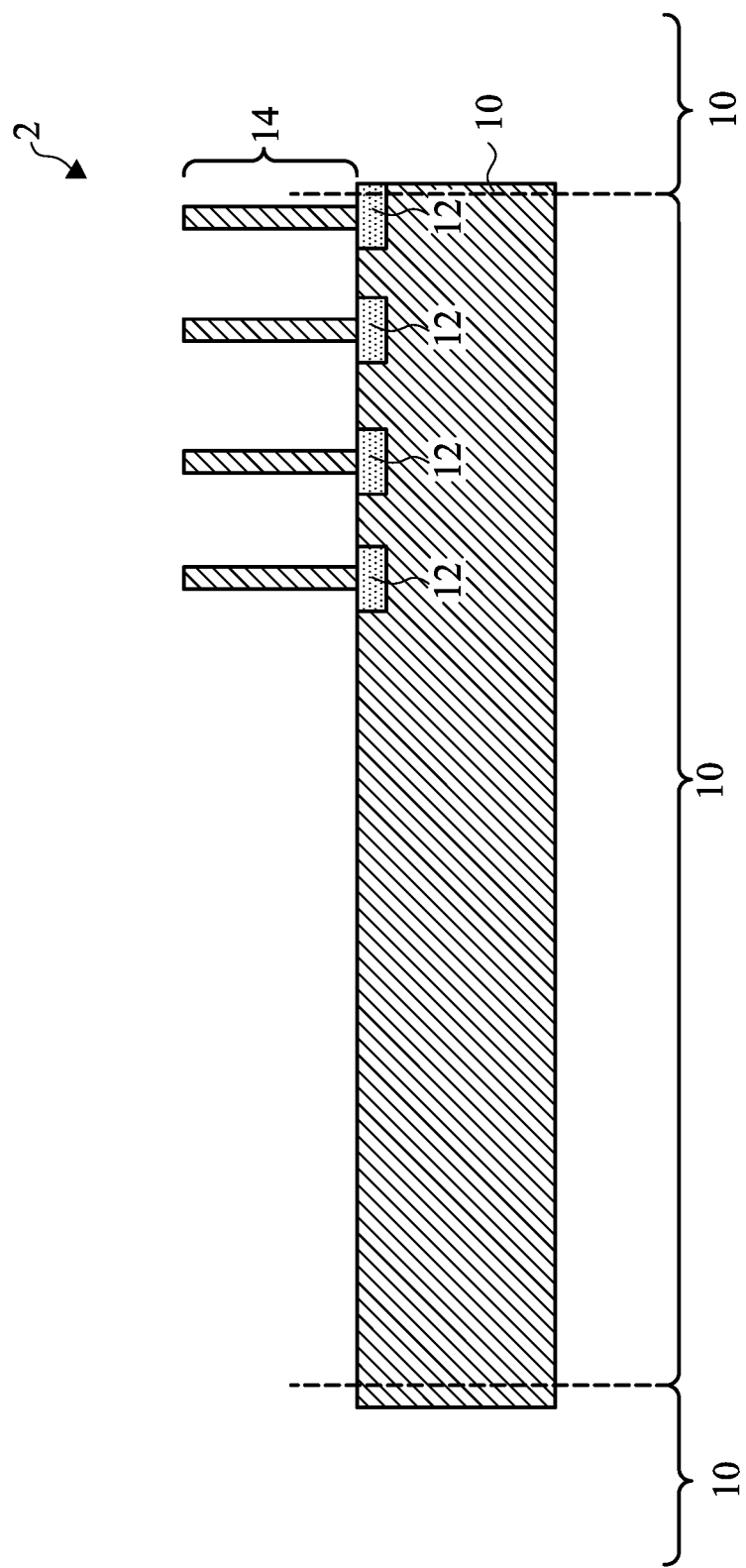

The initial steps of some embodiments are shown in FIGS. 2A and 2B, which are essentially the same as the process steps shown in FIGS. 1A through 1C. Through-vias 14 are formed on metal pads 12 of device dies 10. Next, wafer 2 is sawed into individual device dies 10.

Figure 2C:
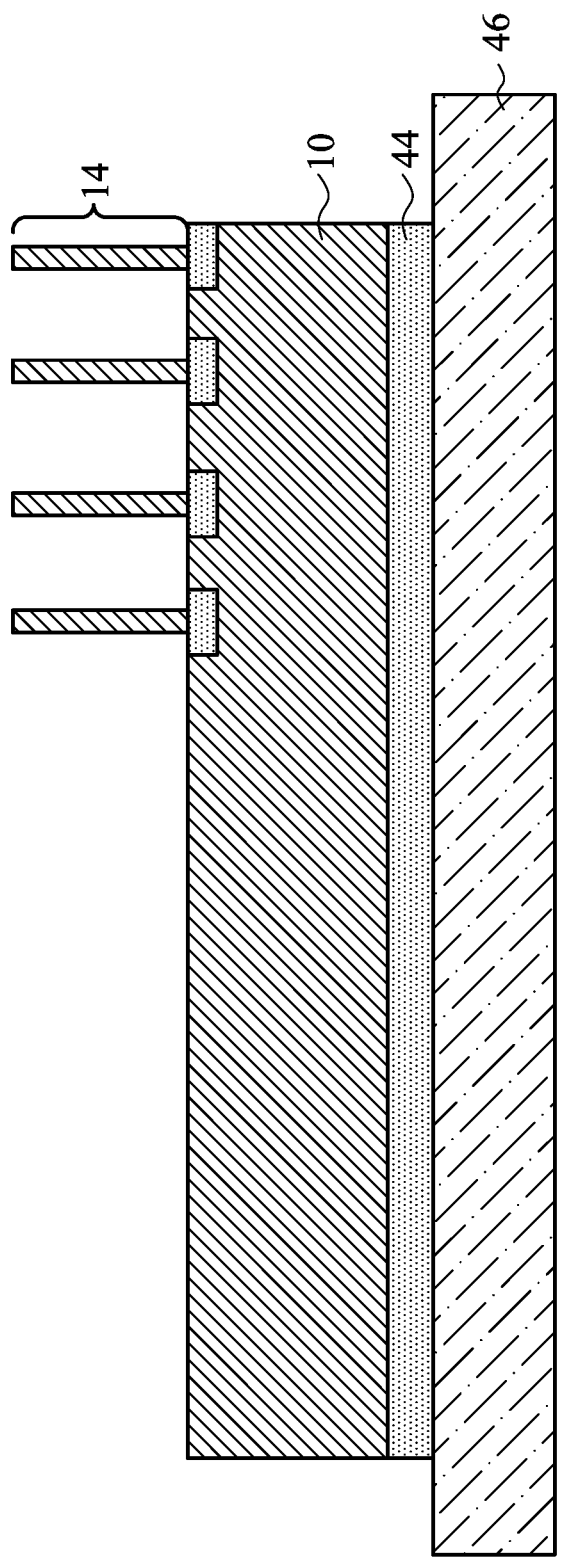
Figure 2D:
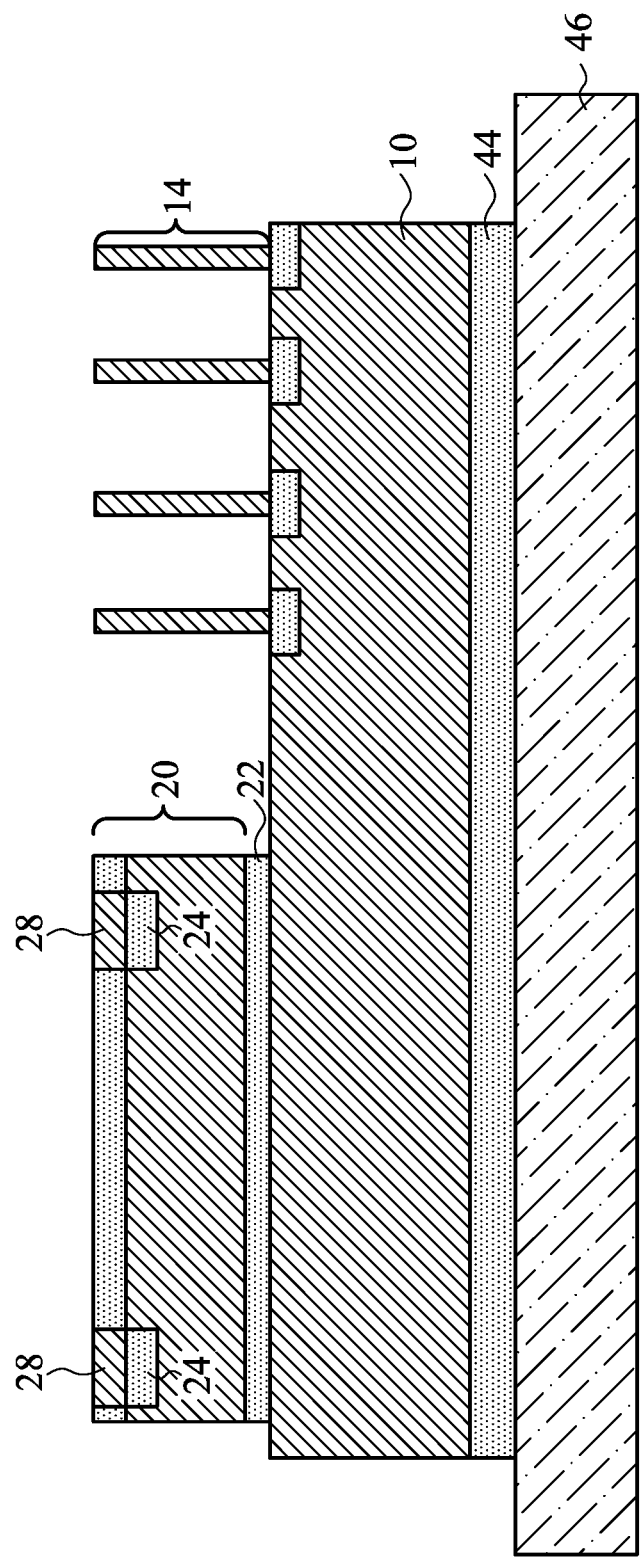
Figure 2E:
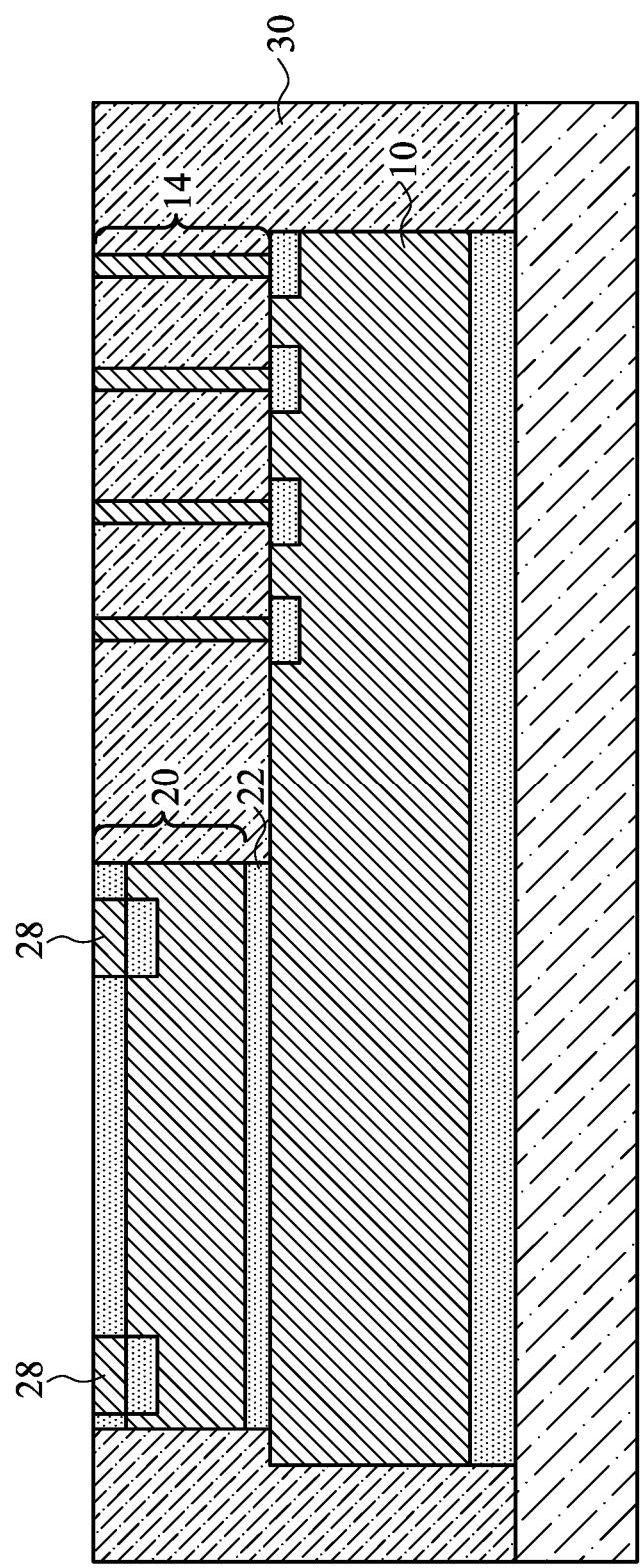

Referring to FIG. 2C, device die 10 is adhered to carrier 46 through adhesive film 44. In accordance with some embodiments of the present disclosure, carrier 46 is a glass carrier. Although one device die 10 is shown, there is a plurality of device dies 10 placed on carrier 46, and device dies 10 may be laid out as an array. Device die 20 is then adhered to the front surface of device die 10 through DAF 22, as shown in FIG. 2D. In a subsequent step, as shown in FIG. 2E, encapsulating material 30 is dispensed to encapsulate device dies 10 and 20. Different from the embodiments as shown in FIG. 1E, device die 10 is also encapsulated. Since the encapsulation of device dies 10 and 20 is achieved in a single encapsulating process, there is no distinguishable interface between the upper part (for encapsulating device die 20) and the bottom part (for encapsulating device die 10) of encapsulating material 30.

Figure 2F:
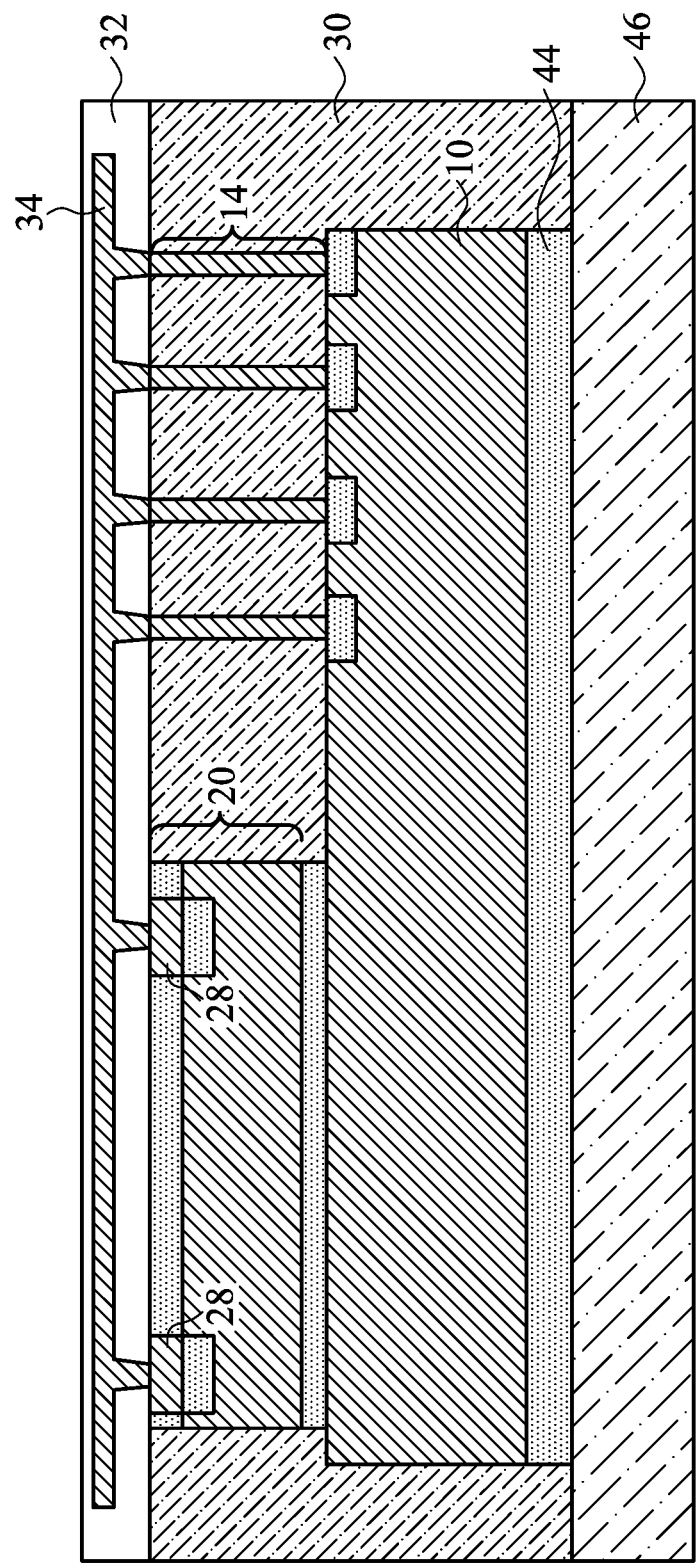

In a subsequent step, as shown in FIG. 2F, dielectric layers 32 and RDLs 34 are formed over encapsulating material 30, with RDLs 34 electrically coupled to metal pillars 28 and through-vias 14. In accordance with some exemplary embodiments, RDLs 34 expand beyond the edges of both device dies 10 and 20. Accordingly, the embodiments shown in FIG. 2F (compared to FIG. 1F) may be used in the embodiments in which the top-view area of device die 10 is not large enough to accommodate all of electrical connectors 36 (FIG. 2I), and hence RDLs 34 need to fan-out from device die 10.

Figure 2G:
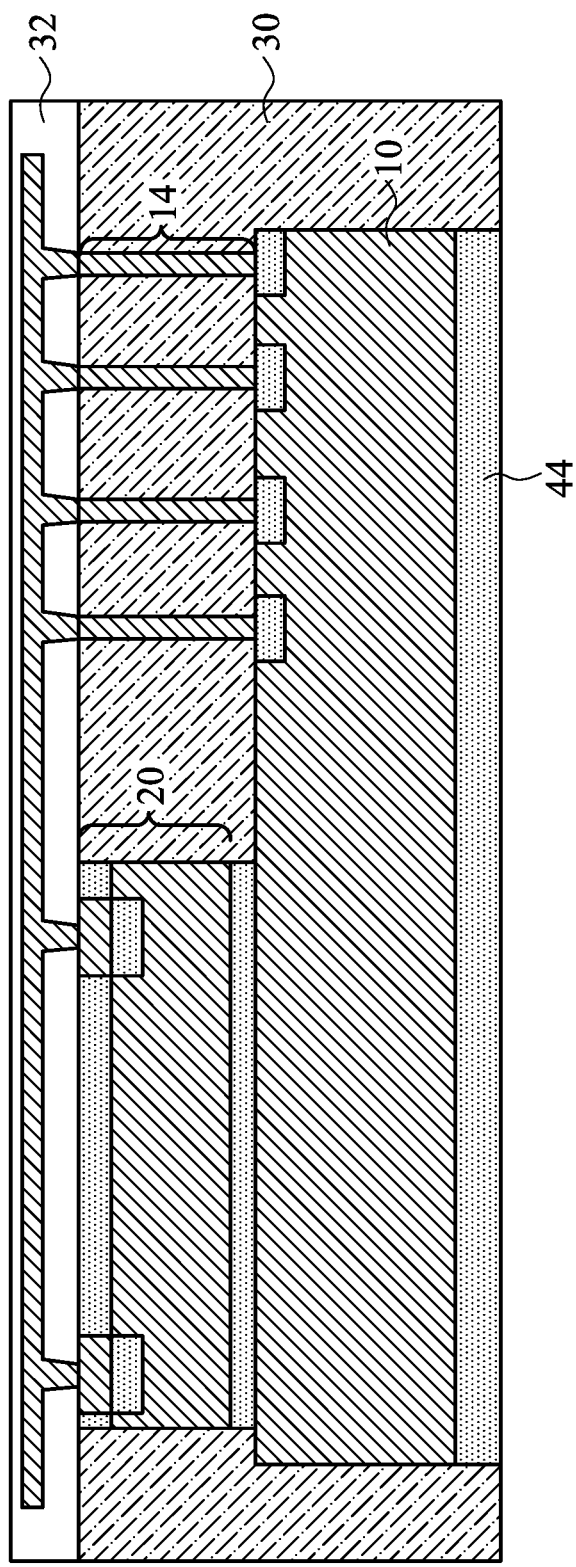
Figure 2H:
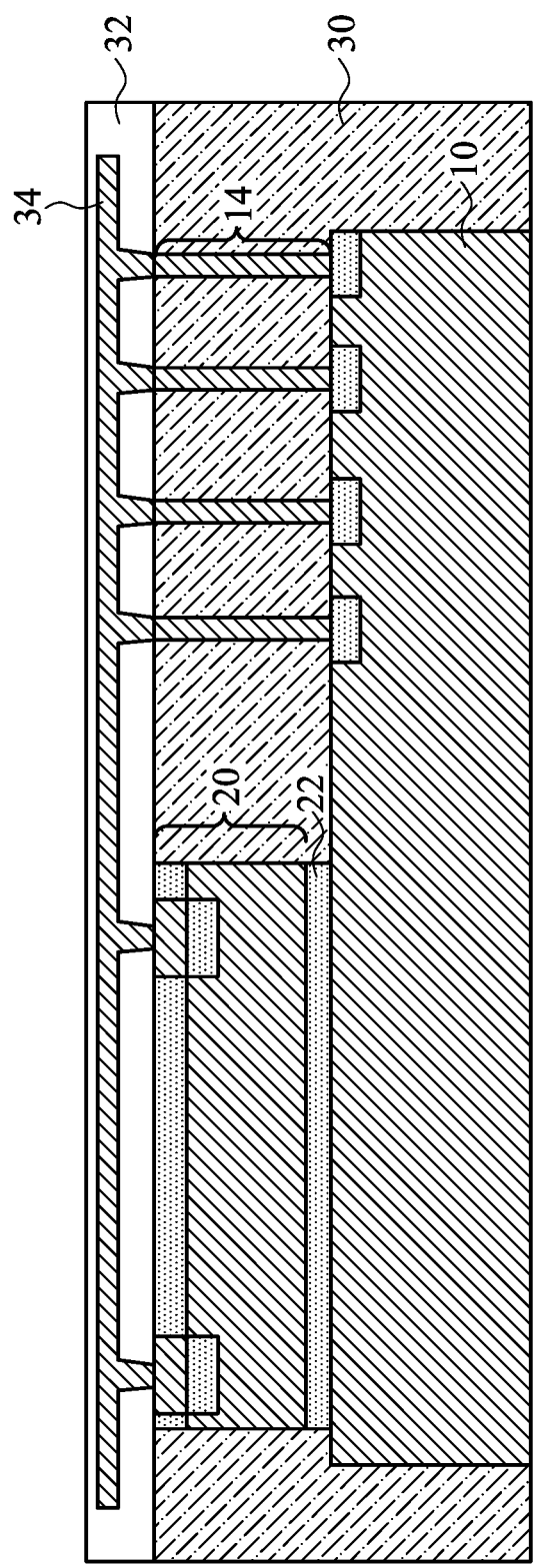
Figure 2I:
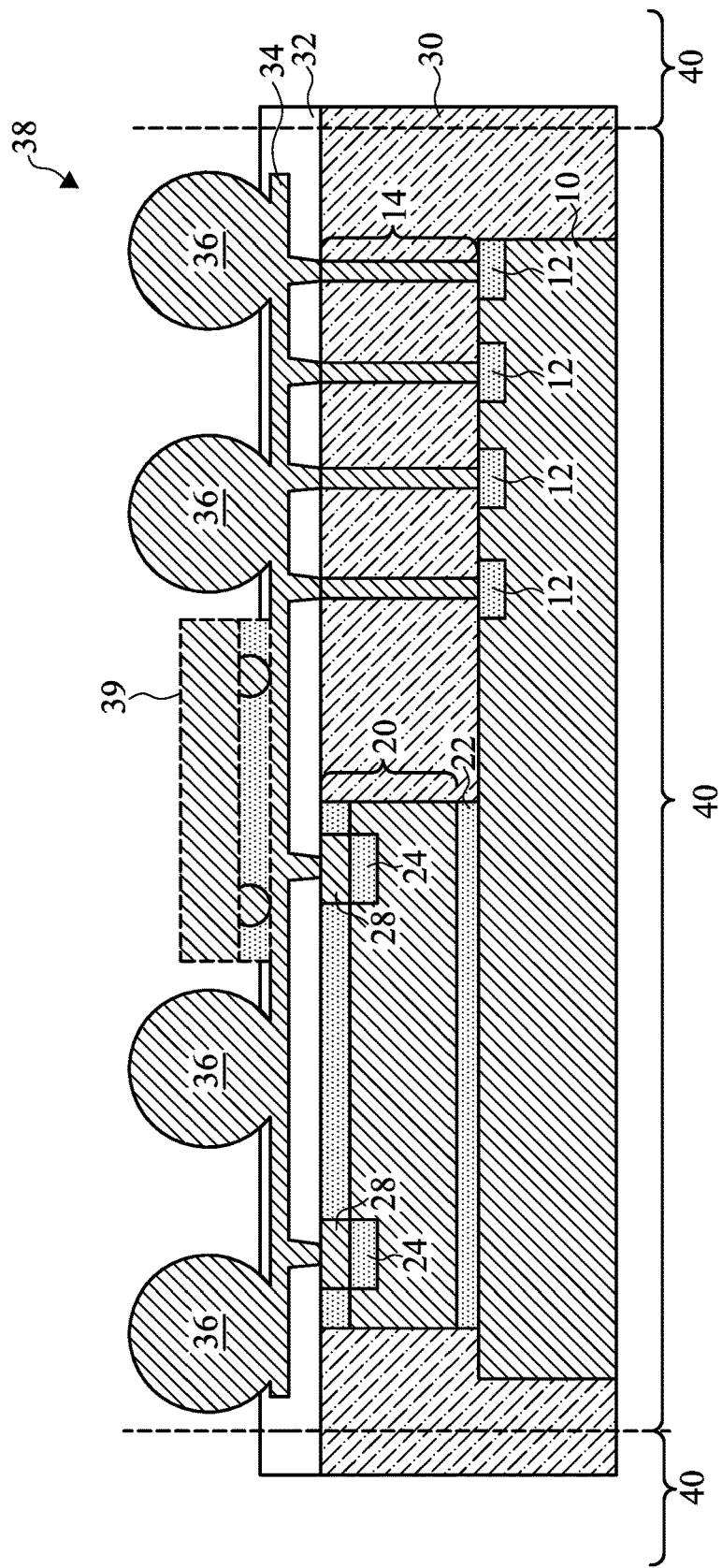

Next, carrier 46 is de-bonded from the overlying structure, resulting in the structure shown in FIG. 2G. A backside grinding may then be performed to remove adhesive film 44 and to thin device die 10, and the resulting structure is shown in FIG. 2H. In FIG. 2I, IPD 39 may be (or may not be) bonded to RDLs 34. The resulting composite wafer 38, which includes device dies 10, device dies 20, encapsulating material 30, through-vias 14, RDLs 34, and dielectric layers 32, is sawed into individual packages 40.

Figure 3A:
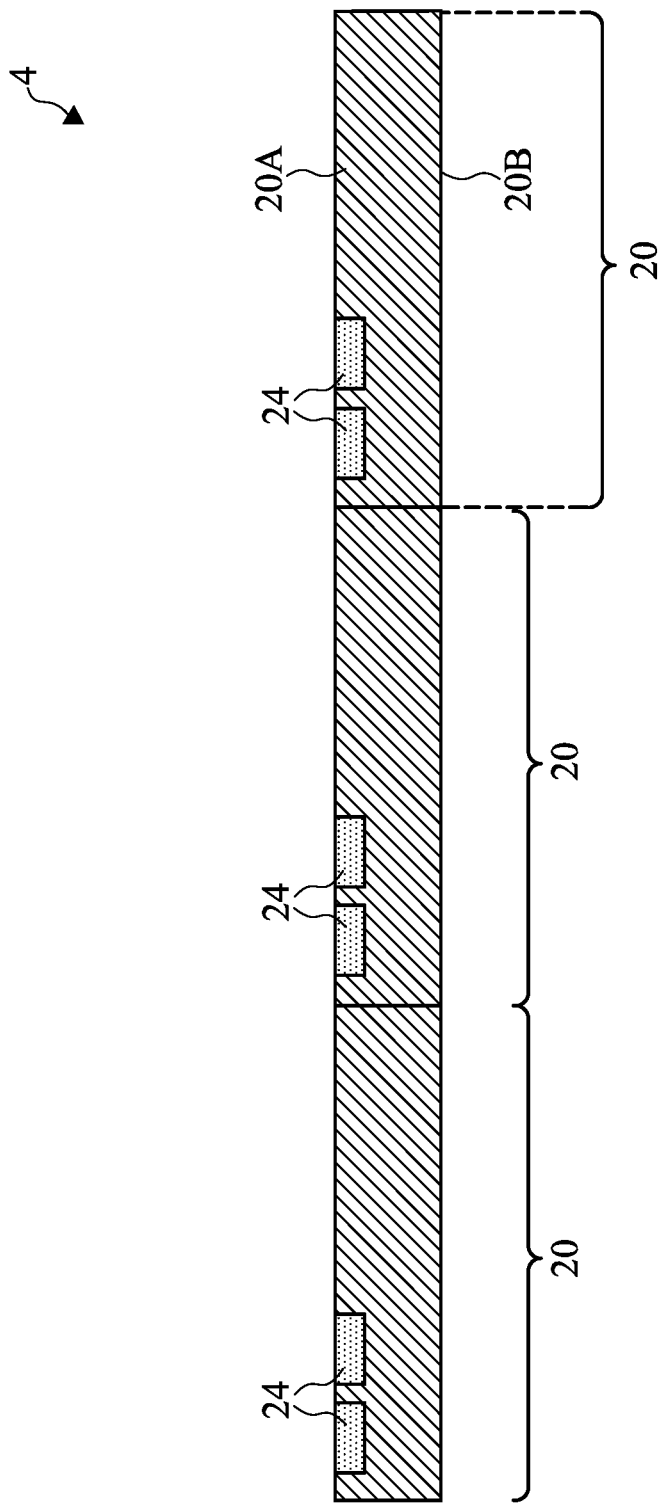
FIGS. 3A through 3J illustrate the cross-sectional views of intermediate stages in the formation of a fan-out package in accordance with some embodiments.

FIGS. 3A through 3J illustrate the formation of fan-out packages 40 in accordance with some embodiments. Referring to FIG. 3A, wafer 4 is formed, which includes device dies 20 therein. Conductive pads (such as metal pads) 24 are formed at the front surface 20A of device dies 20. Device die 20 has back surface 20B, which may also be the back surface of the respective semiconductor substrate (not shown) therein. Next, referring to FIG. 3B, through-vias 14 are formed, wherein the formation process may be similar to the process shown in FIGS. 1B and 1C. Wafer 4 is then sawed part into individual device dies 20.

Figure 3B:
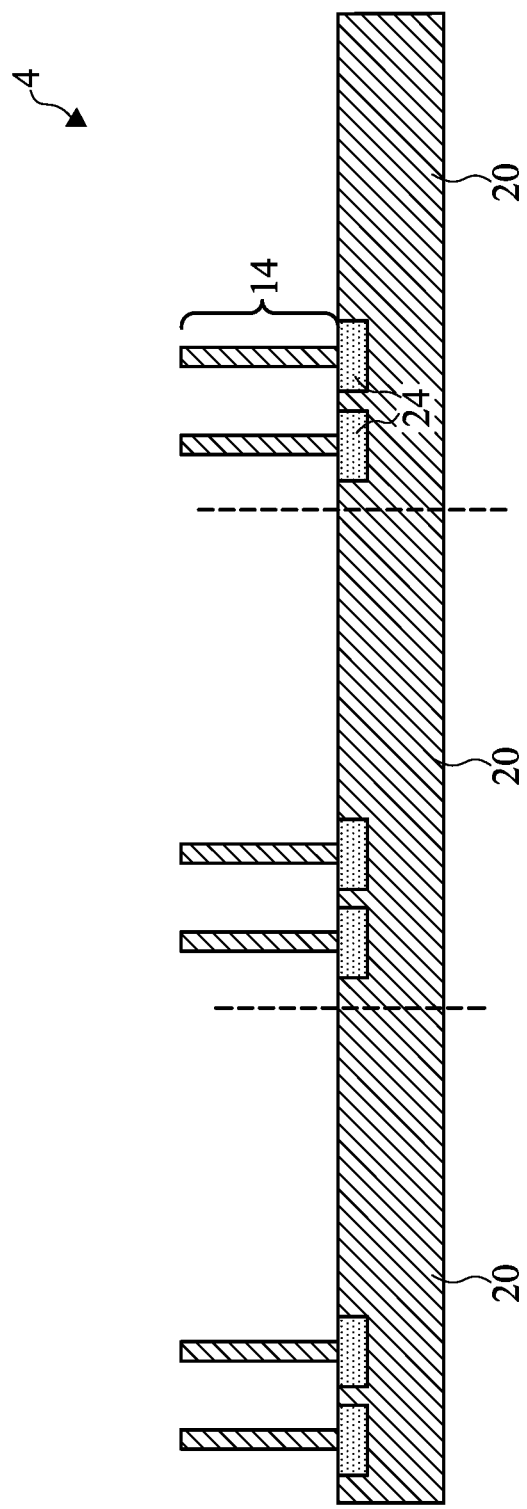
Figure 3C:
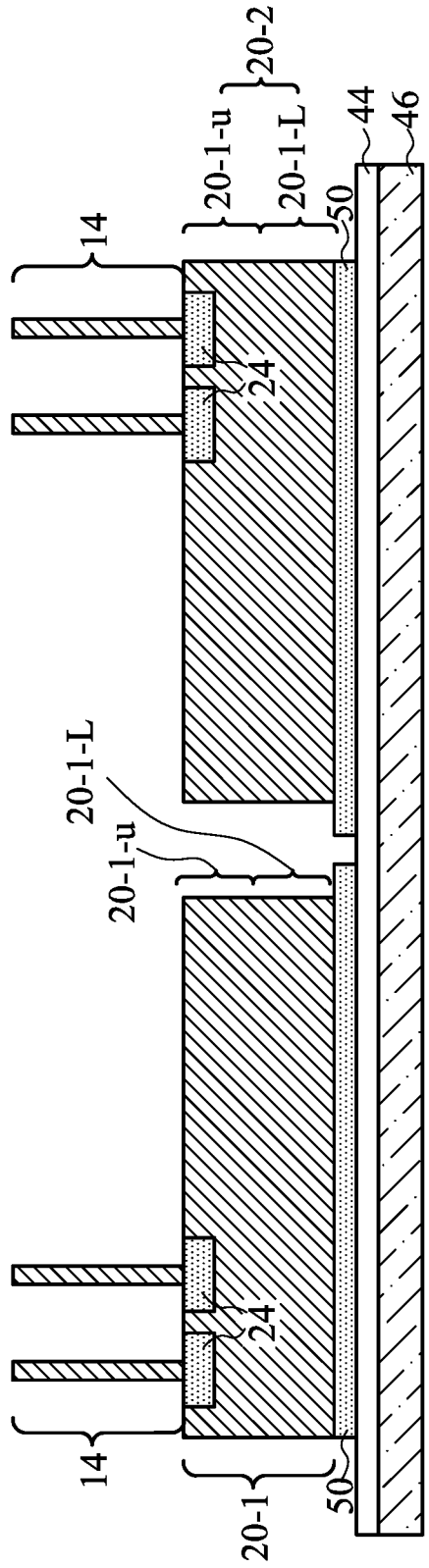
Figure 3D:
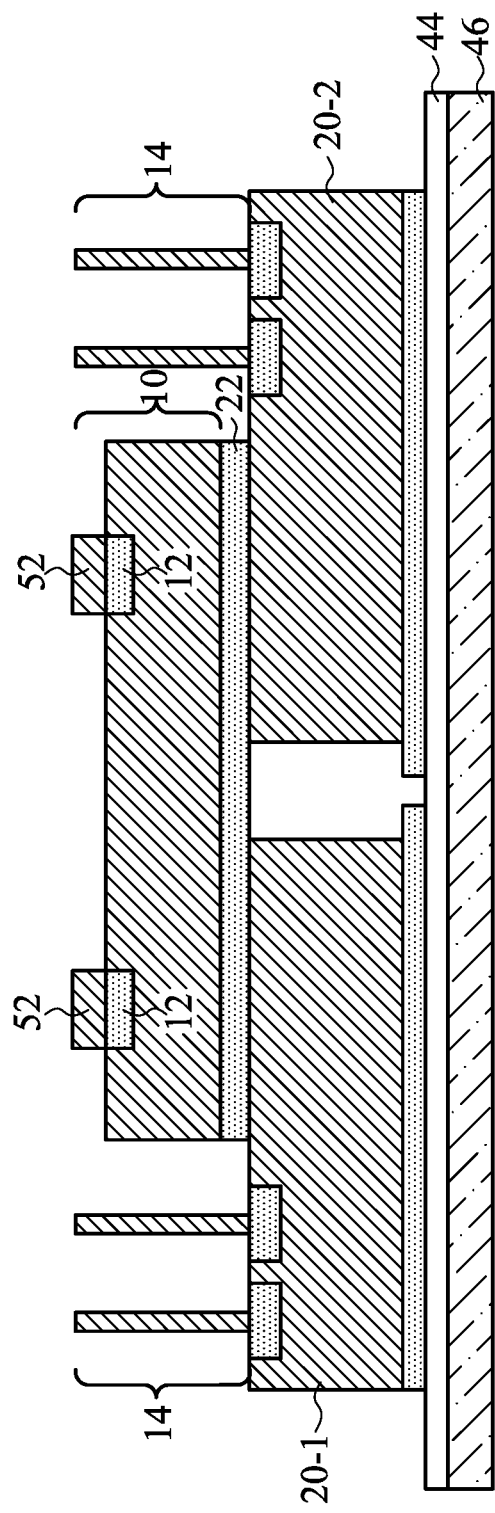

Referring to FIG. 3C, device dies 20 (including 20-1 and 20-2) are picked and placed on carrier 46 and the overlying adhesive film 44. Adhesive layer 44 may be formed of a Light-to-Heat Conversion (LTHC) material. In addition, DAFs 50 may be used to adhere device dies 20 to adhesive film 44. The distance between device dies 20-1 and 20-2 is selected, so that the space between the through-vias 14 over device die 20-1 and the through-vias 14 over device die 20-2 is big enough to accommodate device die 10 (FIG. 3D). In accordance with some embodiments of the present disclosure, device dies 20-1 and 20-2 are identical to each other, and device die 20-1 is rotated by 180 degrees (in a top view) relative to device die 20-2. In accordance with alternative embodiments, device dies 20-1 and 20-2 are partially identical to each other, wherein the lower part (of device die 20-1) 20-1-L such as the active devices and the interconnect structure (not shown) is identical to the lower part 20-2-L of device die 20-2. The upper parts 20-1-U and 20-2-U, which include the top redistribution layer(s) (not shown), however, are different from each other, so that the conductive pads 24 in device die 20-1 are concentrated on the left side of device die 20-1, and the conductive pads 24 in device die 20-2 are concentrated on the right side of device die 20-2. In accordance with alternative embodiments of the present disclosure, device dies 20-1 and 20-2 are different types of dies, and have different structures. In accordance with alternative embodiments of the present disclosure, device dies 20 may include more than two dies, such as four dies, and device die 10 may include more than one die, such as two dies, for the integration of multiple logics and multiple memory chips depending on design needs. In accordance with alternative embodiments of the present disclosure, device dies 20 may include multi-chips stacked cube structure in each individual device dies 20-1, 20-2 (not shown). Each stacked cube structure may contain such a plurality of chips such as 2-chips to 9-chips. In each stacked cube structure, each of the stacked chips may be a homogeneous functional chip such as a memory functional chip and/or a heterogeneous functional chip such as a logic functional controller chip. The stacked chips may also be multiple homogeneous memory chips (not shown). The stacked chips may have Through-Silicon Vias (also known as Through-Substrate Vias, or TSVs), depending on the design needs, such as a high bandwidth memory (HBM) cube.

Next, referring to FIG. 3D, device die 10 is placed over device dies 20, and is adhered to the front surfaces of device dies 20 through DAF 22. A portion of device die 10 also overlaps the gap between device dies 20. In accordance with some embodiments, device die 10 includes metal pillars 52 over metal pads 12, with no dielectric layer encircling metal pillars 52. In accordance with alternative embodiments, there is a dielectric layer (not shown) at the same level as, and encircling metal pillars 52. In accordance yet alternative embodiments, no metal pillars are formed over metal pads 12, and metal pads 12 are the top conductive features of device die 10.

Figure 3E:
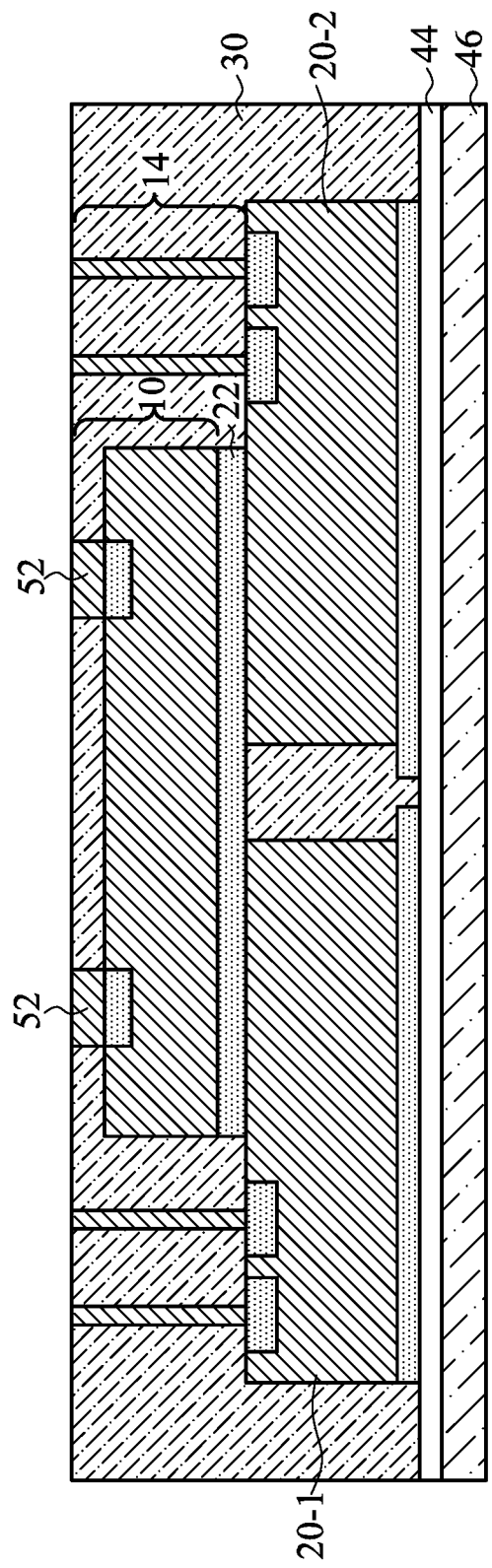
Figure 3F:
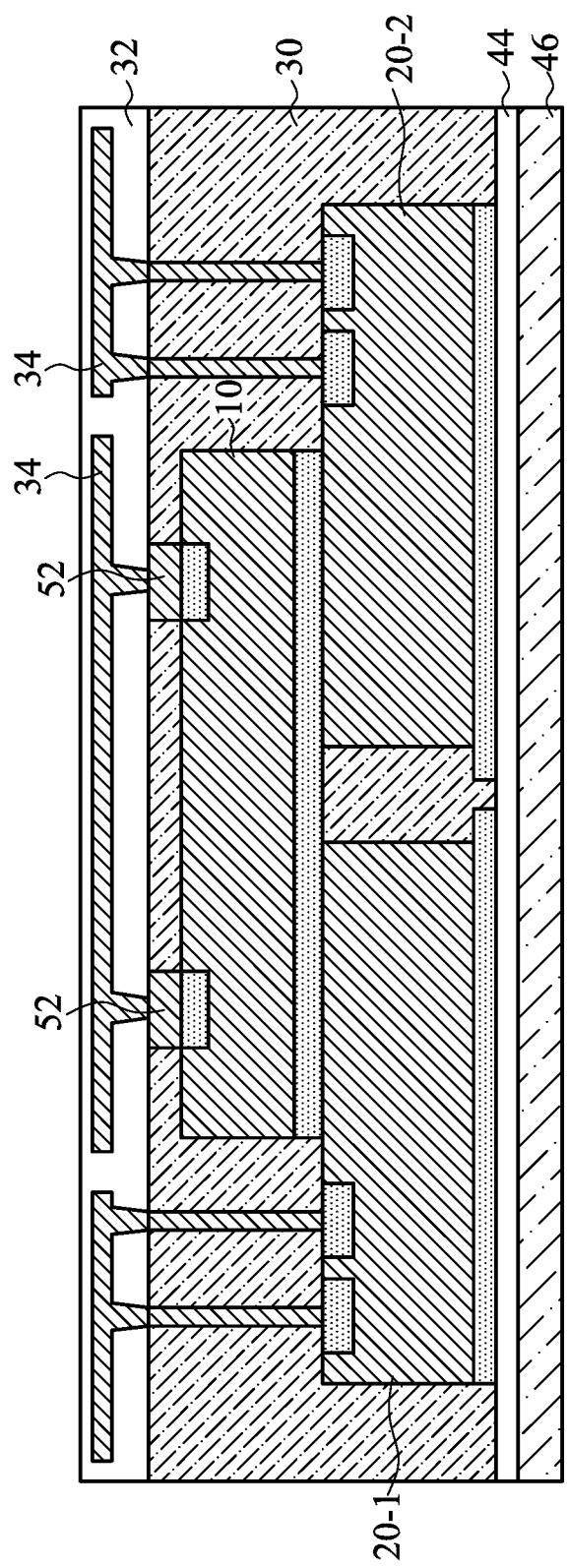
Figure 3G:
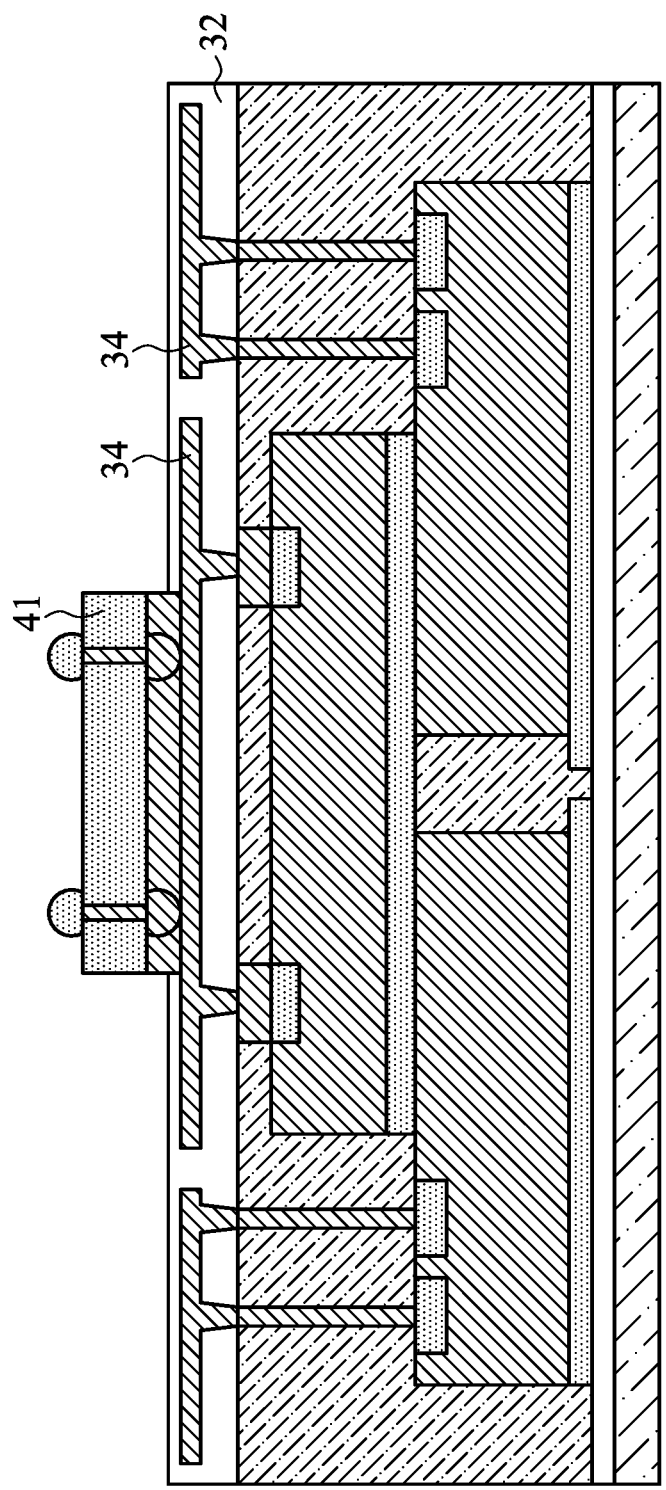
Figure 3H:
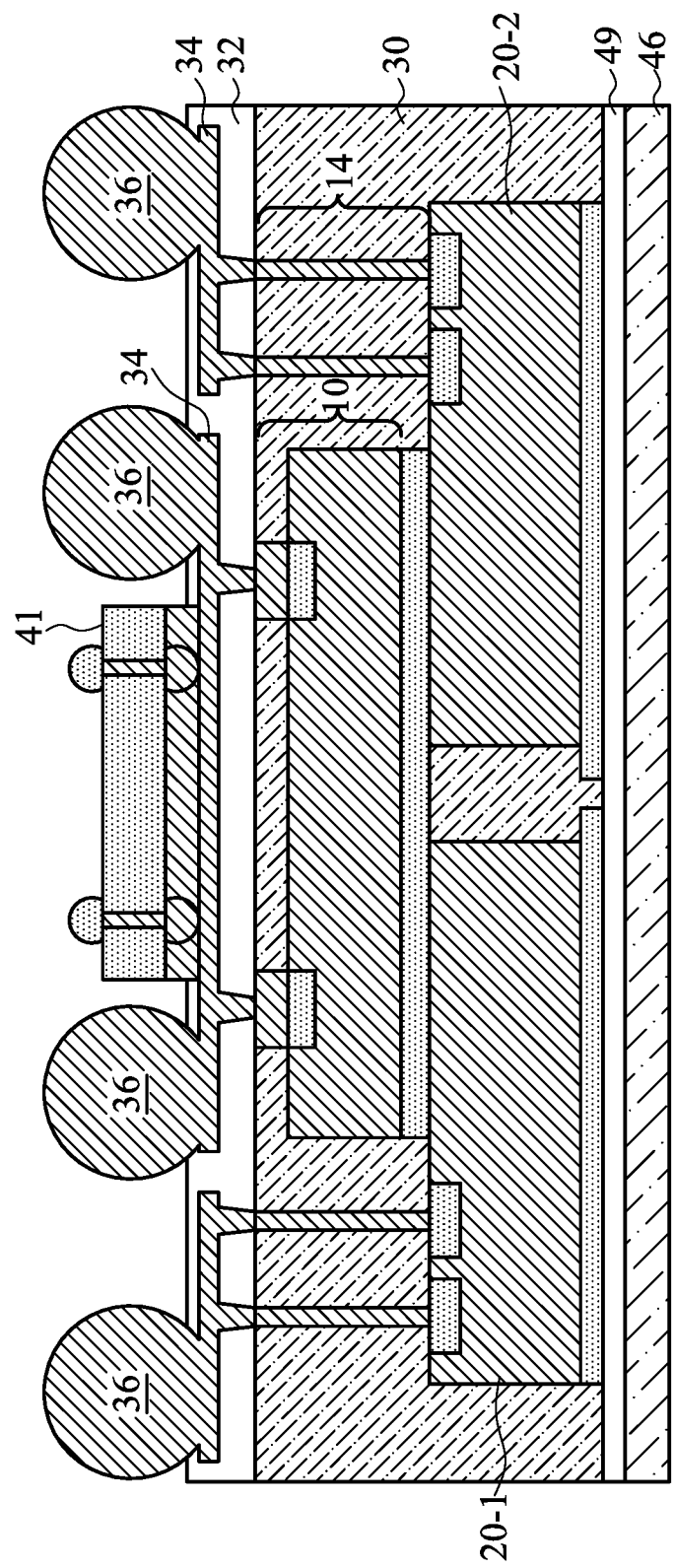

FIG. 3E illustrates the encapsulation of device dies 10 and 20 and through-vias 14 in encapsulating material 30, followed by a mechanical grinding, a Chemical Mechanical Polish (CMP) and/or a combination of both to expose metal pillars 52 and through-vias 14. In subsequent steps, dielectric layers 32 and RDLs 34 are formed, and RDLs 34 are electrically coupled to metal pillars 52 and through-vias 14, as shown in FIG. 3F. Next, device die 41 may be optionally bonded to RDLs 34 (FIG. 3G), and electrical connectors 36 are formed to connect to RDLs 34 (FIG. 3H). Device die 41 may include through-vias (sometimes referred to as through-silicon vias or through-substrate vias) penetrating through the semiconductor substrate in device die 41. An IPD may also be bonded to RDLs 34 in accordance with some embodiments. Electrical connectors 36 may include a solder ball grid array for bonding to a Printed Circuit Board (PCB). Electrical connectors 36 may also be a flip chip bump such as C4 solder bump, copper pillar bump, and the like for bonding to a package substrate (not shown). This configuration may apply to all embodiments throughout the present disclosure.

Figure 1I:
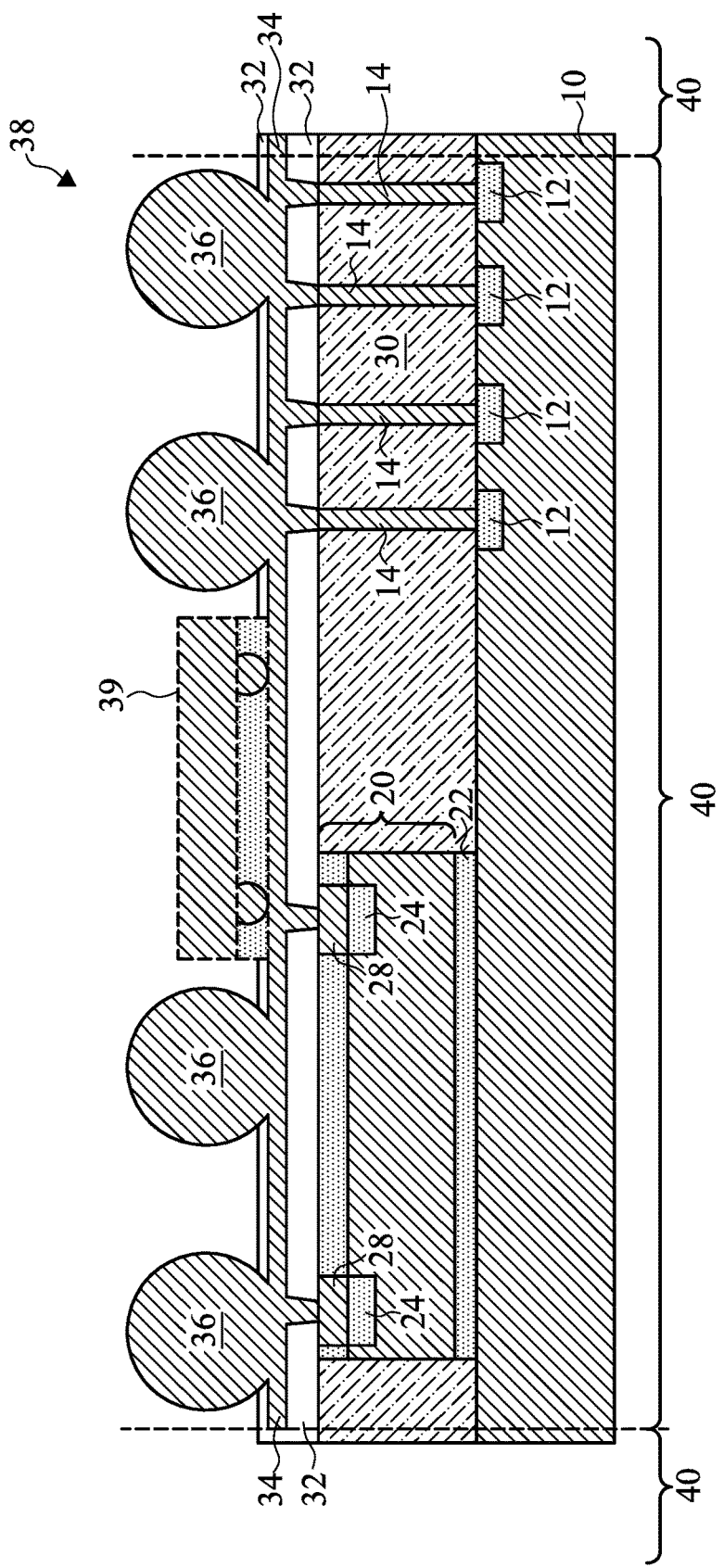
Figure 3I:
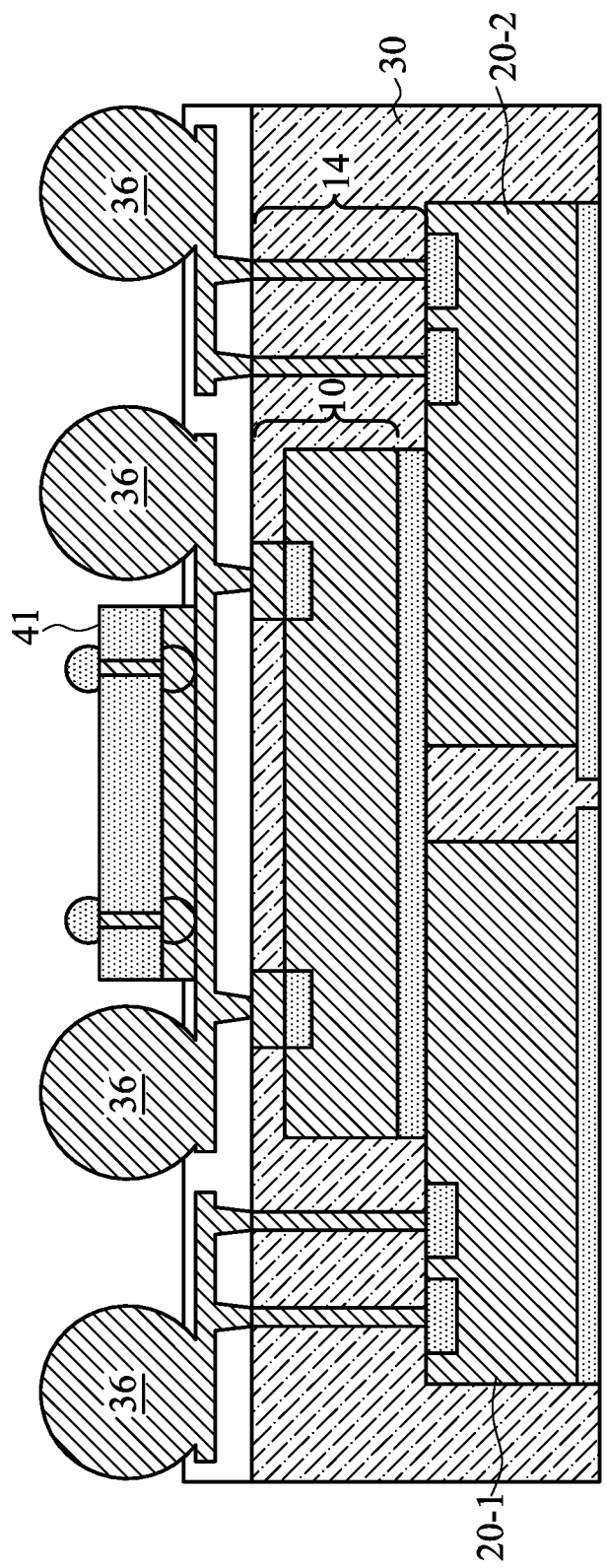
Figure 3J:
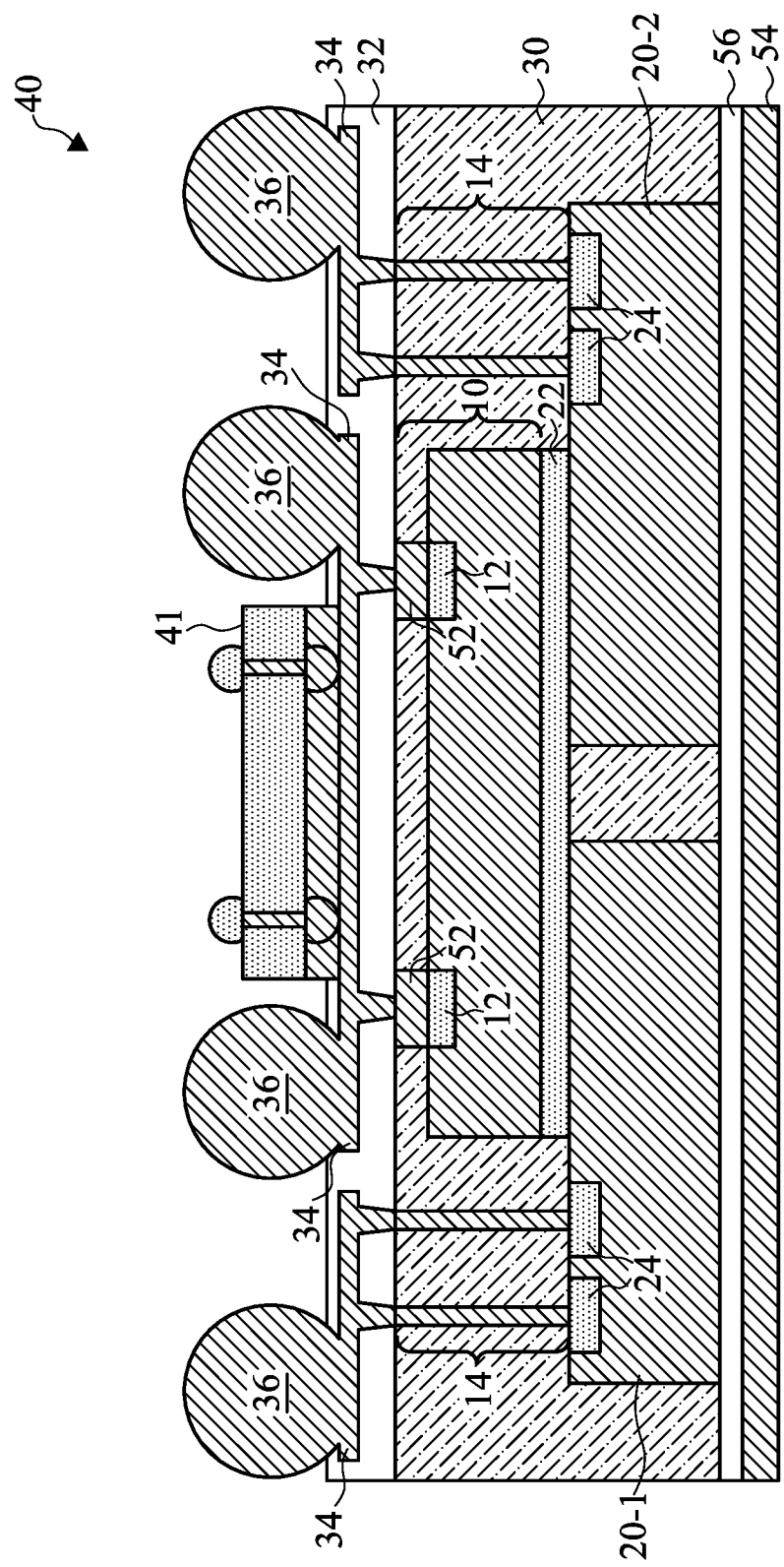

Carrier 46 is then de-bonded from the overlying structure, and the resulting structure is shown in FIG. 3I. In subsequent steps, device dies 20-1 and 20-2 are grinded from the backside, and DAFs 50 are removed through grinding. The resulting structure is shown in FIG. 3J. FIG. 3J further illustrates the attachment of lid 54 to device dies 20, for example, through Thermal Interface Material (TIM) 56. TIM 56 has thermal conductivity higher than the thermal conductivity of DAFs 22 (FIGS. 1I, 2I, and 3J). For example, the thermal conductivity of TIM 56 may be higher than about 1 W/m*K or even higher. Lid 54 may be formed of a material having good thermal conductivity. In accordance with some exemplary embodiments, lid 54 includes a metal such as aluminum, copper, an aluminum/copper alloy, stainless steel, or the like.

FIGS. 4A through 4J illustrate the formation of package 40 (FIG. 4J) in accordance with some embodiments. These embodiments are essentially the same as the embodiments shown in FIGS. 3A through 3J, except device die 10 does not have the metal pillars 52 (FIG. 3J) that are formed over metal pads 12. A brief discussion of the formation process is provided below. The details of these embodiments may be found in the embodiments in FIGS. 3A through 3J, and are not repeated herein.

Figure 4A:
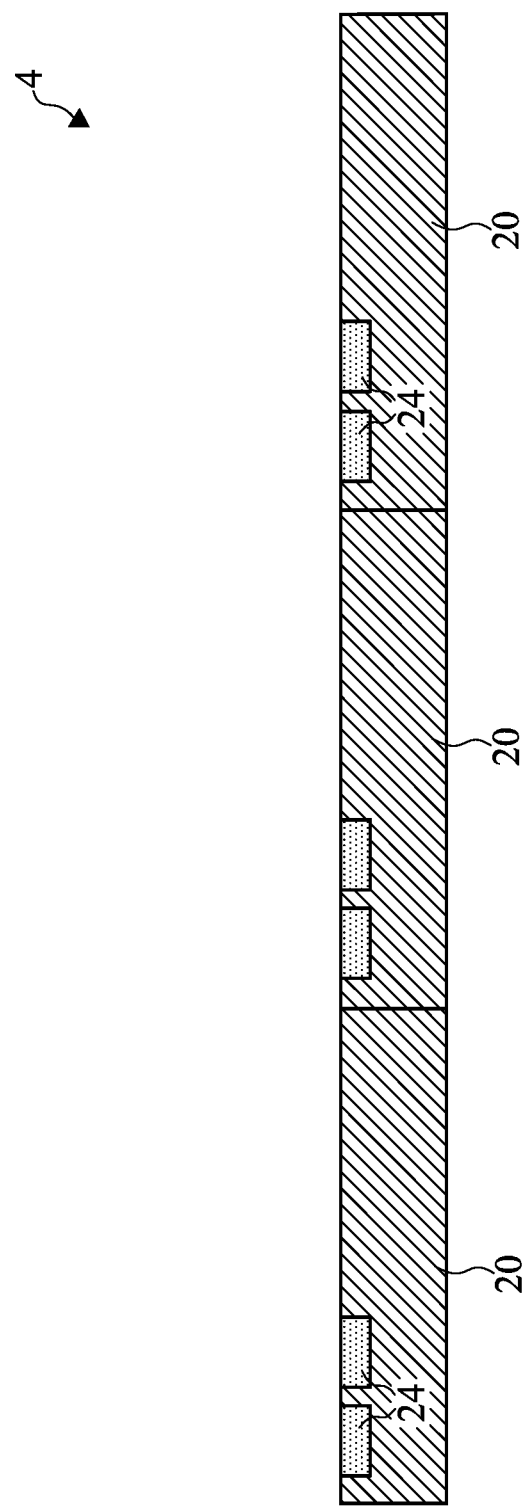
FIGS. 4A through 4J illustrate the cross-sectional views of intermediate stages in the formation of a fan-out package in accordance with some embodiments.
Figure 4B:
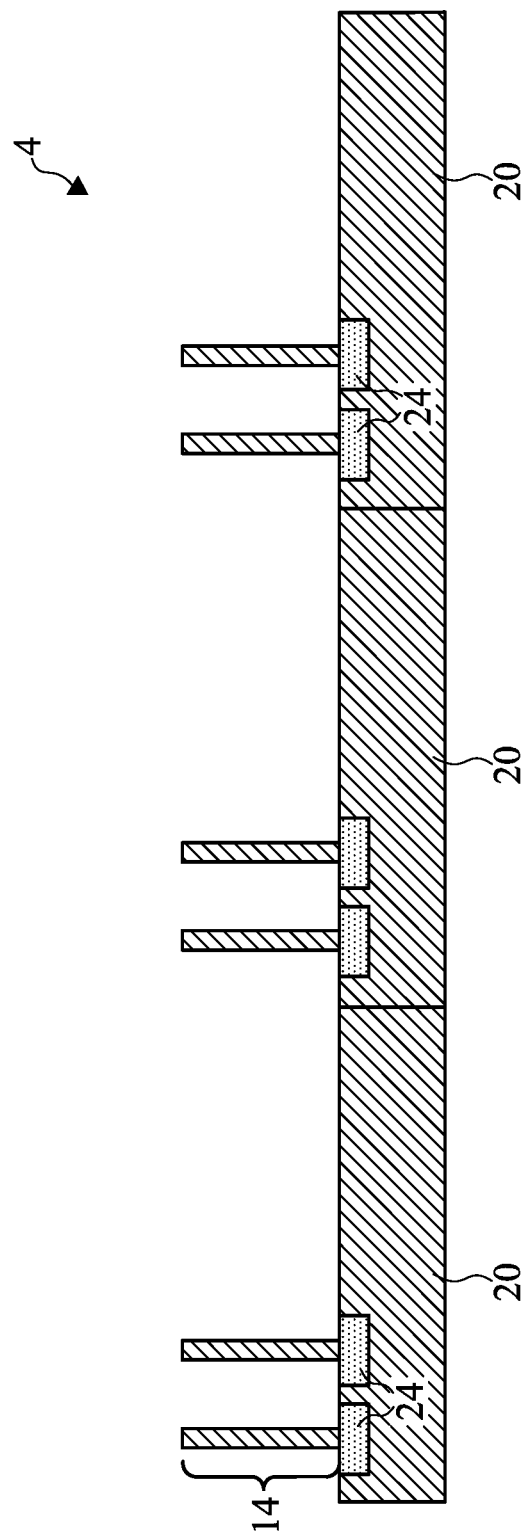
Figure 4C:
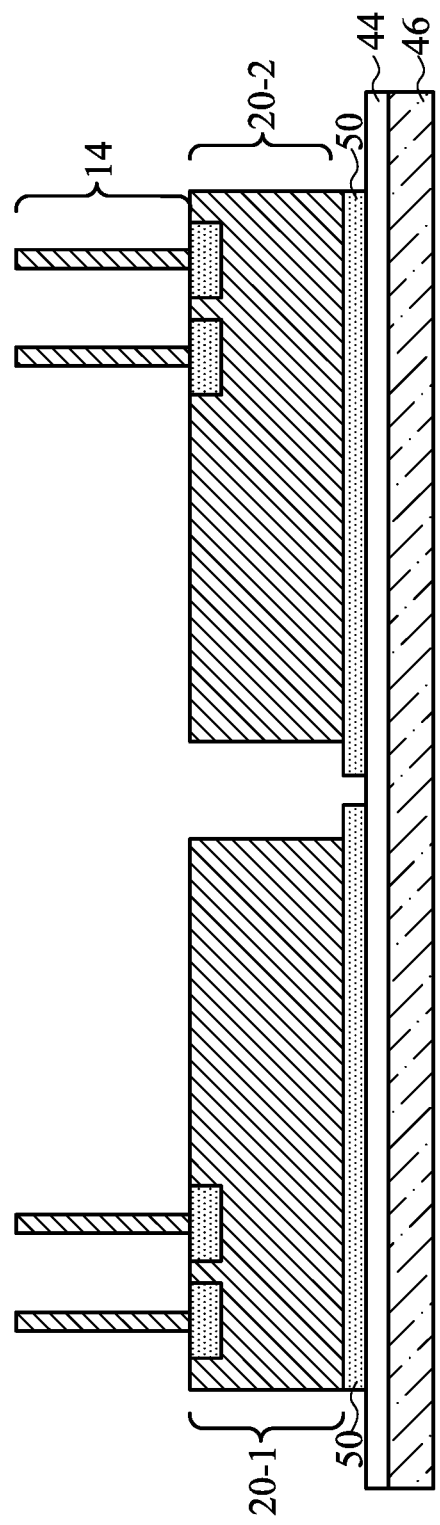
Figure 4D:
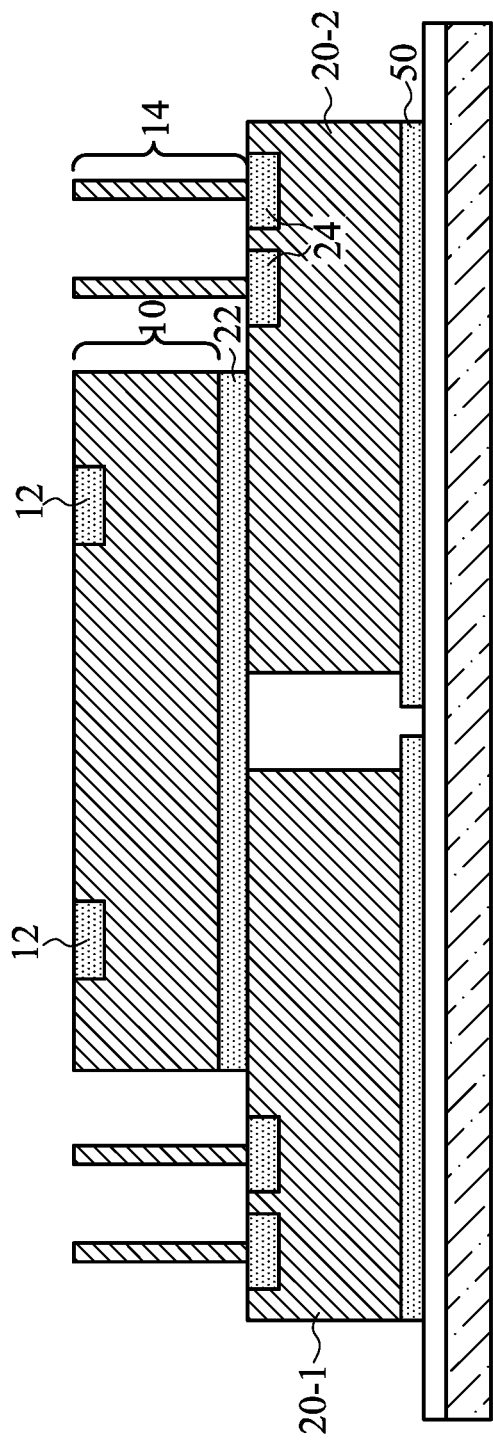

The steps shown in FIGS. 4A through 4C are essentially the same as the steps shown in FIGS. 3A through 3C. Next, as shown in FIG. 4D, device die 10 is adhered to device dies 20 (including 20-1 and 20-2). Device die 10 includes metal pads 12 as the top surface conductive features, and no metal pillars are formed over metal pads 12. Device 10 is also placed between the through-vias 14 directly over device die 20-1 and the through-vias 14 directly over device die 20-2.

Figure 4E:
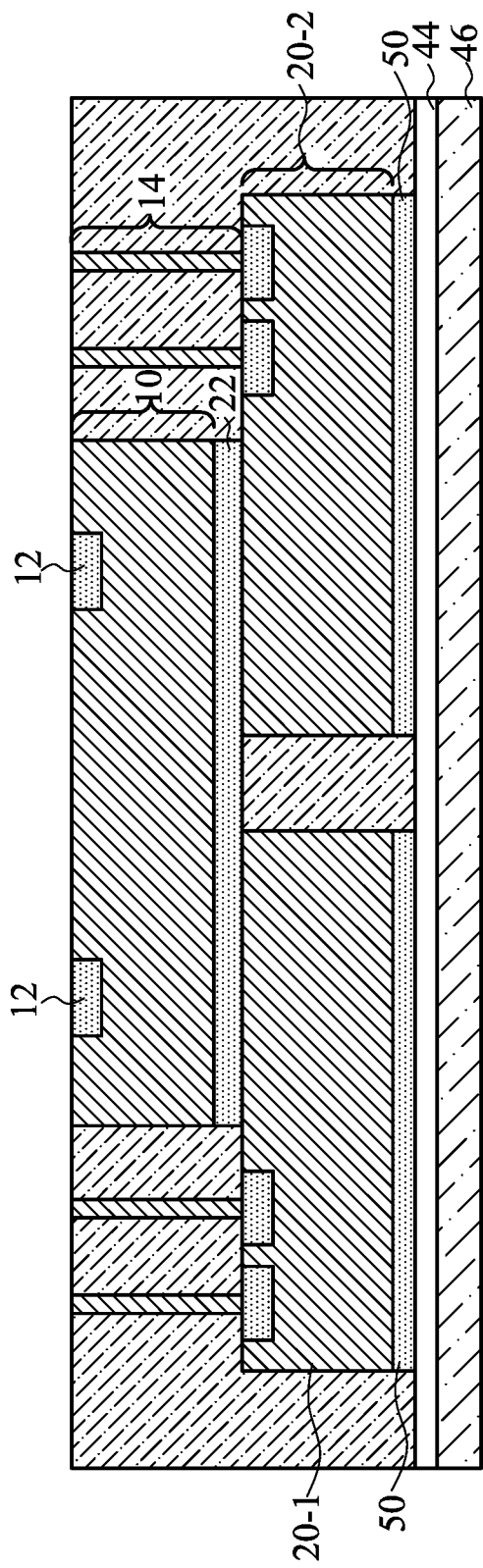
Figure 4F:
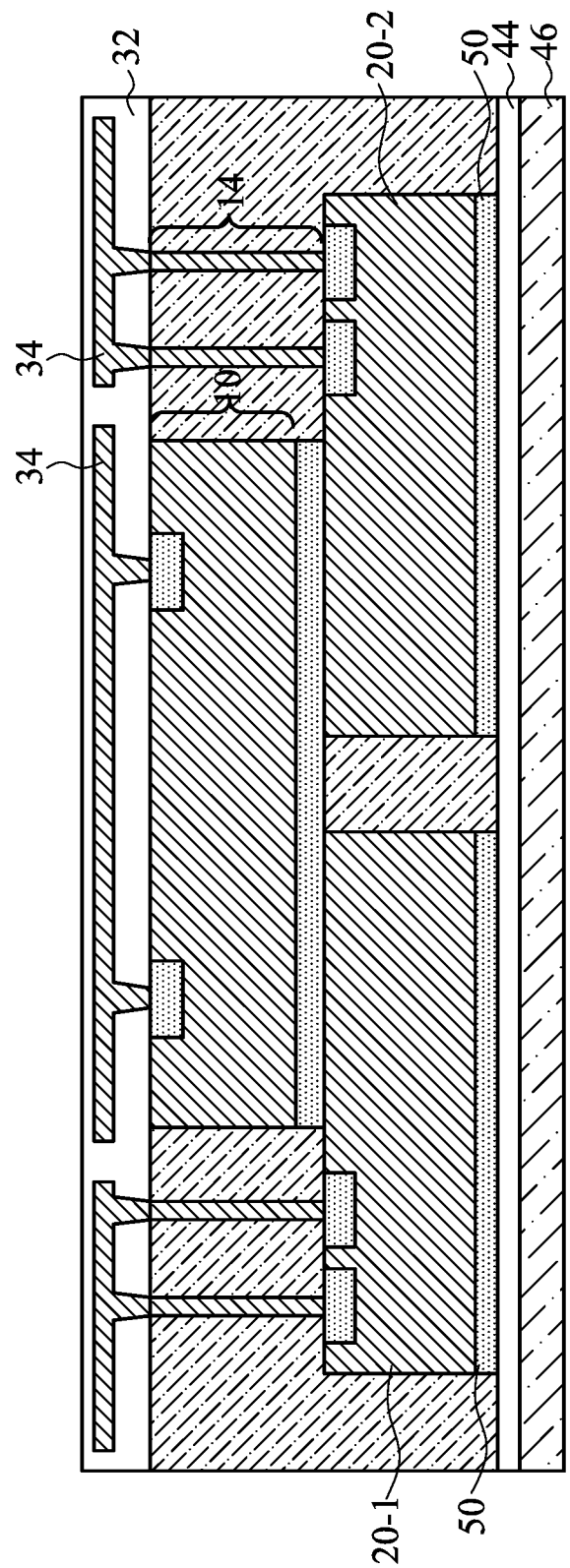
Figure 4G:
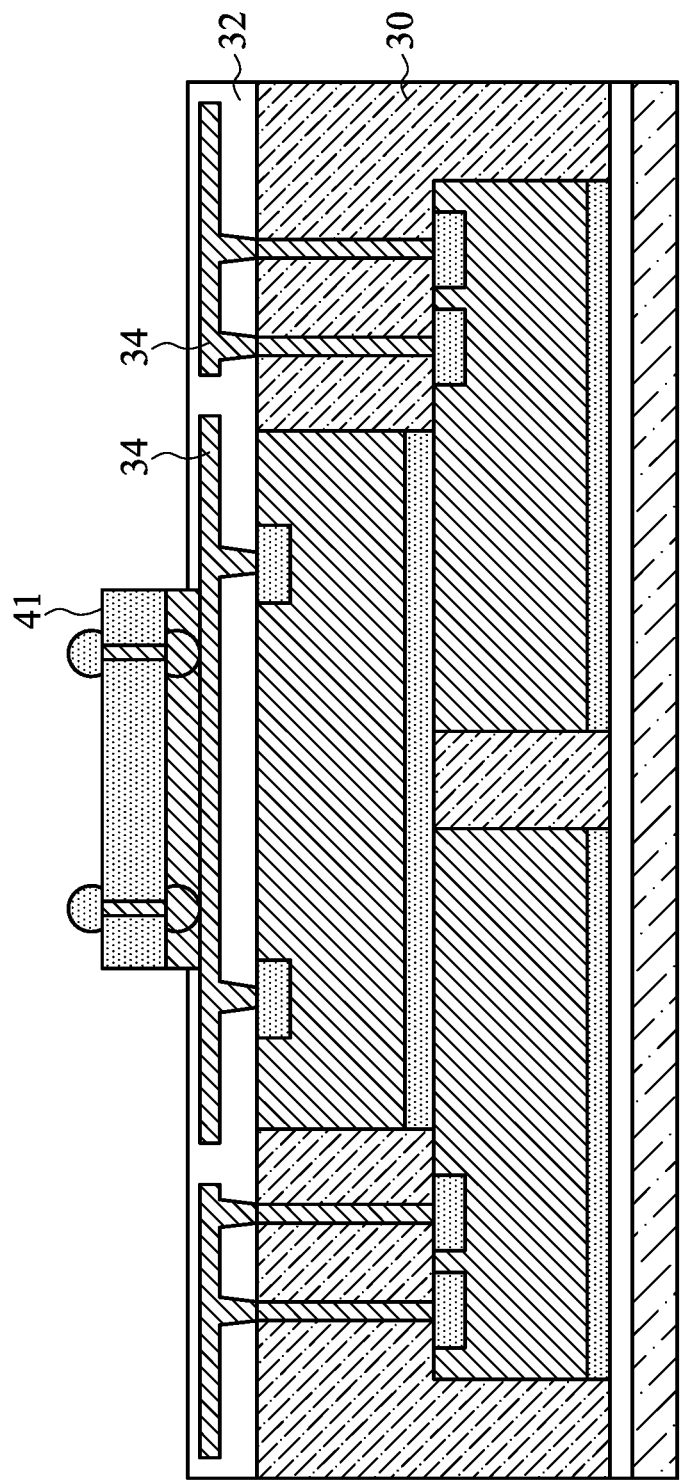
Figure 4H:
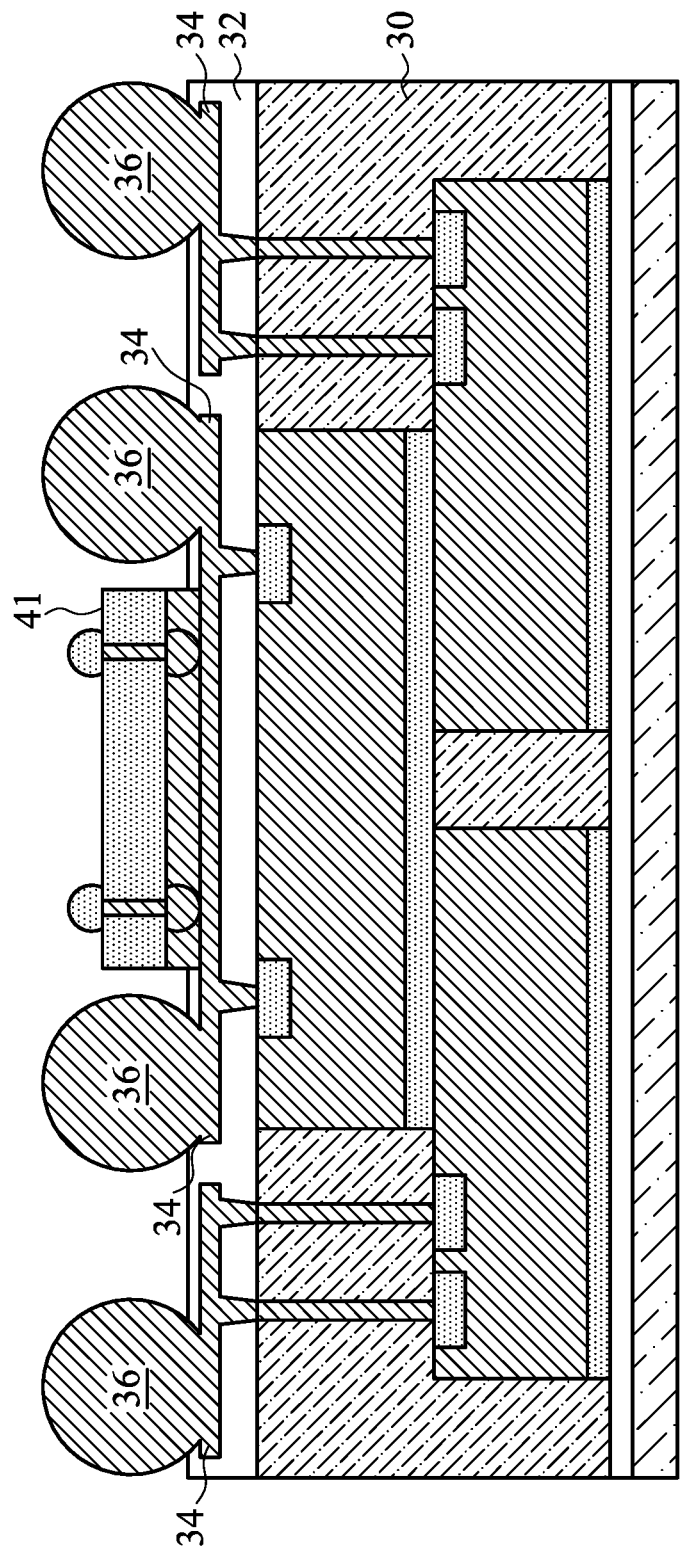
Figure 4I:
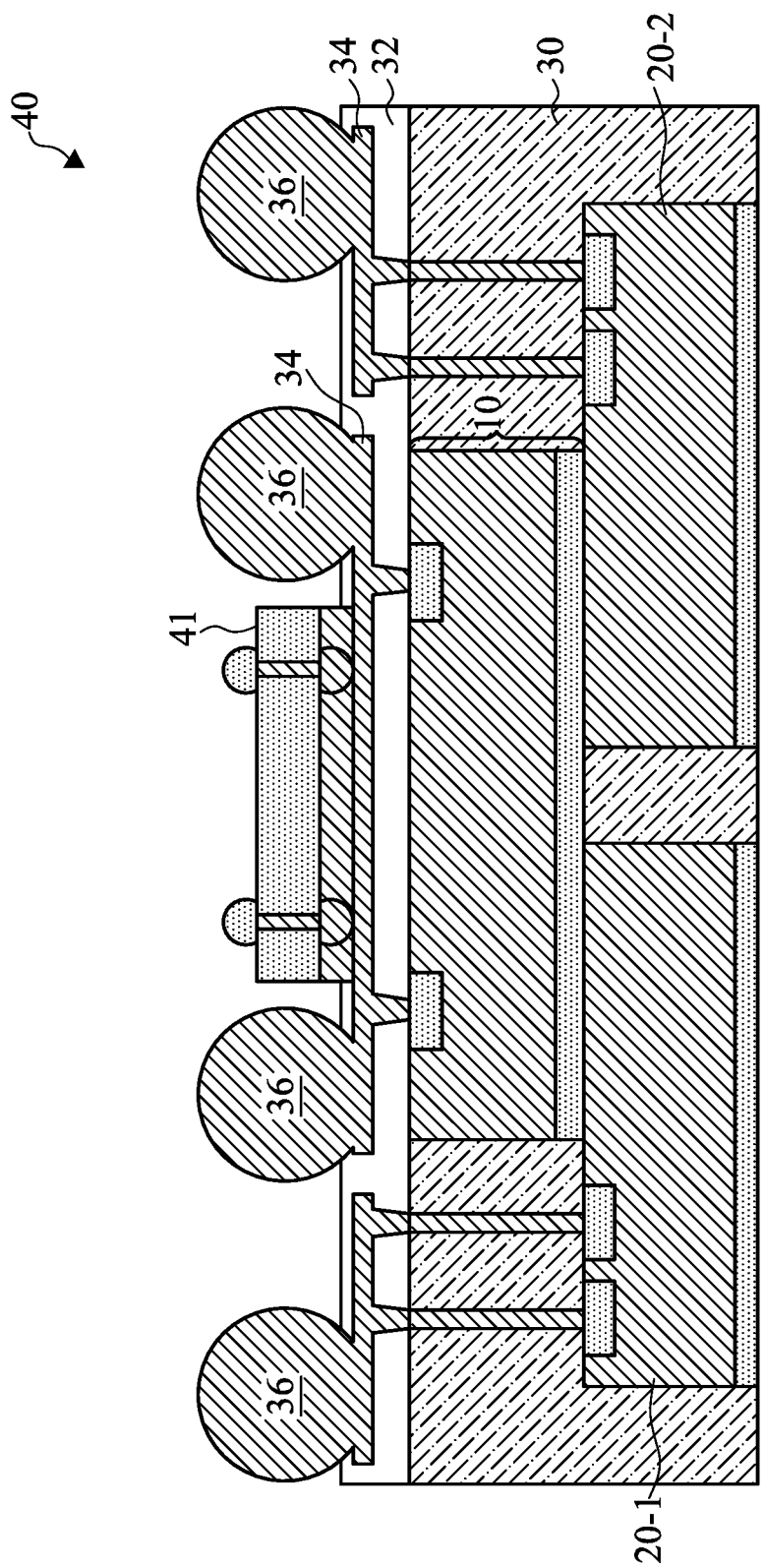
Figure 4J:
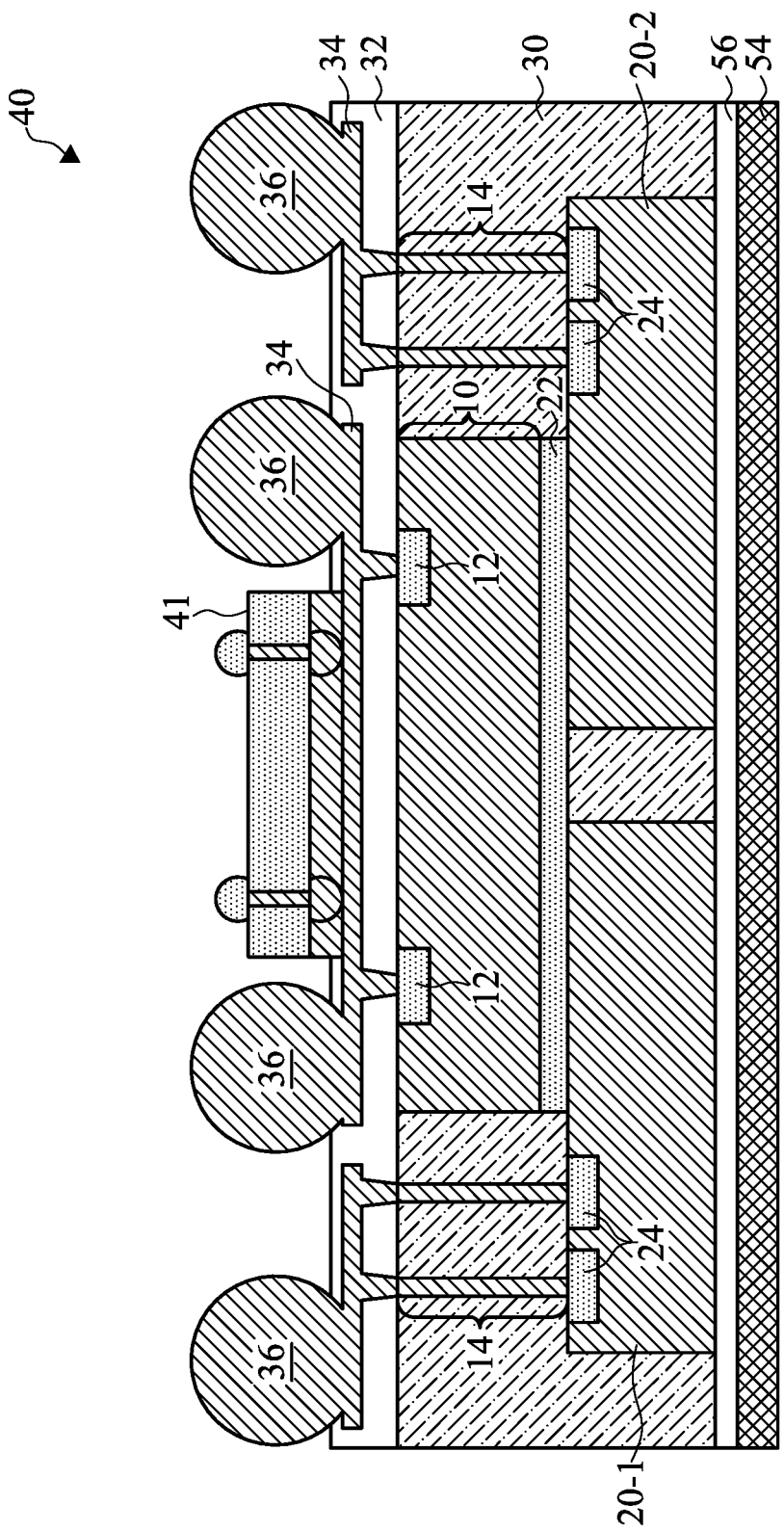

FIG. 4E illustrates the direct formation of encapsulating material 30 while exposing metal pads 12 and through-vias 14 without planarization. The process steps shown in FIGS. 4F through 4J are essentially the same as the process steps shown in FIGS. 3F through 3J, and the details are not repeated herein.

Figure 5:
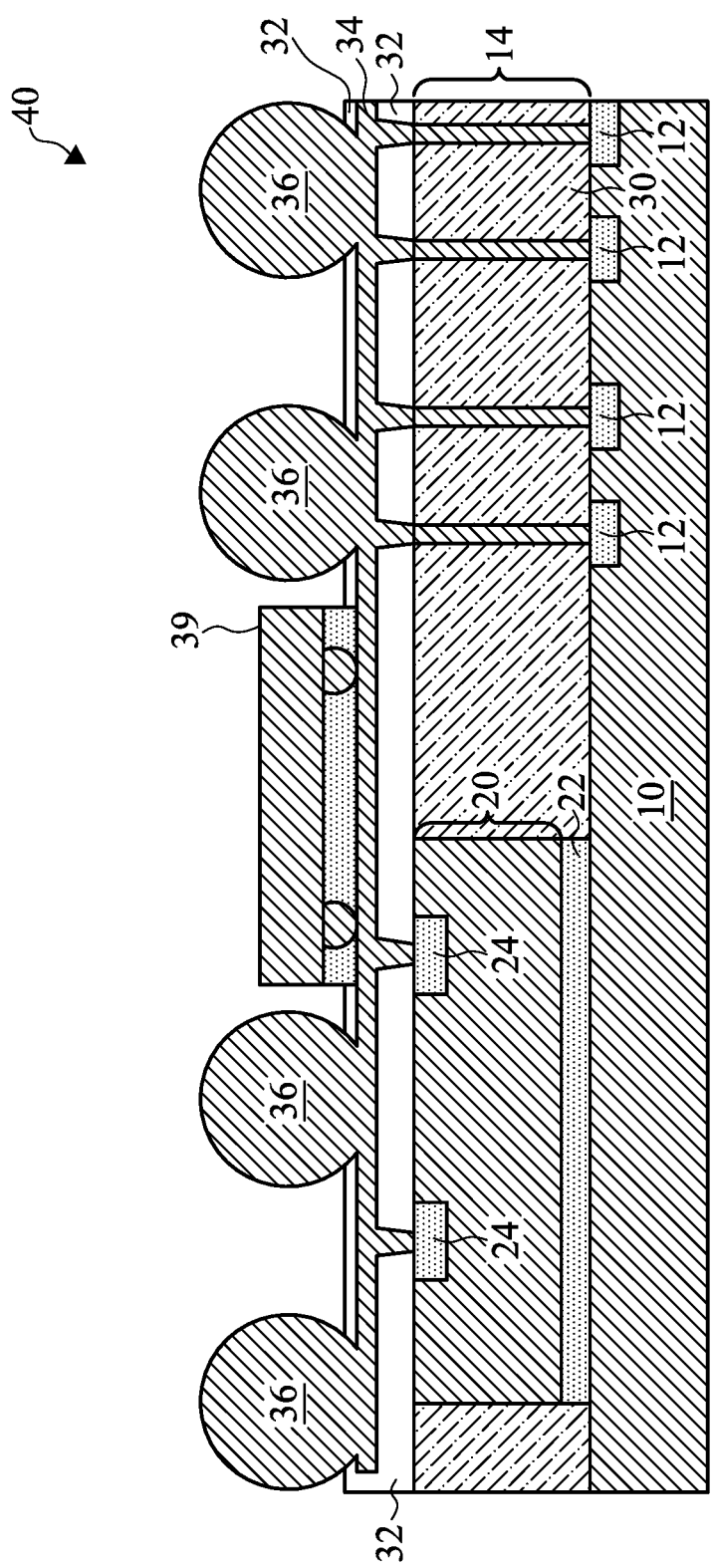
FIGS. 5 through 10 illustrate the cross-sectional views of fan-out packages in accordance with some embodiments.

FIGS. 5 through 10 illustrate the packages formed in accordance with some embodiments of the present disclosure. The formation process may be understood from the embodiments in FIGS. 1A through 4J. The package 40 shown in FIG. 5 is similar to the package shown in FIG. 1I, except in FIG. 5, no metal pillars are formed, and metal pads 24 are the top conductive features of die 20. RDLs 34 include vias that are in physical contact with metal pads 24.

Figure 6:
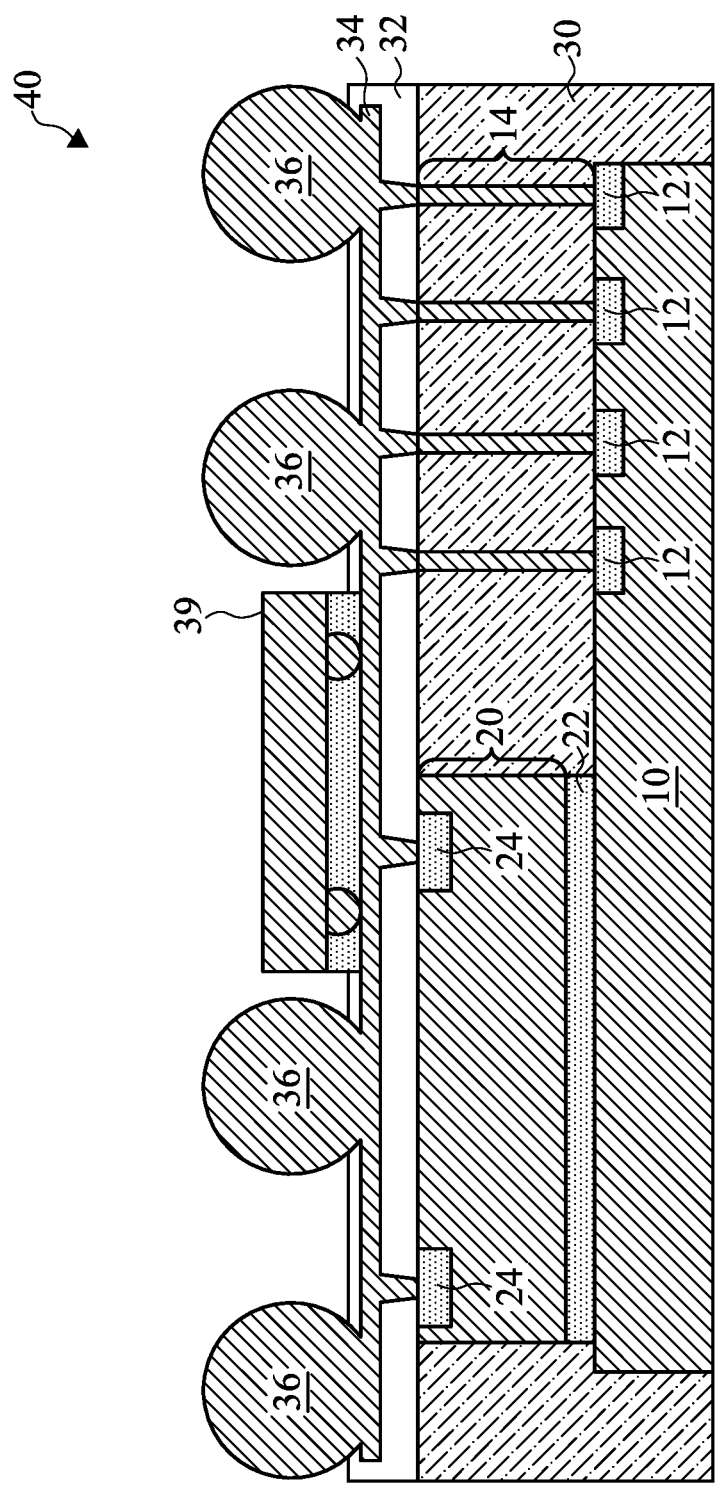

The package 40 shown in FIG. 6 is similar to the package shown in FIG. 2I, except in FIG. 6, no metal pillars are formed, and metal pads 24 are the top conductive features of die 20. RDLs 34 include vias that are in physical contact with metal pads 24.

Figure 7:
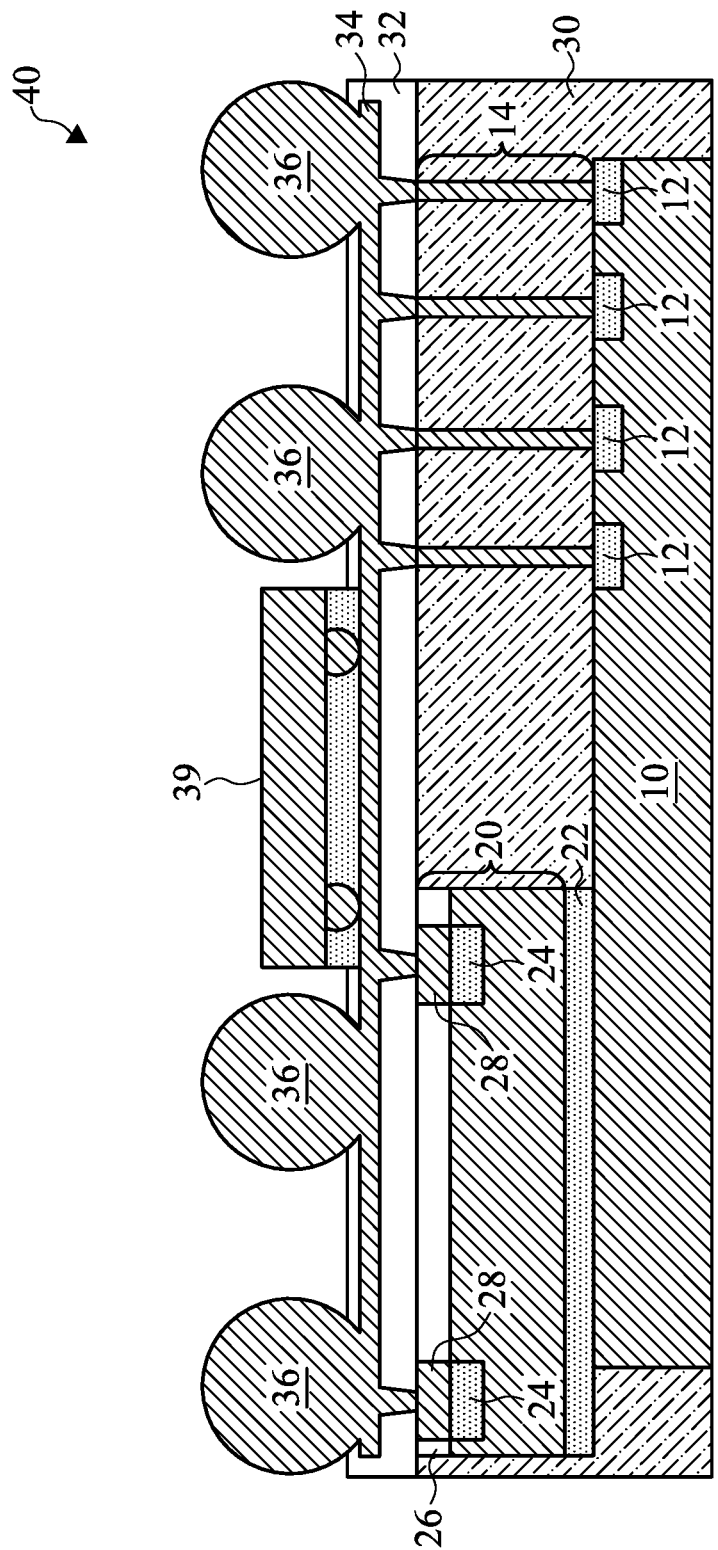
Figure 8:
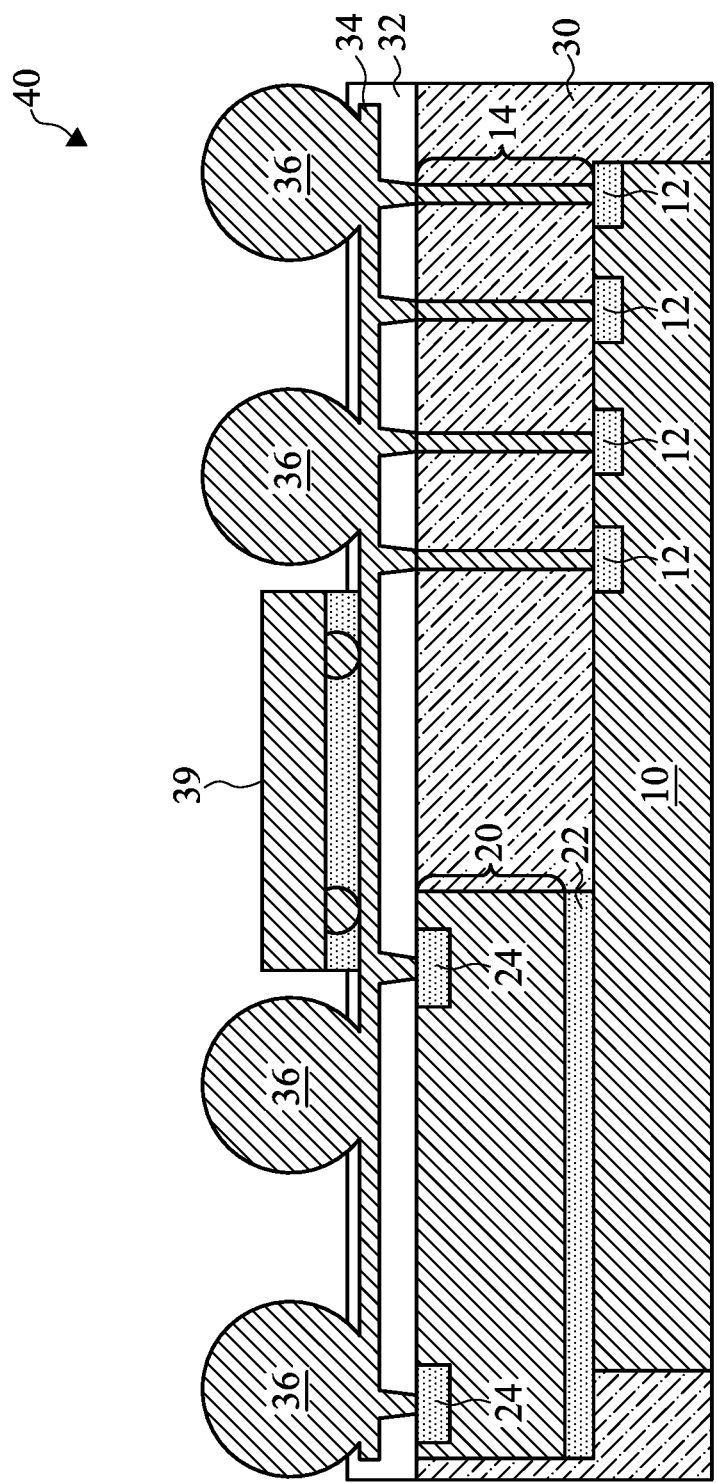

FIG. 7 illustrates package 40, which is similar to the package 40 in FIG. 2I, except device die 20 is partially offset from device die 10. With the partial offset, a first portion of device die 20 overlaps a portion of encapsulating material 30, and does not overlap any portion of device die 10. A second portion of device die 20 overlaps a portion of device die 10. The first portion of device die 20 is thus suspended with no underlying support of device die 10. The partial offset of device die 20 relative to device die 10 advantageously reduces the overlap area of device dies 10 and 20. Accordingly, an increased percentage of the top surface area of device die 10 can be used for forming metal pads 12 and through-vias 14, rather than being overlapped by device die 20. The offset of device die 20 from device die 10, however, does not result in the undesirable increase in the form factor (the top-view area) of package 40 in accordance with some embodiments. For example, when the top-view area of package 40 is determined by the area required to fit all electrical connectors 36, as long as the total footprint area of device dies 10 and 20 does not exceed the area required to fit all electrical connectors 36, the partial offset of device die 20 from device die 10 will not cause the increase in the form factor (the top view area). FIG. 8 illustrates package 40 similar to what is shown in FIG. 7, except no metal pillars are formed over metal pads 24.

Figure 9:
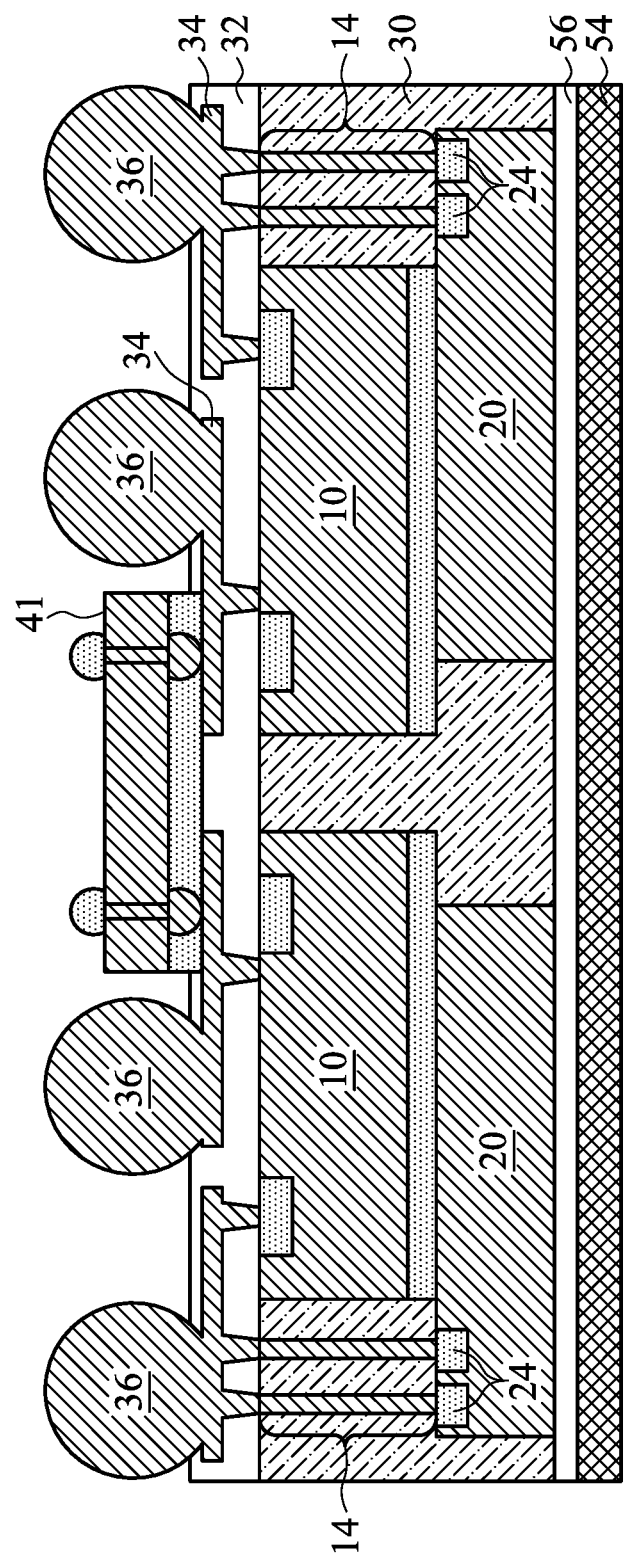

FIG. 9 illustrates package 40 in accordance with some embodiments, wherein there are two device dies 10 and two device dies 20 partially offset from the respective device dies 10. Each device die 10 has a first portion overlapping a portion of a respective underlying device die 20, and a second portion offset from the respective underlying device die 20. Through-vias 14 are formed directly on metal pads 24 of each of device dies 20.

Figure 10:
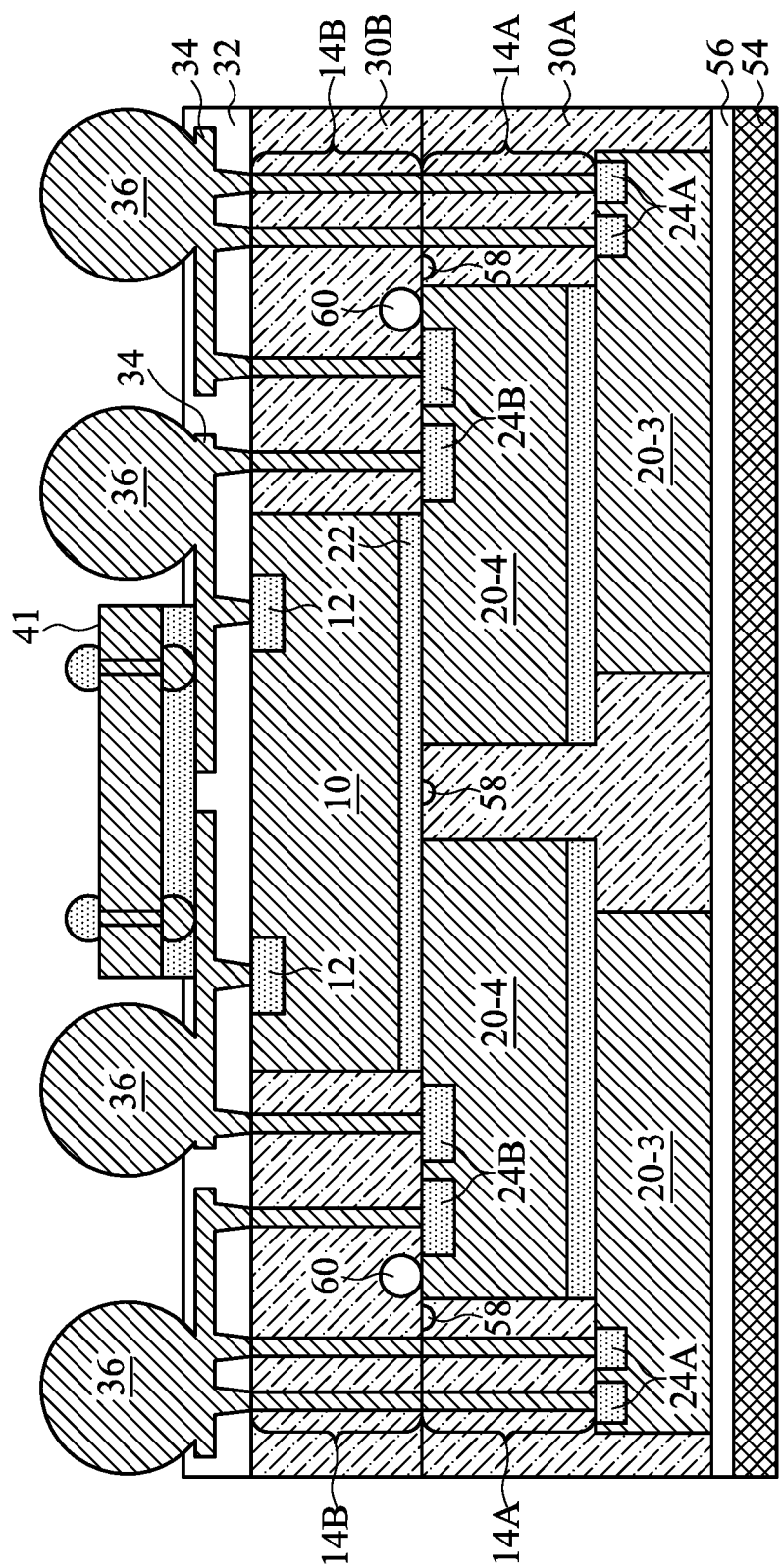

FIG. 10 illustrates package 40 in accordance with some embodiments, wherein there are four device dies 20 (including 20-3 and 20-4), and one device die 10. The four device dies 20 includes two higher-level device dies 20-4, and two lower-level device dies 20-3 underlying the higher-level device dies 20-4. Each of the higher-level device dies 20-4 has a first portion overlapping a portion of the respective underlying lower-level device die 20-3, and a second portion offset from the respective underlying lower-level device die 20-3. Four device dies 20 are encapsulated in a first encapsulating material 30A in a first encapsulating process.

Device die 10 is over higher-level device dies 20-4, and is encapsulated in a second encapsulating material 30B in a second encapsulating process. Device die 10 is partially offset from both higher-level device dies 20-4. For example, device die 10 has first portions overlapping portions of higher-level device die 20-4, and a second portion overlapping the gap between higher-level device die 20-4.

Encapsulating materials 30A and 30B may be the same as each other or different from each other. Through-vias 14A are formed directly on metal pads 24A of lower-level device dies 20-3. Some of through-vias 14B are formed directly on metal pads 24B of higher-level device dies 20-4. The interface of encapsulating materials 30A and 30B may be distinguishable from each other due to the CMP performed on the top surface of encapsulating material 30A, which causes some of the sphere-shaped fillers 58 in encapsulating material 30A to be grinded to have planar (rather than spherical) top surfaces. On the other hand, the sphere-shaped fillers 60 that are in encapsulating material 30B and in contact with encapsulating material 30A remain to have rounded shapes. Furthermore, due to the nature of the formation process of through-vias 14A and 14B, each of through-vias 14A and 14B may have a top width greater than the respective bottom width. The transition of through-vias 14B to the respective underlying through-vias 14A will also show discontinuity, and the top widths of through-vias 14A may be greater than the bottom widths of the respective overlying through-vias 14B.

In FIGS. 9 and 10, the partial offset of higher-level die(s) from the lower-level dies results in the advantageous increase in the surface area of the lower-level dies 20-3 that can be used for forming metal pads and through-vias. On the other hand, since the lower-level dies 20-3 occupy the majority top-view area of package 40, the warpage of package 40 is not severe.

Figure 13C:
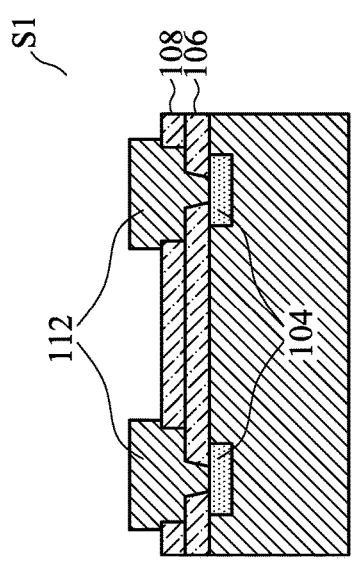

FIGS. 13A, 13B, and 13C illustrate the structures of top conductive features in device dies in accordance with some embodiments of the present disclosure. Referring to FIG. 13A, device die S1 is illustrated. In accordance with some embodiments, device die S1 is a logic die, which may be a GPU die, a CPU die, a GPU-CPU combo function die, a MCU die, an IO die, a BB die, or an AP die. Although not shown, device die S1 may include a semiconductor substrate, which may be a silicon substrate in accordance with some embodiments, wherein active devices (not shown) such as transistors and/or diodes are formed at a top surface of the semiconductor substrate. Furthermore, metal lines and vias (not shown) are formed in an interconnect structure (not shown), which is over the semiconductor substrate to interconnect the integrated circuit devices in device die S1.

Metal pads 104 are formed in device die S1. In accordance with some embodiments of the present disclosure, metal pads 104 are aluminum pads, which may also include some copper therein. Metal pads 104 are electrically coupled to the integrated circuit devices such as active devices in device die S1.

Passivation layer 106 is formed to have some portions covering the edge portions of metal pads 104. The central portions of metal pads 104 are exposed through the openings in passivation layer 106. Passivation layer 106 may be a single layer or a composite layer, and may be formed of a non-porous material. In accordance with some embodiments of the present disclosure, passivation layer 106 is a composite layer comprising a silicon oxide layer (not shown), and a silicon nitride layer (not shown) over the silicon oxide layer. Passivation layer 106 may also be formed of other non-porous dielectric materials such as Un-doped Silicate Glass (USG), silicon oxynitride, and/or the like.

Dielectric layer 108 is formed over passivation layer 106. Dielectric layer 108 may be a polymer layer formed of a polymer such as polyimide, PBO, BCB, or the like. The formation methods may include spin coating, for example. Dielectric layer 108 may be dispensed in a liquid form, and then cured. Over dielectric layer 108 may reside dielectric layer 110, which may be formed of a material selected from the same candidate materials for forming dielectric layer 108, which may include polyimide, PBO, BCB, or the like. In accordance with some embodiments, dielectric layers 108 and 110 are formed of different materials. For example, dielectric material 108 may be formed of polyimide, and dielectric layer 110 may be formed of PBO.

Conductive posts 112 are formed over and connected to metal pads 104. Conductive posts 112 are sometimes referred to as metal pillars or metal posts. In accordance with some embodiments, conductive posts 112 are formed of metallic materials such as copper, nickel, gold, alloys thereof, or multi-layers thereof. Conductive posts 112 extend into dielectric layers 106, 108, and 110. In accordance with some embodiments, the top surface of dielectric layer 110 is coplanar with the top surfaces of metal posts 112. In accordance with other embodiments, dielectric layer 110 includes portions covering metal posts 112. The portions of dielectric layer 110 covering metal posts 112 may be removed in the grinding process after device die S1 is molded, as will be discussed in subsequent processes.

FIG. 13B schematically illustrates the structures of the top conductive features in device die S1 in accordance with alternative embodiments. In these embodiments, the top features of device die S1 include metal pads 104 and passivation layer 106, wherein the center portions of metal pads 104 are exposed. No metal posts are formed over metal pads 104. Rather, the subsequent formed RDLs are directly connected to metal pads 104.

FIG. 13C schematically illustrates the structures of the top conductive features in device die S1 in accordance with alternative embodiments. Device die S1 in accordance with these embodiments are similar to that is shown in FIG. 13A, except dielectric layer 110 in FIG. 13A is omitted in FIG. 13C. Accordingly, dielectric layer 108, which is the top dielectric layer in device die S1, has a top surface lower than the top surfaces of metal posts 112.

Figure 14:
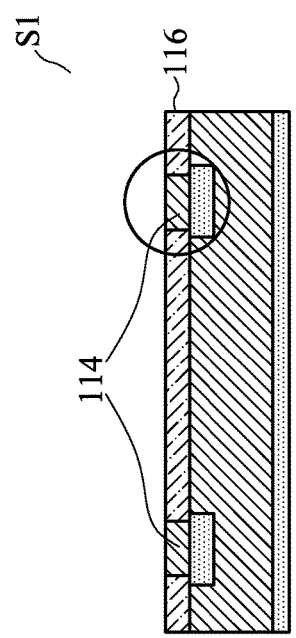
FIG. 14 illustrates an exemplary notation representing the structures shown in FIGS. 13A through 13C in accordance with some embodiments.

FIG. 14 illustrates a symbolic view of device die S1. Throughout the description, when the device die S1 as shown in FIG. 14 is illustrated, the illustrated device die S1 may actually have the structure as shown in any of FIG. 13A, 13B, or 13C. For example, the illustrated conductive features 114 in device die S1 may represent the metal posts 112 in FIG. 13A or 13C, or the metal pads 114 in FIG. 13B. Furthermore, the illustrated dielectric layer 116 in FIG. 14 may represent dielectric layers 106, 108, and 110 in FIG. 13A, dielectric layer 106 in FIG. 13B, or dielectric layers 106 and 108 in FIG. 13C.

Figure 15C:
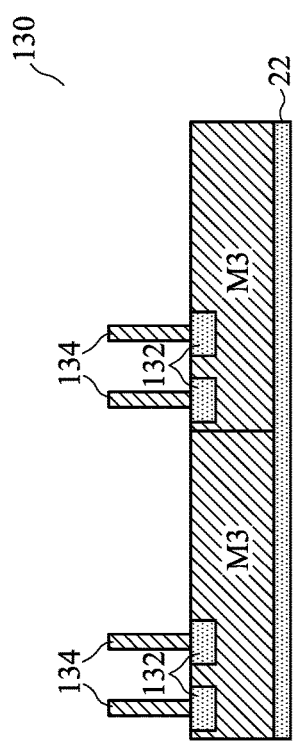

FIGS. 15A through 15J illustrate the cross-sectional views of intermediate stages in the formation of a fan-out package in accordance with some embodiments. Referring to FIG. 15A, wafer 120 is formed. Wafer 120 includes a plurality of device dies M1 therein. In accordance with some embodiments of the present disclosure, device dies M1 are logic dies including logic circuits, memory dies, analog dies, sensor dies, or the like. For example, when device dies M1 are memory dies, device dies M1 may be Flash memory dies, SRAM memory dies, low power DDR dies, or the like. Although not shown, device dies M1 may include semiconductor substrates, wherein active devices such as transistors and/or diodes are formed at the top surfaces of the semiconductor substrates. Furthermore, metal lines and vias (not shown) are formed in the interconnect structures of device dies M1 to interconnect the integrated circuit devices in the respective device dies M1. The back surfaces of device dies M1 may also be the back surfaces of the semiconductor substrates in the respective device dies M1. Furthermore, the back surfaces of device dies M1 are adhered to DAFs 22.

Metal pads 122 are formed at the top surfaces (front surfaces) of device dies M1. Metal pads 122 may be aluminum pads, copper pads, aluminum copper pads, or the like. In each of device dies M1, metal pads 122 may be offset from the centers of the respective device dies M1. For example, metal pads 122 may be formed in the illustrated left sides of the respective device dies M1, and the right sides of device dies M1 have no metal pads formed therein.

Figure 19:
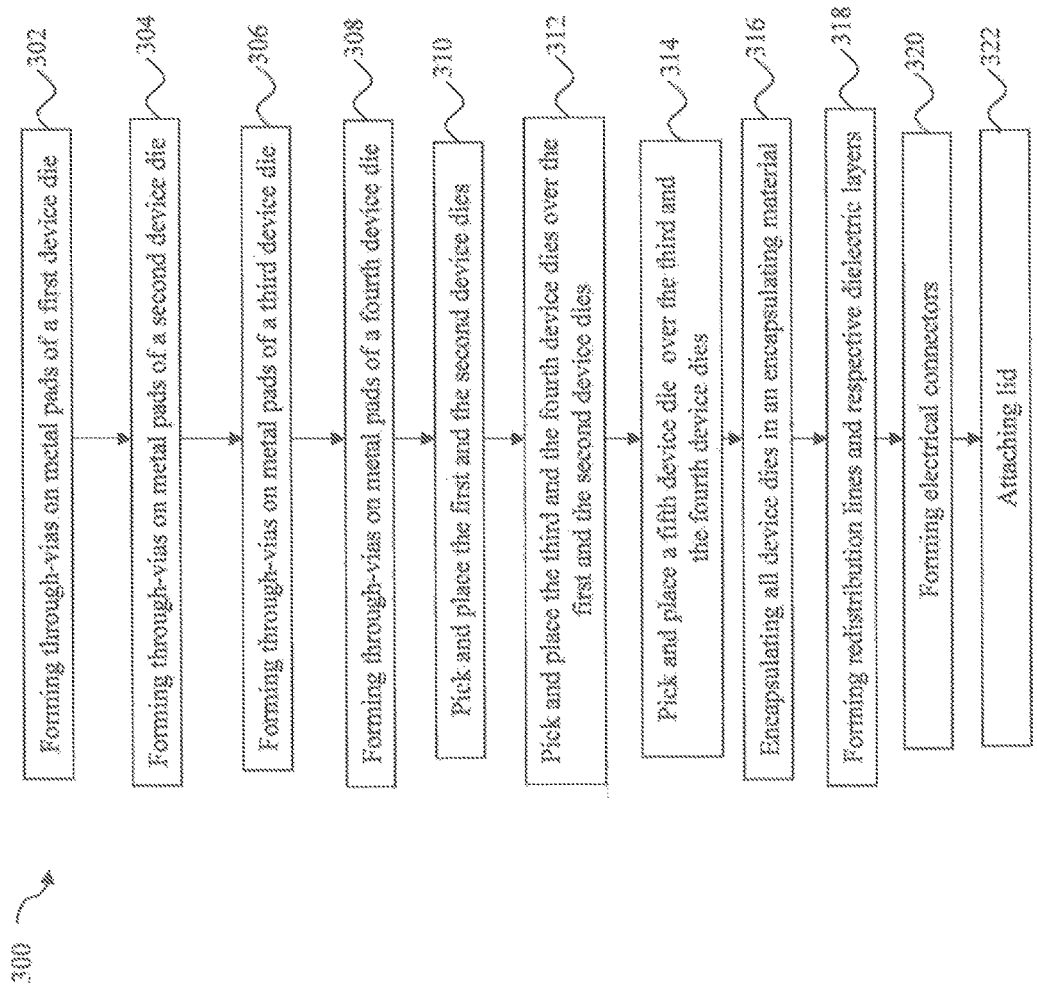
FIG. 19 illustrates a process flow for forming a fan-out package using a single molding process in accordance with some embodiments.

Through-vias 124 are formed on the top surfaces of device dies M1. The respective step is illustrated as step 302 in the process flow 300 shown in FIG. 19. In accordance with some embodiments of the present disclosure, through-vias 124 are formed using similar methods as illustrated in FIGS. 1B and 1C. Furthermore, the material of through-vias 124 may be selected from the same candidate materials for forming through-vias 14 in FIG. 1C. The details are thus not repeated herein. Since Through-vias 124 are formed in a single formation process (such as plating), with each for through-vias 124 formed in a single opening (similar to opening 15 in FIG. 1B), there is no visible interface between the upper portions and the respective lower portions of through-vias 124. Furthermore, the edges of each of through-vias 124 may be substantially straight, with no abrupt changes in the tilt angle of the edges. The side profile of through-vias 124 may be vertical and/or tapered, and the top view cross-section shape of through-vias 124 may be circular and/or non-circular such as oval, hexagon, octagon, and the like. For simplification, the features discussed for through-vias 124 may apply to all other through-vias through out the present disclosure.

In accordance with some embodiments of the present disclosure, through-vias 124 are formed directly on metal pads 122. Accordingly, seed layer may be or may not be used in the formation of through-vias 124, and the materials of through-vias 124 are homogenous. In accordance with alternative embodiments, RDLs (not shown) may be formed close to the top surfaces of device dies M1, wherein the RDLs are used to reroute electrical connections, for example, to the left sides of the respective device dies M1. Through-vias 124 are then formed on the top of the RDLs. In a subsequent step, device dies M1 are singulated from wafer 120 as discrete device dies.

FIG. 15B illustrates the formation of wafer 128, which includes device dies M2 therein. In accordance with some embodiments, device dies M1 and M2 are same type of device dies. For example, device dies M1 and M2 may both be SRAM dies. Furthermore, device dies M1 and M2 may have identical structures in the bottom parts. For example, the structures and the layouts of device dies M1 and M2 including low-k dielectric layers (not shown), the metal lines and vias (not shown) in the low-k dielectric layers, the transistors and memory devices (not shown) may be identical to each other. The top routing portions of device dies M1 may be different from that of device dies M2, so that the electrical connections of device dies M2 are routed to the right sides of the respective device dies M2, which is opposite to device dies M1.

The backsides of device dies M2 may also be adhered to DAFs 22. Device dies M2 also have metal pads 122 formed therein. Through-vias 124 are formed over metal pads 122, for example, through plating. The respective step is illustrated as step 304 in the process flow 300 shown in FIG. 19. The materials and the formation process of metal pads 122 and through-vias 124 may be found referring to the discussion of FIG. 15A, and hence are not repeated herein. Device dies M2 are then singulated from wafer 128 as discrete device dies.

Referring to FIG. 15C, wafer 130 is formed. Wafer 130 includes a plurality of device dies M3 therein. In accordance with some embodiments of the present disclosure, device dies M3 are logic dies including logic circuits, memory dies, analog dies, sensor dies, or the like. When device dies M3 are memory dies, device dies M3 may be Flash memory dies, SRAM memory dies, low power DDR dies, or the like. In addition, device dies M3 may have structures the same as or different from that of device dies M1 and/or M2.

Metal pads 132 are formed at the top surfaces (front surfaces) of device dies M3, and may be aluminum pads, copper pads, aluminum copper pads, or the like. Similar to device dies M1, metal pads 132 may also be offset from the center of the respective device dies M3. For example, metal pads 132 may be formed in the illustrated left sides of the respective device dies M3, and the right sides of device dies M3 have no metal pads formed therein.

Through-vias 134 are formed on the top surfaces of device dies M3, and may be formed using similar methods (and similar materials) as illustrated in FIGS. 1B and 1C. The respective step is illustrated as step 306 in the process flow 300 shown in FIG. 19. In accordance with some embodiments of the present disclosure, through-vias 134 are formed directly on metal pads 132. Accordingly, seed layer may be or may not be used in the formation of through-vias 134. In accordance with alternative embodiments, RDLs (not shown) are formed close to the top surfaces of device dies M3, wherein the RDLs are used to reroute electrical connections, for example, to the left sides of the respective device dies M3. Through-vias 134 may then be formed over the rerouting RDLs. Device dies M3 are singulated from wafer 130 as discrete device dies.

Figure 15D:
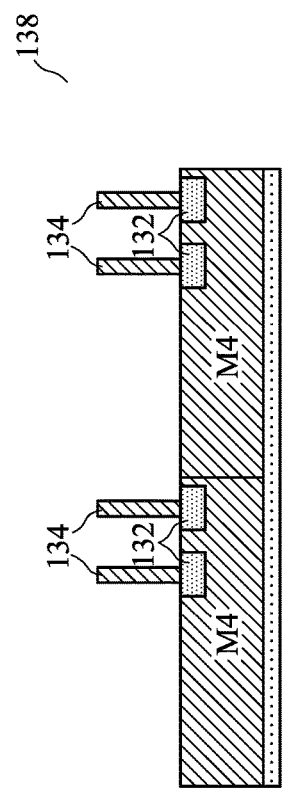

FIG. 15D illustrates the formation of wafer 138, which includes device dies M4 therein. In accordance with some embodiments, device dies M3 and M4 are the same type of device dies. Furthermore, the relationship between device dies M3 and M4 may be similar to the relationship between device dies M1 and M2. The backsides of device dies M4 may also be adhered to DAFs 22. Device dies M4 also have metal pads 132 formed therein. Through-vias 134 are formed on metal pads 132. The respective step is illustrated as step 308 in the process flow 300 shown in FIG. 19. The materials and the formation process of metal pads 132 and through-vias 134 may be found referring to the discussion of FIG. 15A, and hence are not repeated herein. Device dies M4 are then singulated from wafer 138 as discrete device dies.

Figure 15E:
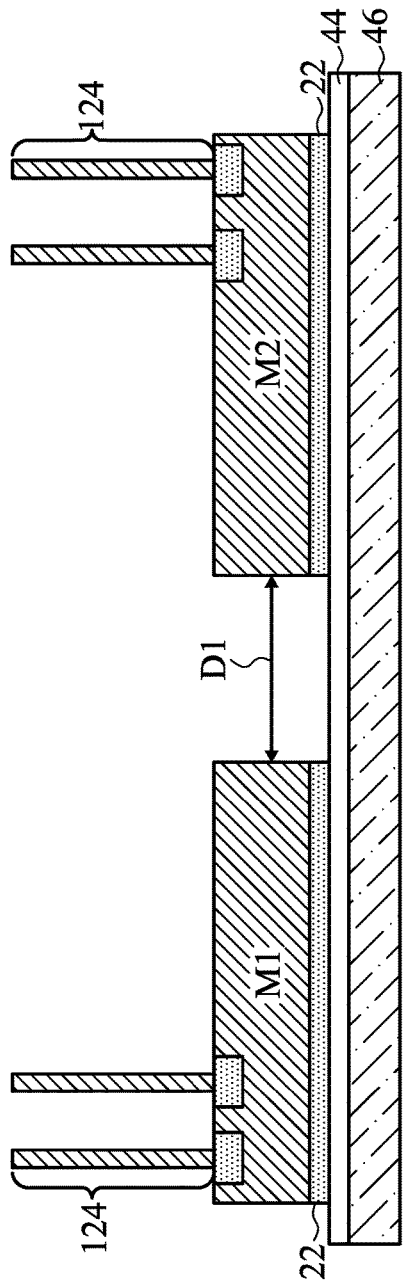

Next, referring to FIG. 15E, device dies M1 and M2 are picked and placed over adhesive film 44, which is over carrier 46 (a glass carrier, for example). The respective step is illustrated as step 310 in the process flow 300 shown in FIG. 19. Device die M1 is placed on the left side of device die M2, and the through-vias 124 in device die M1 is further on the left side of device die M1. The through-vias 124 in device die M2 is further on the right side of device die M2. Device dies M1 and M2 are spaced apart from each other by distance D1.

Figure 15F:
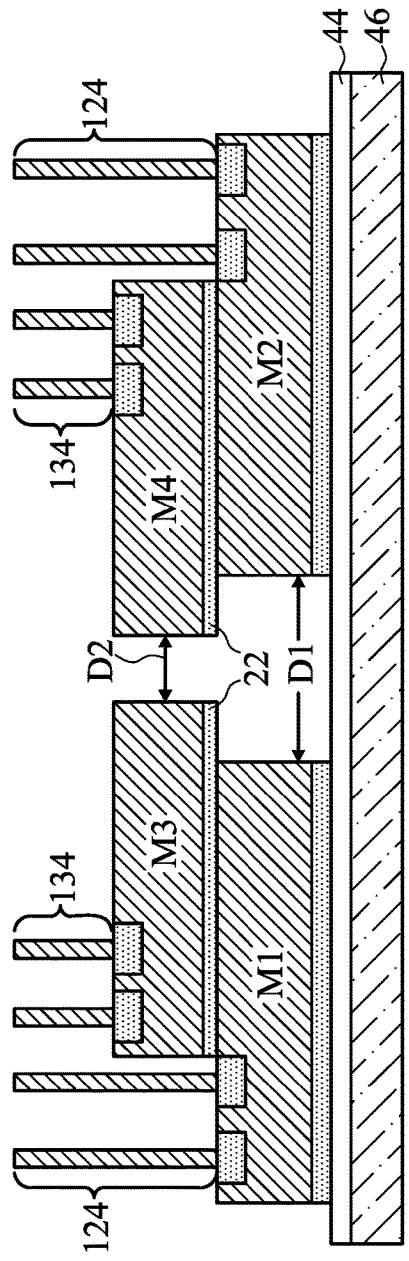

Next, as shown in FIG. 15F, device dies M3 and M4 are picked and placed, and are adhered to the front sides of device dies M1 and M2, respectively, through DAFs 22. The respective step is illustrated as step 312 in the process flow 300 shown in FIG. 19. In accordance with some embodiments of the present disclosure, device die M3 overlaps the right portion of the respective underlying device die M1, and may or may not overlap the center of device die M1. Furthermore, through-vias 134 of device die M3 are on the left side of the respective device die M3. Device die M4 overlaps the left portion of the respective underlying device die M2, and may or may not overlap the center of device die M2. Furthermore, through-vias 134 of device die M4 are on the right side of the respective device die M4.

In accordance with some embodiments of the present disclosure, device die M3 has a right portion extending beyond the right edge of device die M1. Accordingly, the right portion of device die M3 overhangs. In accordance with alternative embodiments of the present disclosure, an entirety of device die M3 overlaps device die M1 with no overhang. Device die M4 may have a left portion extending beyond the left edge of device die M2. Accordingly, the left portion of device die M4 overhangs. In accordance with alternative embodiments of the present disclosure, an entirety of device die M4 overlaps device die M2 with no overhang. Device dies M3 and M4 have distance D2, which may be smaller than, equal to, or greater than, distance D1 between device dies M1 and M2.

Figure 15G:
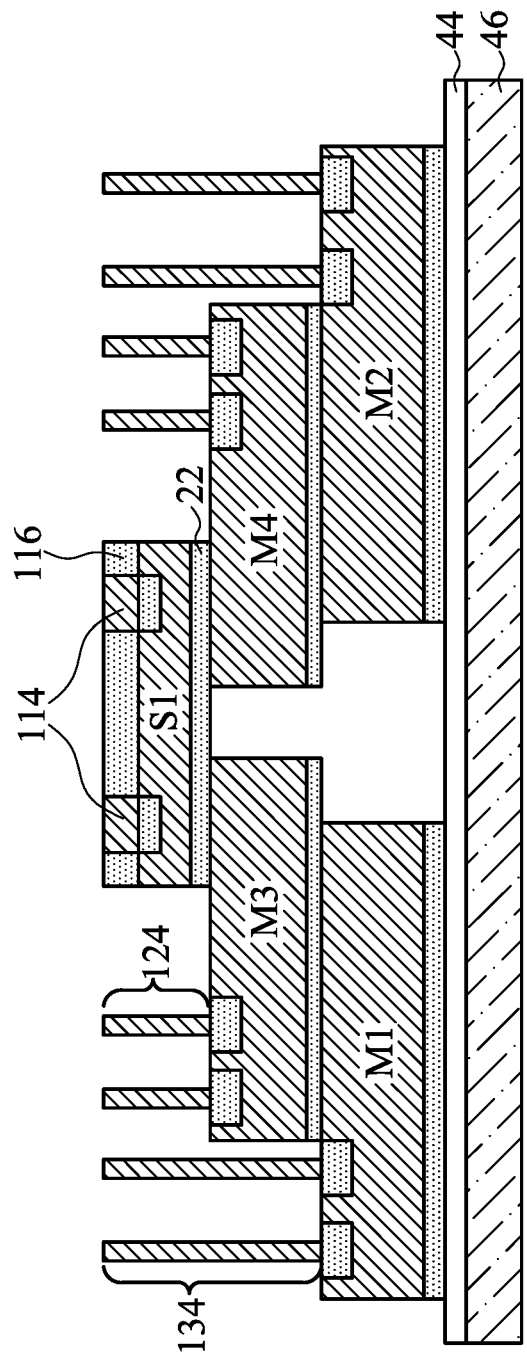

Next, referring to FIG. 15G, device die S1 is picked and placed over device dies M3 and M4, and is adhered to the front surfaces of both device dies M3 and M4 through DAF 22. The respective step is illustrated as step 314 in the process flow 300 shown in FIG. 19. A portion of device die S1 also overlaps the gap between device dies M3 and M4. In accordance with some embodiments of the present disclosure, as shown in FIG. 14, device die S1 includes conductive features 114 and surface dielectric layer 116, which represent the features shown in FIG. 13A, 13B, or 13C. In accordance with some embodiments, the top surfaces of through-vias 124 and 134 are higher than, lower than, or level with the top surfaces of device die S1.

Figure 15H:
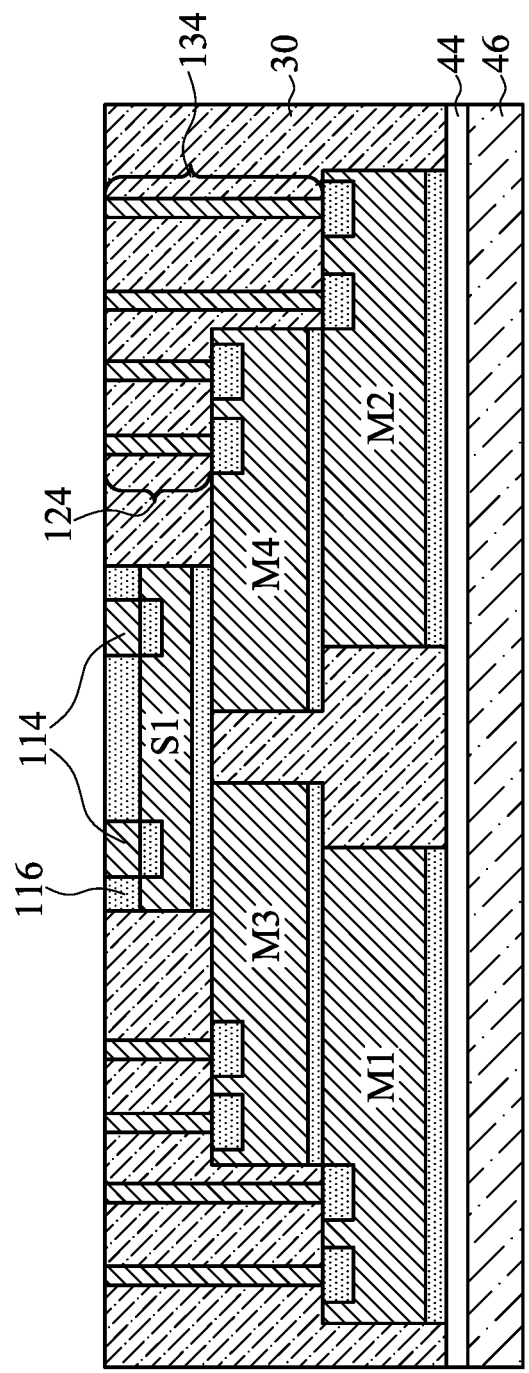

FIG. 15H illustrates the encapsulation of device dies M1, M2, M3, M4, S1 and through-vias 124 and 134 in encapsulating material 30, followed by a mechanical grinding, a CMP and/or a combination of both to expose conductive features 114 and through-vias 124 and 134. The respective step is illustrated as step 316 in the process flow 300 shown in FIG. 19. Since device dies M1, M2, M3, M4, S1 and through-vias 124 and 134 are encapsulated through a single encapsulation process, there is no distinguishable interface (such as horizontal interface) in encapsulating material 30. For example, since a single planarization process is performed on the top surface of encapsulating material 30, and no grinding is performed on the lower portions of encapsulating material 30, the fillers in encapsulating material 30, which fillers may include spherical particles (such as $Al_2O_3$ particles), will remain to be spherical. However, the spherical particles that are ground in the planarization of encapsulating material 30 will have upper portions removed during the grinding process, and bottom portions remaining to have planar top surfaces and rounded bottom surfaces.

As shown in FIG. 15H, each of device dies M3, M4, and S1 may include a first portion overlapping the respective underlying dies M1/M2, and M3/M4, respectively, and a second portion overlapping encapsulating material 30. The second portion may not have any device die directly underlying it. The height of through-vias of device dies M3 and M4 is smaller than that of device dies M1 and M2 due to stacking.

Figure 15I:
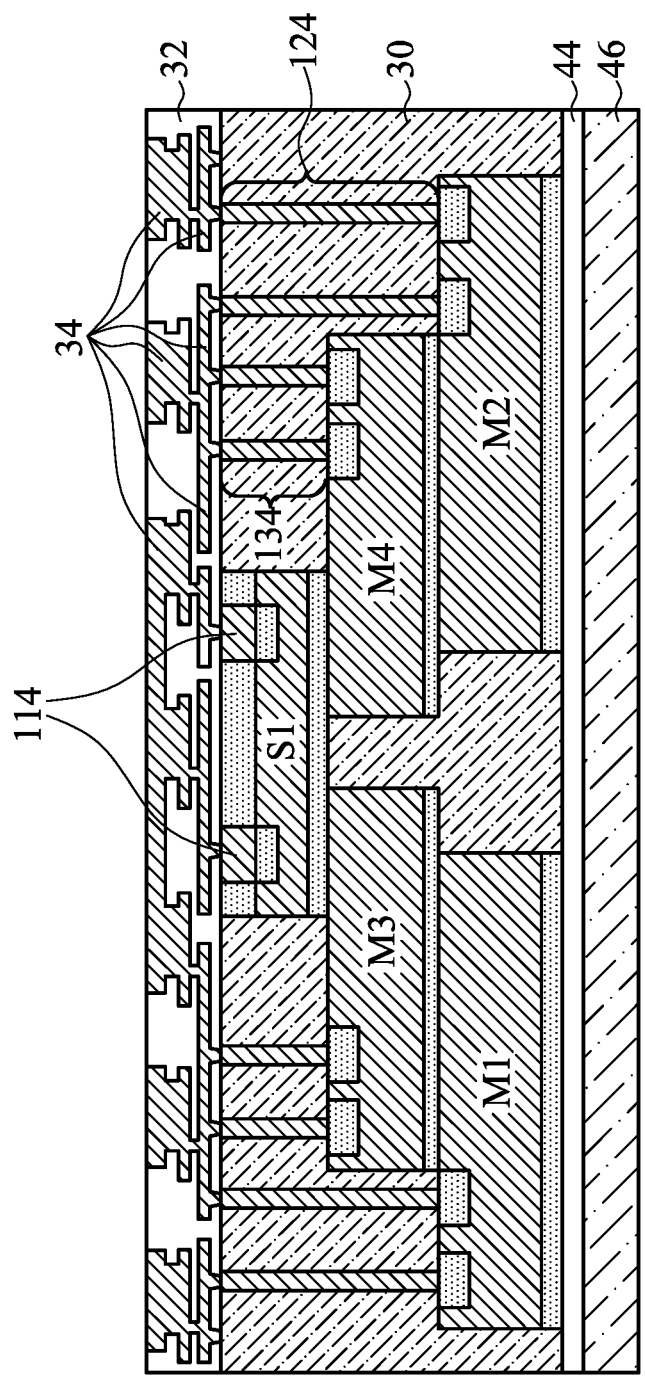
Figure 15J:
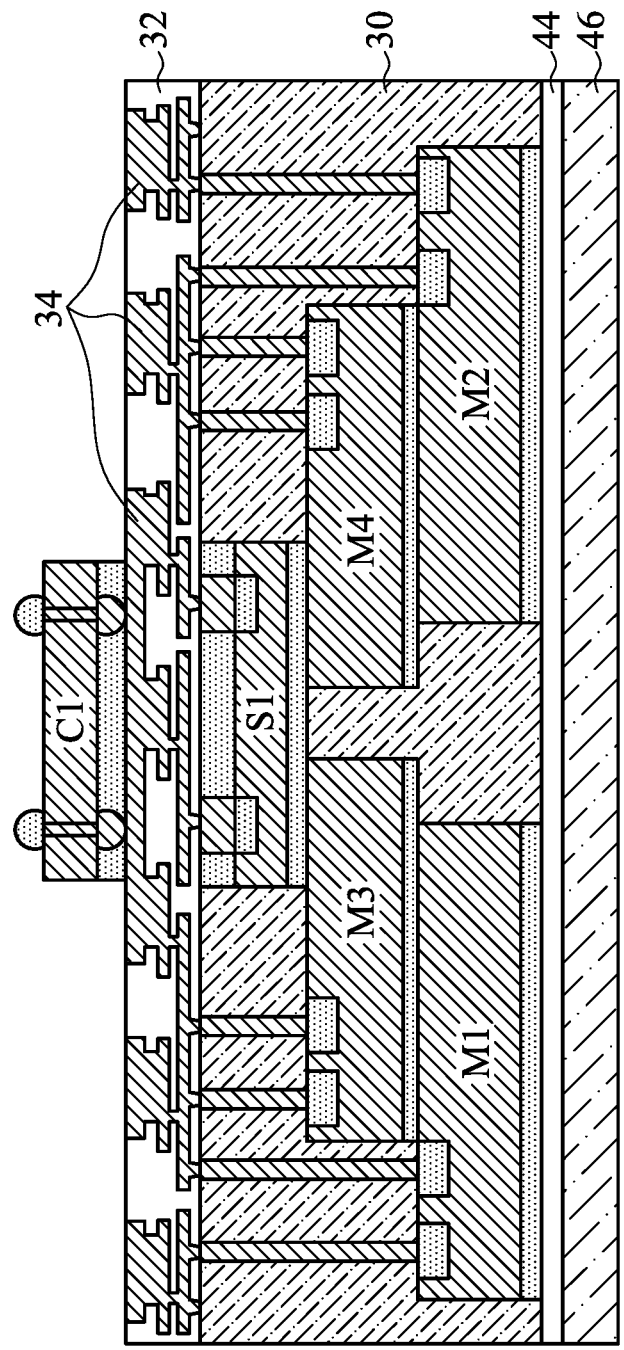

In subsequent steps, dielectric layers 32 and RDLs 34 are formed, and RDLs 34 are electrically coupled to conductive features 114 and through-vias 124 and 134, as shown in FIG. 15I. The respective step is illustrated as step 318 in the process flow 300 shown in FIG. 19. Next, device die C1 may be optionally bonded to RDLs 34 (FIG. 15J), for example, through flip-chip bonding, hybrid bonding, or surface mounting. Device die C1 may be an Integrated Passive Device (IPD), a memory die, an Application Specific Integrated Circuit (ASIC) die, or the like. Device die C1 may include through-vias (sometimes referred to as through-silicon vias or through-substrate vias) penetrating through the semiconductor substrate in device die C1. An IPD may also be bonded to RDLs 34 in accordance with some embodiments. Next, referring to FIG. 15K, electrical connectors 36 are formed to connect to RDLs 34. The respective step is illustrated as step 320 in the process flow 300 shown in FIG. 19.

Figure 15K:
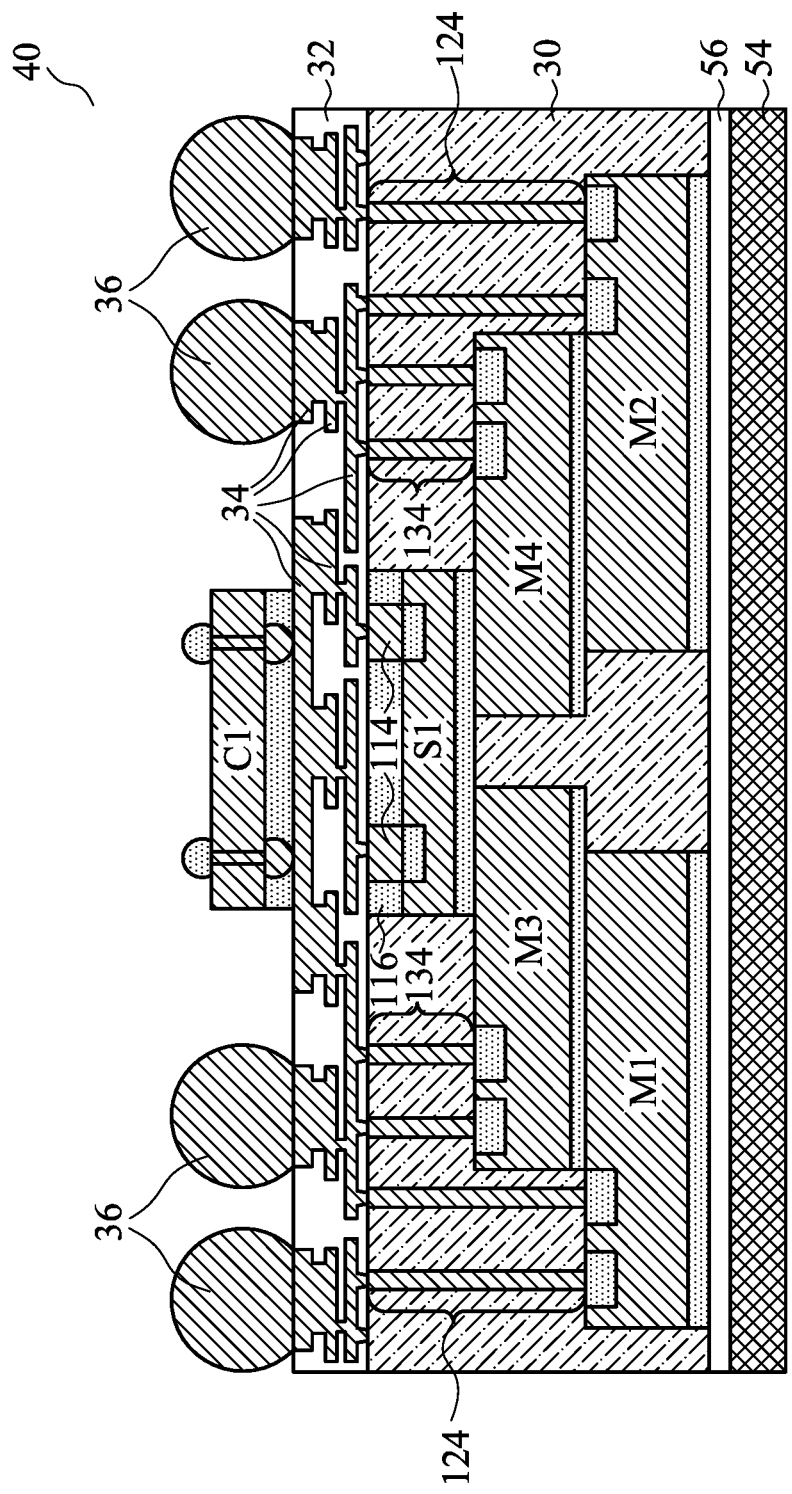

Carrier 46 is then de-bonded from the overlying structure, and the resulting structure is shown in FIG. 15K. In subsequent steps, heat dissipating lid 54 is attached to the resulting package, for example, through TIM 56. The respective step is illustrated as step 322 in the process flow 300 shown in FIG. 19. Heat dissipating lid 54 may be formed of a material having good thermal conductivity. In accordance with some exemplary embodiments, heat dissipating lid 54 includes a metal such as aluminum, copper, an aluminum/copper alloy, stainless steel, or the like. Package 40 is thus formed.

Figure 16A:
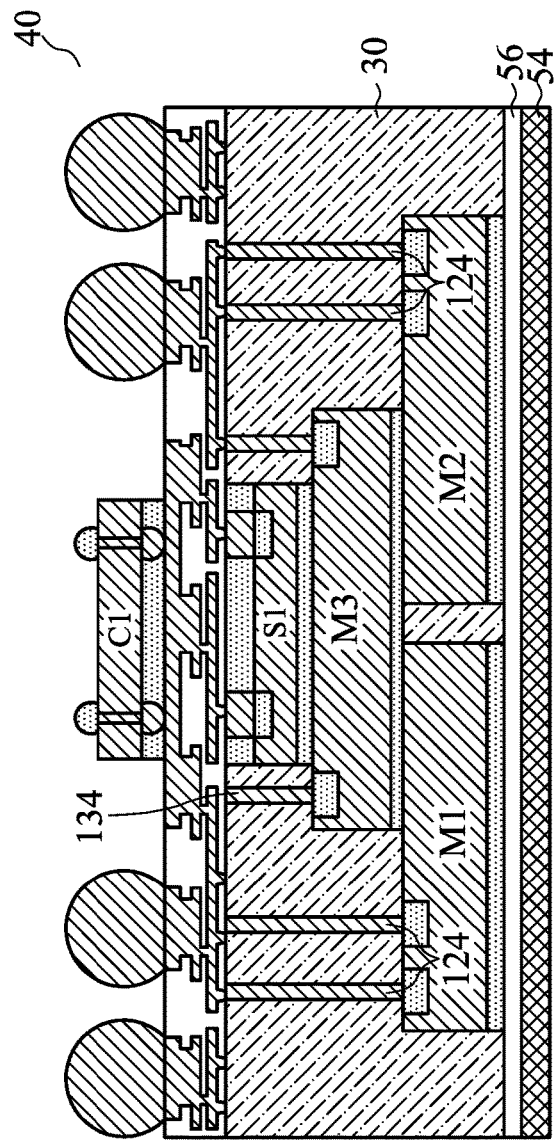
FIGS. 16A and 16B illustrate a cross-sectional view and a top view, respectively, of a fan-out package in accordance with some embodiments.
Figure 16B:
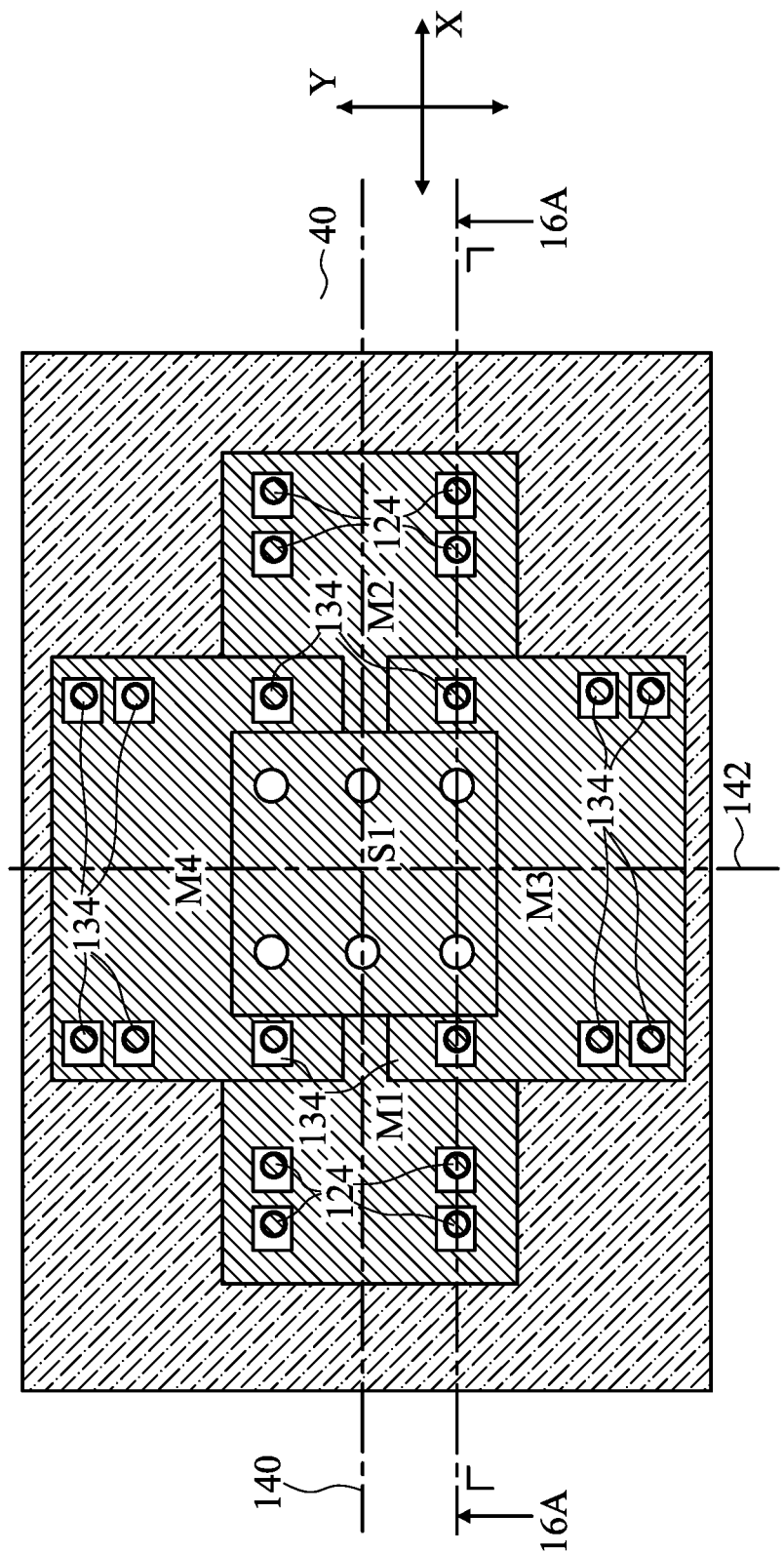

FIGS. 16A and 16B illustrate a cross-sectional view and a top view, respectively, of multi-level fan-out package 40 in accordance with some embodiments. These embodiments are similar to the embodiments in FIG. 15K, except that device dies M3 and M4 are laid out differently than in FIG. 15K. The formation process of the package 40 shown in FIGS. 16A and 16B is essentially the same as shown in FIGS. 15A through 15K, and hence is not repeated herein.

Referring to FIG. 16B, a first straight line 140 interconnecting the centers of device dies M1 and M2 is in the X-direction. A second straight line 142 interconnecting the centers of device dies M3 and M4 is in the Y-direction. Accordingly, the aligning directions of device dies M1 and M2 is perpendicular to the aligning direction of device dies M3 and M4. An advantageous feature of this layout is that there are smaller portions of devices M3 and M4 overlapping device dies M1 and M2, which yields more surfaces areas of device dies M1 and M2 for forming through-vias 124. Also such configuration may lead to symmetric package layout for better warpage control and mechanical reliability/stability. FIG. 16A illustrates a cross-sectional view of package 40, wherein the cross-sectional view is obtained from the line containing 16A-16A in FIG. 16B.

As a comparison, in the embodiments shown in FIG. 15A, in a top-view (not shown) of package 40 as shown in FIG. 15K, a first straight line (not shown) interconnecting the centers of device dies M1 and M2 may be parallel to a second straight line (not shown) interconnecting the centers of device dies M1 and M2.

Figure 17A:
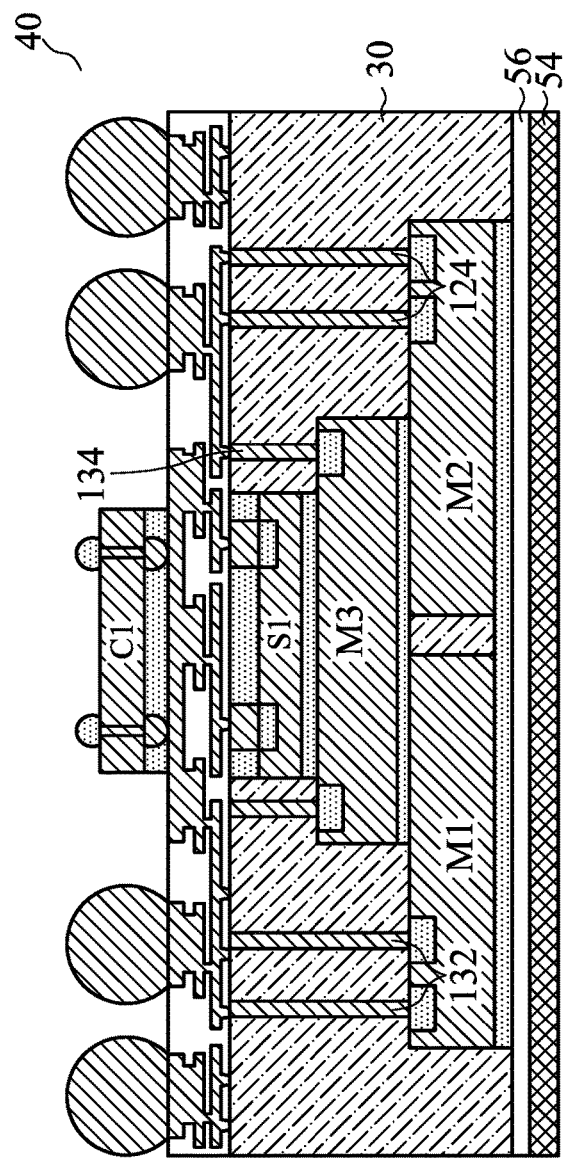
FIGS. 17A and 17B illustrate a cross-sectional view and a top view, respectively, of a fan-out package in accordance with some embodiments.
Figure 17B:
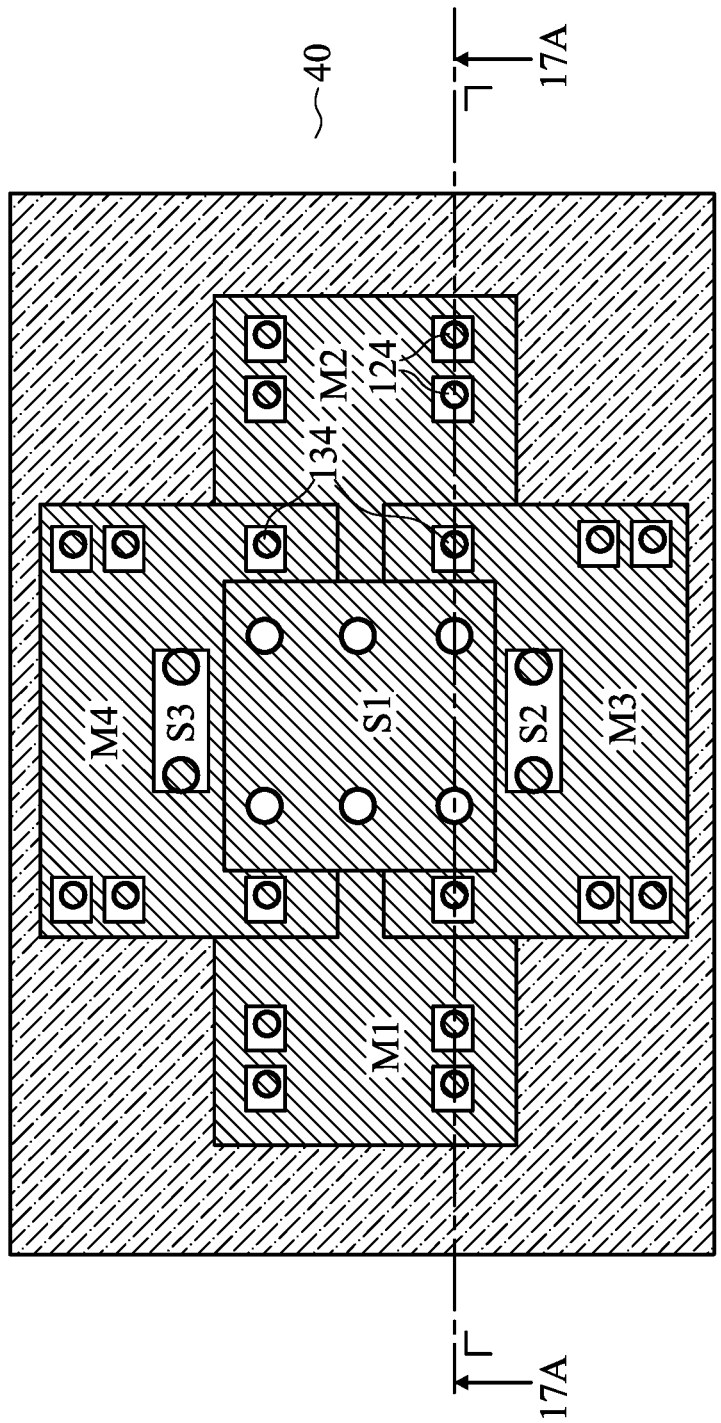

FIGS. 17A and 17B illustrate a cross-sectional view and a top view, respectively, of multi-level fan-out package 40 in accordance with some embodiments. These embodiments are similar to the embodiments in FIGS. 16A and 16B, except that additional device dies S2 and/or S3 are placed overlapping device dies M3 and M4, respectively. The formation process of the package 40 shown in FIGS. 17A and 17B is essentially the same as shown in FIGS. 15A through 15K, and hence is not repeated herein. Each of device dies S2 and S3 may be a logic die, a memory die, an IPD, or the like. Furthermore, the top conductive features of device dies S2 and S3 may be selected from any of the structures shown in FIGS. 13A, 13B, and 13C.

Figure 18A:
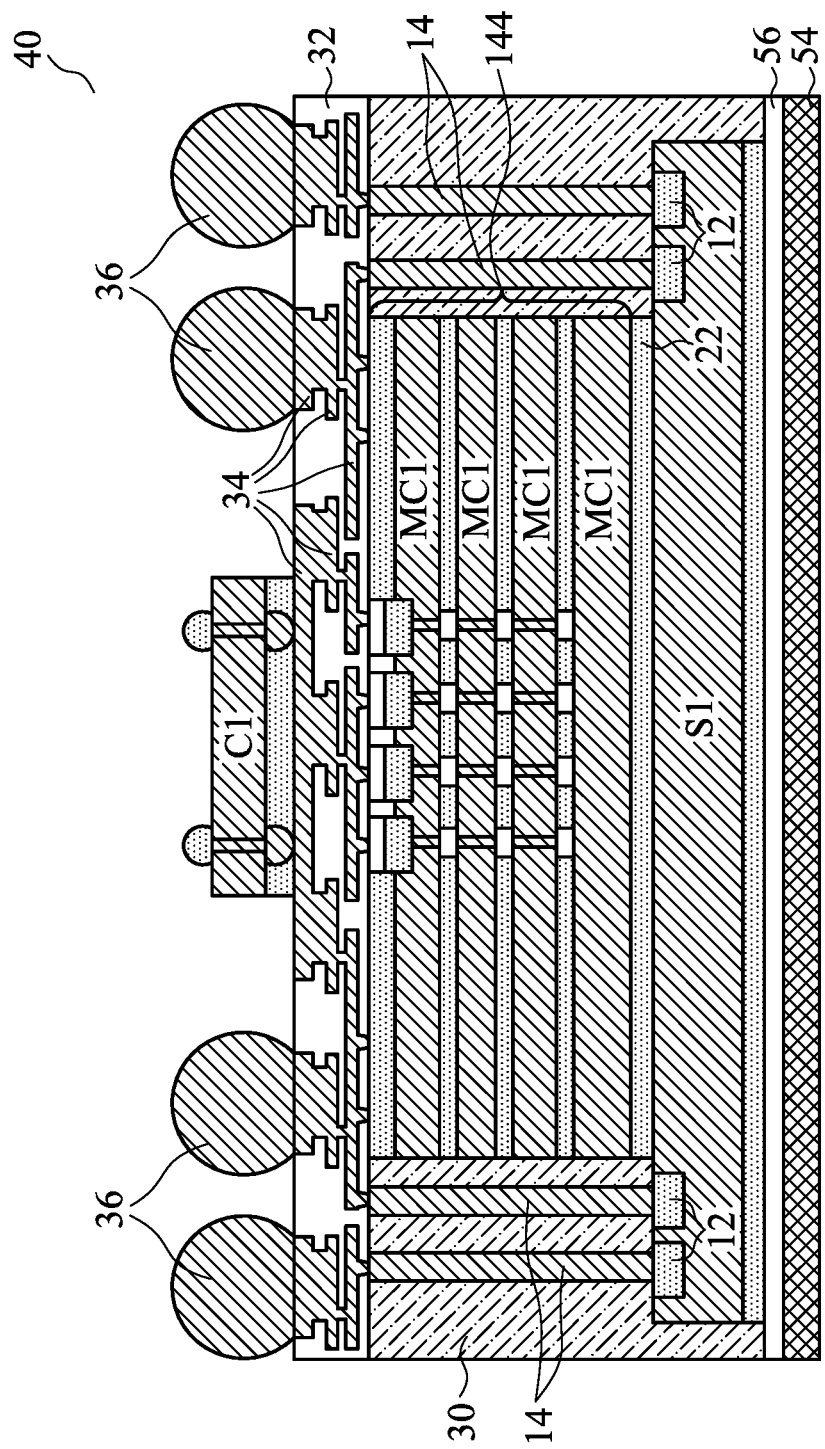
FIGS. 18A through 18C illustrate the cross-sectional views of fan-out packages including memory cubes in accordance with some embodiments.
Figure 18B:
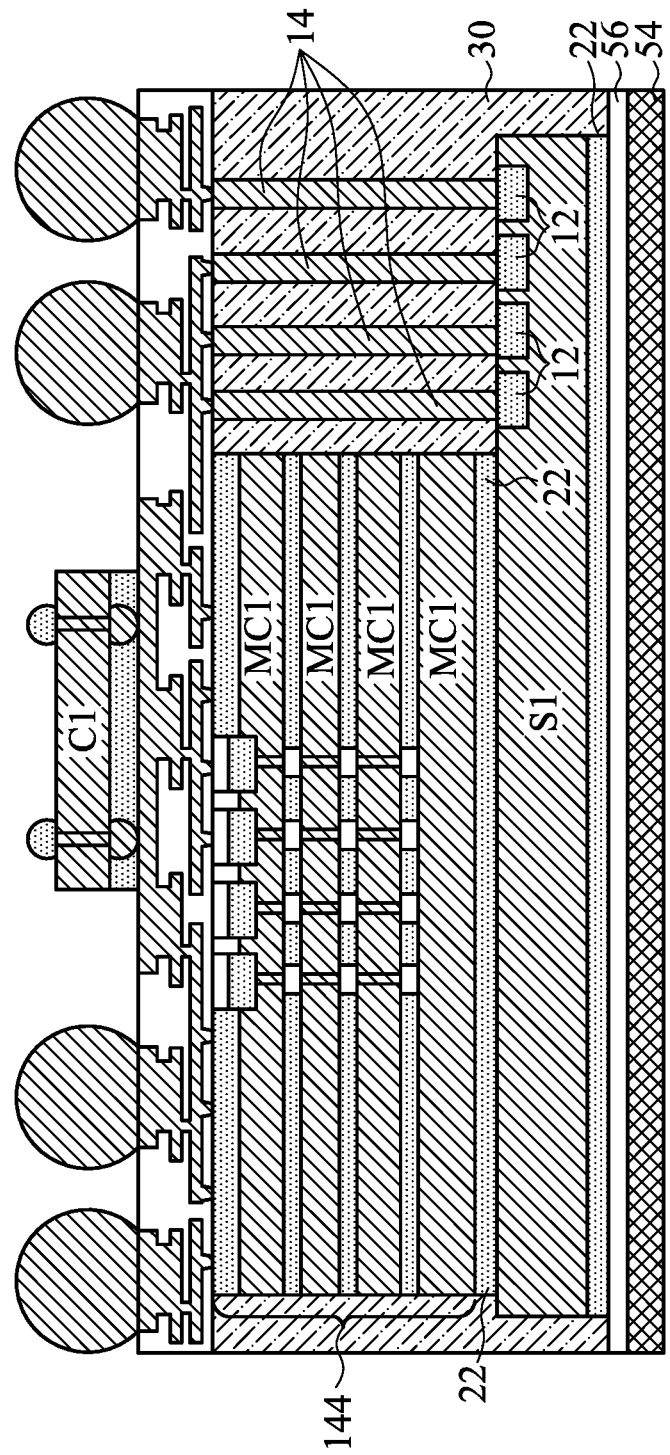
Figure 18C:
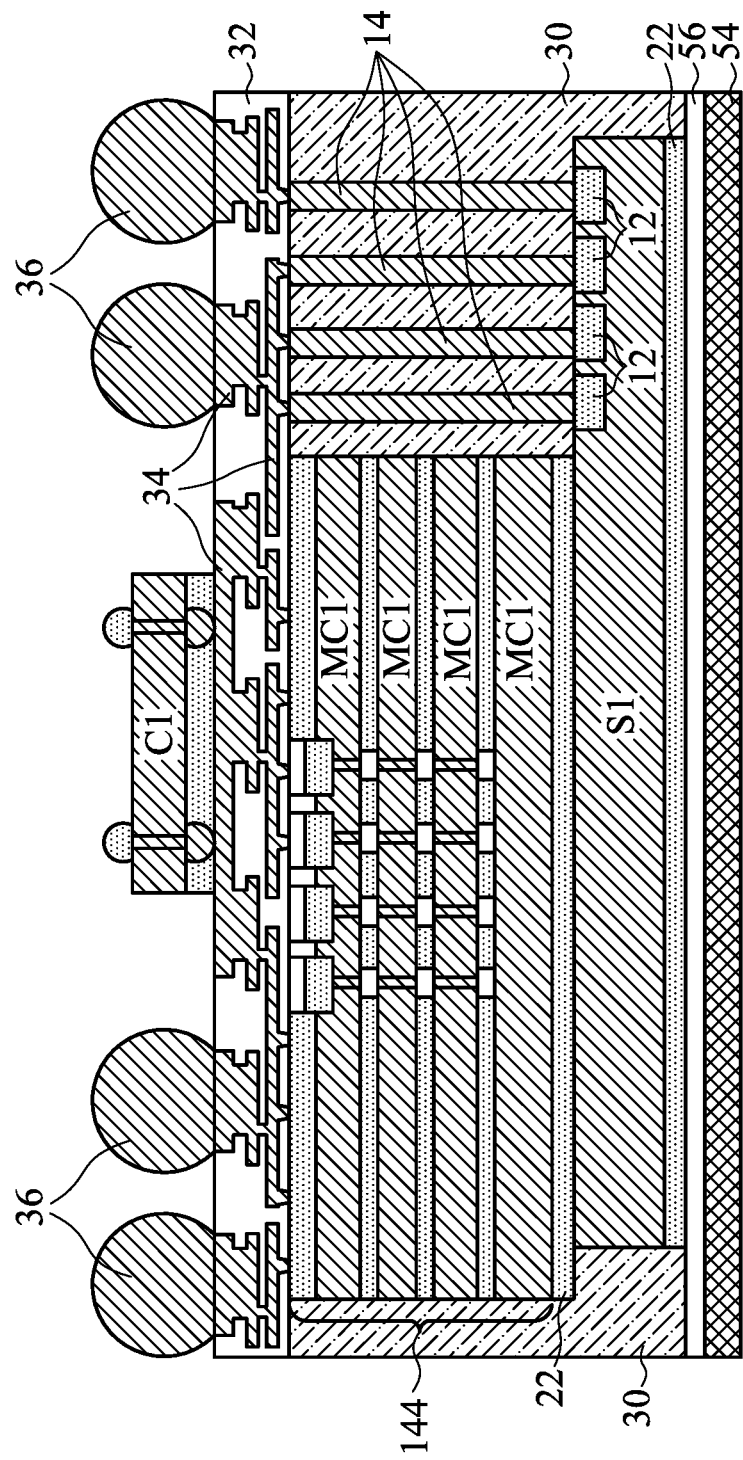

FIGS. 18A, 18B, and 18C illustrate fan-out packages 40 in accordance with some embodiments. These embodiments are similar to the embodiments shown in FIG. 1I, except device die 20 in FIG. 1I is replaced with device cubes 144 in FIGS. 18A, 18B, and 18C. In FIG. 18A, through-vias 14 are distributed on the opposite sides of device cube 144. In FIG. 18B, through-vias 14 are distributed on one side (the illustrated right side, for example), but not on the opposite side, of device cube 144. Furthermore, as shown in FIGS. 18A and 18B, and entirety of device cube 144 overlaps device die S1. In FIG. 18C, through-vias 14 are distributed on one side (the illustrated right side, for example), but not on the opposite side, of device cube 144. Furthermore, as shown in FIG. 18C, device cube 144 extends beyond the left edge of device die S1 to overlap encapsulating material 30, and hence yielding more space for forming metal pads 12 and through-vias 14.

In FIGS. 18A, 18B, and 18C, each of device cubes 144 includes a plurality of device dies MC1, which may be memory dies in accordance with some embodiments. Device dies MC1 may have identical or different structures, with through-vias (not shown) penetrating through the semiconductor substrates therein. The top conductive features of memory cubes 144 may also adopt any structure shown in FIGS. 13A, 13B, and 13C. Device cube 144 may include stacked multi-chips such as 2-chips to 9-chips. In each stacked structure, all stacked chips may be homogeneous functional chips such as a memory function chip and/or heterogeneous functional chips such as a logic functional controller chip and multiple homogeneous memory chips (not shown). The stacked chips may have through-silicon vias (TSVs) depending the design needs, and may form, for example a high bandwidth memory (HBM) cube.

The embodiments of the present disclosure have some advantageous features. By forming through-vias directly on the metal pads of the lower-level die, package substrate is not used, and the resulting package is thin. The thermal decoupling of the logic die and memory die by using DAF prevents the memory die from the performance degradation caused by the heat generated in the logic die. The top-view area of the package is minimized. A higher-level die and a lower-level die may be encapsulated by a same encapsulation process, and hence the cost and the warpage of the package are reduced.

In accordance with some embodiments of the present disclosure, a method includes forming a first through-via from a first conductive pad of a first device die, and forming a second through-via from a second conductive pad of a second device die. The first and the second conductive pads are at top surfaces of the first and the second device dies, respectively. The first and the second conductive pads are used as seed layers. The second device die is adhered to the top surface of the first device die. The method further includes encapsulating the first and the second device dies and the first and the second through-vias in an encapsulating material, with the first and the second device dies and the first and the second through-vias encapsulated in a same encapsulating process. The encapsulating material is planarized to reveal the first and the second through-vias. Redistribution lines are formed to electrically couple to the first and the second through-vias.

In accordance with some embodiments of the present disclosure, a method includes forming a first through-via on a first conductive pad of a first device die, forming a second through-via on a second conductive pad of a second device die, placing the first device die and the second device die over a carrier, forming a third through-via on a third conductive pad of a third device die, and forming a fourth through-via on a fourth conductive pad of a fourth device die. The method further includes adhering the third device die and the fourth device die to top surfaces of the first device die and second device die, respectively, and simultaneously encapsulating the first, the second, the third, and the fourth device dies and the first, the second, the third, and the fourth through-vias in an encapsulating material. The encapsulating material is planarized to reveal the first, the second, the third, and the fourth through-vias. Redistribution lines are formed over and electrically coupling to the first, the second, the third, and the fourth through-vias.

In accordance with some embodiments of the present disclosure, a method includes placing a first device die and a second device die over a carrier, wherein the first device die includes a first through-via, and the second device die includes a second through-via. A third device die is placed over the first device die. The third device die includes a first portion overlapping a gap between the first device die and the second device die, a second portion overlapping a portion of the first device die, and a third through-via higher than the first portion of the third device die. In a same encapsulating process, the first, the second, and the third device dies and the first, the second, and the third through-vias are encapsulated in an encapsulating material. The encapsulating material is planarized to reveal the first through-via, the second through-via, and the third through-via. Redistribution lines are formed over and electrically coupling to the first through-via, the second through-via, and the third through-via.

In accordance with some embodiments of the present disclosure, a package includes a first device die, a first through-via having a first bottom surface contacting a top surface of a first conductive pad of the first device die, a second device die having a portion overlapping a portion of the first device die, and a second through-via. The second through-via includes a lower portion at a same level as the first device die, and an upper portion at a same level as the second device die. The lower portion has a second bottom surface contacting a top surface of a second conductive pad of the second device die. A top surface of the upper portion is coplanar with a top surface of the first through-via, and the lower portion is continuously connected to the upper portion with no distinguishable interface therebetween. The package further includes an encapsulating material encapsulating the first device die, the second device die, the first through-via, and the second through-via therein, and redistribution lines over and electrically coupling to the first through-via and the second through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first device die comprising a first conductive pad;
   a first through-via having a bottom surface contacting a top surface of the first conductive pad;
   a second device die comprising a first portion overlapping a portion of the first device die, and a second portion comprising a second conductive pad, wherein the first through-via comprises:
      a lower portion at a same level as the second device die, wherein the lower portion has a bottom surface contacting a top surface of the second conductive pad; and
      an upper portion higher than the second device die, wherein the lower portion is continuously connected to the upper portion with no distinguishable interface therebetween;
   a second through-via having a bottom surface contacting a top surface of the second conductive pad;
   an encapsulating material encapsulating the first device die, the second device die, the first through-via, and the second through-via therein; and
   redistribution lines over and electrically coupling to the first through-via and the second through-via.

2. The package of claim 1, wherein the second device die further comprises an additional portion, with a bottom surface of the additional portion being in contact with a top surface of a portion of the encapsulating material.

3. The package of claim 1 further comprising a third device die overlapping a portion of the second device die, wherein a top surface of the third device die is coplanar with the top surface of the upper portion of the first through-via.

4. The package of claim 3, wherein a height of the first through-via is greater than a sum of a thickness of the second device die and a sum of a thickness of the third device die.

5. The package of claim 1, wherein the upper portion of the first through-via has a top surface substantially coplanar with a top surface of the second through-via, and wherein the encapsulating material continuously extends from a top level to a bottom level, with the top level being coplanar with the top surface of the first through-via, and the bottom level being coplanar with a bottom surface of the first device die.

6. The package of claim 1 further comprising an integrated passive device bonded to the redistribution lines.

7. The package of claim 1, wherein no additional conductive feature is between the first through-via and the first conductive pad.

8. The package of claim 1 further comprising a fourth device die having a portion overlapped by the second device die, and the encapsulating material extends into a space between the first device die and the fourth device die.

9. The package of claim 1, wherein the first through-via has a bottom lower than a bottom surface of the second device die, and a top higher than a top surface of the second device die.

10. A package comprising:
    a first device die comprising a first portion and a second portion, with the second portion comprising a first metal pad;
    a second device die comprising a third portion and a fourth portion, with the fourth portion comprising a second metal pad;
    a third device die overlapping the first portion of the first device die and the third portion of the second device die;
    a first through-via over and in contact with the first metal pad;
    a second through-via over and in contact with the second metal pad; and
    an encapsulating material encapsulating the first device die, the second device die, the third device die, the first through-via, and the second through-via therein.

11. The package of claim 10, wherein the encapsulating material comprises:
    a first portion at a same level as the first device die; and
    a second portion at a same level as the third device die, wherein the first portion of the encapsulating material is continuously connected to the second portion of the encapsulating material with no distinguishable interface therein.

12. The package of claim 10, wherein the encapsulating material further comprises:
a third portion higher than the third device die, wherein the second portion of the encapsulating material is further continuously connected to the third portion of the encapsulating material with no distinguishable interface therein.

13. The package of claim 10 further comprising an adhesive film, wherein the third device die is adhered to the first device die and the second device die through the adhesive film.

14. The package of claim 13, wherein the encapsulating material comprises a portion in a space between the first device die and the second device die, wherein the adhesive film further comprises a bottom surface in contact with a top surface of the portion of the encapsulating material.

15. The package of claim 10, wherein the first through-via and the second through-via are elongated and have substantially straight sidewalls.

16. The package of claim 10 further comprising:
a fourth device die over and attached to the third device die, wherein the fourth device die overlaps a fifth portion of the third device die, and the third device die further comprises a sixth portion extending laterally beyond a sidewall of the fourth device die, with the sixth portion comprising a third metal pad; and
a third through-via over and contacting the third metal pad, wherein the fourth device die and the third through-via are encapsulated in the encapsulating material.

17. The package of claim 16 further comprising a dielectric layer having a bottom surface in contact with top surfaces of the fourth device die, the first through-via, and the third through-via.

18. A package comprising:
a first device die comprising a first metal pad;
a second device die overlapping a portion of the first device die, wherein the second device die comprises a second metal pad;
an adhesive film adhering the second device die to the first device die;
a first through-via over and contacting the first metal pad, wherein the first through-via is elongated and has substantially straight sidewalls;
a second through-via over and contacting the second metal pad, wherein the second through-via is elongated and has substantially straight sidewalls;
a third device die overlapping a portion of the second device die; and
a dielectric layer over the third device die, wherein a bottom surface of the dielectric layer physically contacts a top surface of the third device die, a top surface of the first through-via, and a top surface of the second through-via.

19. The package of claim 18 further comprising an encapsulating material, with the first device die, the second device die, the third device die, the first through-via, and the second through-via being in the encapsulating material.

20. The package of claim 19, wherein the encapsulating material comprises:
a first portion encircling and contacting sidewalls of the first device die;
a second portion encircling and contacting sidewalls of the second device die; and
a third portion encircling and contacting sidewalls of the third device die, wherein the first portion, the second portion, and the third portion of the encapsulating material are continuously joined together with no distinguishable interfaces formed in between.

* * * * *